(12) United States Patent
Tomiga et al.

(10) Patent No.: US 11,009,791 B2
(45) Date of Patent: May 18, 2021

(54) ACTINIC RAY-SENSITIVE OR RADIATION-SENSITIVE RESIN COMPOSITION, ACTINIC RAY-SENSITIVE OR RADIATION-SENSITIVE FILM, PATTERN FORMING METHOD, AND METHOD FOR MANUFACTURING ELECTRONIC DEVICE

(71) Applicant: FUJIFILM Corporation, Tokyo (JP)

(72) Inventors: Takamitsu Tomiga, Shizuoka (JP);
Kenichi Harada, Shizuoka (JP);
Shinichi Sugiyama, Shizuoka (JP);
Fumihiro Yoshino, Shizuoka (JP);
Shuji Hirano, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 551 days.

(21) Appl. No.: 16/015,358

(22) Filed: Jun. 22, 2018

(65) Prior Publication Data

US 2018/0299777 A1  Oct. 18, 2018

Related U.S. Application Data

(63) Continuation-in-part of application No. PCT/JP2016/084672, filed on Nov. 22, 2016.

(30) Foreign Application Priority Data

Dec. 25, 2015 (JP) .............................. JP2015-255192
Sep. 14, 2016 (JP) .............................. JP2016-179803

(51) Int. Cl.
*G03F 7/038* (2006.01)
*G03F 7/039* (2006.01)
*G03F 7/16* (2006.01)
*G03F 7/20* (2006.01)
*G03F 7/32* (2006.01)
*G03F 7/38* (2006.01)

(52) U.S. Cl.
CPC .............. *G03F 7/038* (2013.01); *G03F 7/039* (2013.01); *G03F 7/0392* (2013.01); *G03F 7/162* (2013.01); *G03F 7/168* (2013.01); *G03F 7/2006* (2013.01); *G03F 7/322* (2013.01); *G03F 7/38* (2013.01)

(58) Field of Classification Search
None
See application file for complete search history.

(56) References Cited

U.S. PATENT DOCUMENTS

| | | |
|---|---|---|
| 2004/0104196 A1 | 6/2004 | Nakamura et al. |
| 2005/0042541 A1 | 2/2005 | Hagihara et al. |
| 2006/0204730 A1 | 9/2006 | Nakamura et al. |
| 2009/0239080 A1 | 9/2009 | Ito et al. |
| 2010/0142069 A1 | 6/2010 | Nakamura et al. |
| 2011/0081612 A1 | 4/2011 | Fujii et al. |
| 2013/0330669 A1 | 12/2013 | Kawamura et al. |
| 2014/0272692 A1 | 9/2014 | Yokokawa et al. |
| 2015/0048051 A1 | 2/2015 | Katsura et al. |
| 2015/0355543 A1 | 12/2015 | Takemura et al. |
| 2016/0223905 A1 | 8/2016 | Ou et al. |
| 2016/0266489 A1 | 9/2016 | Katsura et al. |

FOREIGN PATENT DOCUMENTS

| | | |
|---|---|---|
| CN | 1831646 A | 9/2006 |
| CN | 101124516 A | 2/2008 |
| CN | 103488048 A | 1/2014 |
| EP | 1 806 618 A1 | 7/2007 |
| EP | 1 806 618 B1 | 6/2010 |
| JP | 9-222724 A | 8/1997 |
| JP | 2001-281863 A | 10/2001 |
| JP | 2002-196496 A | 7/2002 |
| JP | 2004078034 A | 3/2004 |
| JP | 2004-309777 A | 11/2004 |
| JP | 2005-4092 A | 1/2005 |
| JP | 2006-330367 A | 12/2006 |
| JP | 2009-63824 A | 3/2009 |
| JP | 2009265609 A | 11/2009 |
| JP | 2014-13381 A | 1/2014 |
| JP | 2015-57638 A | 3/2015 |
| JP | 2015-127797 A | 7/2015 |
| JP | 2015-232607 A | 12/2015 |
| TW | 200612200 A | 4/2006 |
| TW | 201329621 A | 7/2013 |
| TW | 201443558 A | 11/2014 |
| WO | 2006004171 A1 | 1/2006 |
| WO | 2008/026401 A1 | 3/2008 |
| WO | 2014/003111 A1 | 1/2014 |

OTHER PUBLICATIONS

English translation of JP 2009-63824 A obtained from Global Dossier on Feb. 13, 2021, 37 pages (Year: 2021).*
Written Opposition dated Nov. 24, 2020 filed in the Japanese Patent Office in corresponding JP Application No. 2017-557806
Communication dated Mar. 16, 2020 issued by the Taiwan Intellectual Property Office in counterpart Taiwan Application No. 105141014 English Translation.
Communication dated Oct. 8, 2019, issued by the Japanese Patent Office in counterpart Japanese Application No. 2017-557806.
Communication dated Oct. 22, 2019, issued by the Korean Patent Office in counterpart Korean Application No. 10-2018-7017479.
Communication dated May 14, 2019 issued by the Japanese Intellectual Property Office in counterpart JP Application No. 2017-557806.
Communication dated Oct. 12, 2020 from the State Intellectual Property Office of the P.R.China in application No. 201680076122.6.
Search Report dated Feb. 14, 2017, issued by the International Searching Authority in counterpart International Patent Application No. PCT/JP2016/084672 (PCT/ISA/210).

(Continued)

*Primary Examiner* — Cynthia Hamilton
(74) *Attorney, Agent, or Firm* — Sughrue Mion, PLLC

(57) ABSTRACT

An actinic ray-sensitive or radiation-sensitive resin composition contains a resin (A) having a glass transition temperature of 155° C. or higher, a compound (B) having a glass transition temperature of 150° C. or lower, and a solvent (C). A solid content in the actinic ray-sensitive or radiation-sensitive resin composition is 20% by mass or more. A softening point of the resist pattern formed using the actinic ray-sensitive or radiation-sensitive resin composition is from 130° C. to 170° C.

13 Claims, No Drawings

(56) References Cited

OTHER PUBLICATIONS

Written Opinion dated Feb. 14, 2017, issued by the International Searching Authority in counterpart International Patent Application No. PCT/JP2016/084672 (PCT/ISA/237).
Preliminary Report on Patentability dated Jun. 26, 2018, issued by the International Searching Authority in counterpart International Patent Application No. PCT/JP2016/084672 (PCT/IB/373).

* cited by examiner

ACTINIC RAY-SENSITIVE OR RADIATION-SENSITIVE RESIN COMPOSITION, ACTINIC RAY-SENSITIVE OR RADIATION-SENSITIVE FILM, PATTERN FORMING METHOD, AND METHOD FOR MANUFACTURING ELECTRONIC DEVICE

CROSS REFERENCE TO RELATED APPLICATION

This is a continuation of International Application No. PCT/JP2016/084672 filed on Nov. 22, 2016, and claims priorities from Japanese Patent Application No. 2015-255192 filed on Dec. 25, 2015, and from Japanese Patent Application No. 2016-179803 filed on Sep. 14, 2016, the entire disclosures of which are incorporated therein by reference.

BACKGROUND OF THE INVENTION

1. Field of the Invention

The present invention relates to an actinic ray-sensitive or radiation-sensitive resin composition, and an actinic ray-sensitive or radiation-sensitive film, a pattern forming method and a method for manufacturing an electronic device, using the same. More specifically, the present invention relates to an actinic ray-sensitive or radiation-sensitive resin composition and an actinic ray-sensitive or radiation-sensitive film, which are used in a process for manufacturing a semiconductor such as an IC, in a process for manufacturing a circuit board for a liquid crystal, a thermal head, or the like, and in other lithographic processes for photofabrication, or in a planographic printing plate or an acid-curable composition, a pattern forming method and a method for manufacturing an electronic device, using the same.

2. Description of the Related Art

A chemically amplified resist composition is a pattern forming material that generates an acid in an exposed area upon irradiation with radiation such as far ultraviolet rays, and changes the solubility with respect to a developer in an area irradiated with actinic radiation and an area not irradiated with actinic radiation by a reaction catalyzed by the acid, thereby forming a pattern on a substrate.

For example, a pattern forming method in which a thick resist film having a film thickness of 2 to 20 μm is formed using a specific resist composition, and the thick resist film is selectively exposed and then developed to form a resist pattern for creating a memory in a 3-dimensional structure is known in the related art (see, for example, JP2015-57638A).

SUMMARY OF THE INVENTION

On the other hand, various electronic devices have recently been required to have higher functions, and there has correspondingly been a demand for a further improvement in the characteristics of a resist pattern for use in fine processing.

Under these circumstances, the present inventors have conducted studies on a resist composition for forming a thick resist film, and have thus found that it is extremely difficult to suppress the roughness on the sidewall of a resist pattern, which can be generated during etching while not damaging lithography performance such as resolution and exposure latitude.

The present invention has solved the problem, and has an object to provide an actinic ray-sensitive or radiation-sensitive resin composition which is capable of suppressing the roughness on the sidewall of a resist pattern, which can be generated during etching, while satisfying both of excellent resolution and excellent exposure latitude to high extents in a case of forming a pattern from a thick resist film (for example, a resist film having a thickness of 1 μm or more), an actinic ray-sensitive or radiation-sensitive film, a pattern forming method, and a method for manufacturing an electronic device, using the same.

That is, the present inventors have discovered that the problems can be solved by the following configurations.

[1] An actinic ray-sensitive or radiation-sensitive resin composition comprising:
a resin (A) having a glass transition temperature of 155° C. or higher;
a compound (B) having a glass transition temperature of 150° C. or lower; and a solvent (C),
in which a solid content in the actinic ray-sensitive or radiation-sensitive resin composition is 20% by mass or more, and
a softening point of a resist pattern formed using the actinic ray-sensitive or radiation-sensitive resin composition is from 130° C. to 170° C.

[2] The actinic ray-sensitive or radiation-sensitive resin composition as described in [1],
in which the compound (B) is a resin.

[3] The actinic ray-sensitive or radiation-sensitive resin composition as described in [2],
in which a weight-average molecular weight of the resin as the compound (B) is 1,000 to 18,000.

[4] The actinic ray-sensitive or radiation-sensitive resin composition as described in [2] or [3],
in which the resin (B) has a repeating unit derived from hydroxystyrene.

[5] The actinic ray-sensitive or radiation-sensitive resin composition as described in [1],
in which the compound (B) is a polyether-based compound.

[6] The actinic ray-sensitive or radiation-sensitive resin composition as described in [5],
in which a molecular weight of the polyether-based compound is 100 to 5,000.

[7] The actinic ray-sensitive or radiation-sensitive resin composition as described in any one of [1] to [6],
in which a viscosity of the actinic ray-sensitive or radiation-sensitive resin composition is 100 to 500 mPa·s.

[8] The actinic ray-sensitive or radiation-sensitive resin composition as described in any one of [1] to [7],
in which a glass transition temperature of the resin (A) is 170° C. or higher.

[9] The actinic ray-sensitive or radiation-sensitive resin composition as described in any one of [1] to [8],
in which a weight-average molecular weight of the resin (A) is 18,000 or more.

[10] The actinic ray-sensitive or radiation-sensitive resin composition as described in any one of [1] to [9],
in which the resin (A) has a repeating unit derived from hydroxystyrene.

[11] An actinic ray-sensitive or radiation-sensitive film formed using the actinic ray-sensitive or radiation-sensitive resin composition as described in any one of [1] to [10].

[12] A pattern forming method comprising:

(i) a step of forming an actinic ray-sensitive or radiation-sensitive film having a film thickness of 11 μm or more on a substrate, using the actinic ray-sensitive or radiation-sensitive resin composition as described in any one of [1] to [10];

(ii) a step of irradiating the actinic ray-sensitive or radiation-sensitive film with actinic rays or radiation; and (iii) a step of developing the actinic ray-sensitive or radiation-sensitive film irradiated with the actinic rays or radiation, using a developer.

[13] A method for manufacturing an electronic device, comprising the pattern forming method as described in [12].

As shown below, according to the present invention, it is possible to provide an actinic ray-sensitive or radiation-sensitive resin composition which is capable of suppressing the roughness on the sidewall of a resist pattern, which can be generated during etching, while satisfying both of excellent resolution and excellent exposure latitude to high extents in a case of forming a pattern from a thick resist film (for example, a resist film having a thickness of 1 μm or more), an actinic ray-sensitive or radiation-sensitive film, a pattern forming method, and a method for manufacturing an electronic device, using the same.

DESCRIPTION OF THE PREFERRED EMBODIMENTS

Hereinafter, embodiments of the present invention will be described in detail.

In citations for a group (atomic group) in the present specification, in a case where the group is denoted without specifying whether it is substituted or unsubstituted, the group includes both a group not having a substituent and a group having a substituent. For example, an "alkyl group" which is not denoted about whether it is substituted or unsubstituted includes not only an alkyl group not having a substituent (unsubstituted alkyl group), but also an alkyl group having a substituent (substituted alkyl group).

"Actinic rays" or "radiation" in the present specification means, for example, a bright line spectrum of a mercury lamp, far ultraviolet rays typified by an excimer laser, extreme ultraviolet rays (EUV light), X-rays, electron beams (EB), or the like. In addition, in the present invention, light means actinic rays or radiation.

Furthermore, "exposure" in the present specification includes, unless otherwise specified, not only exposure by a mercury lamp, far ultraviolet rays typified by excimer laser, extreme ultraviolet rays (EUV light), X-rays, or the like, but also writing by particle rays such as electron beams and ion beams.

Furthermore, in the present specification, "(a value) to (a value)" means a range including the numerical values described before and after "to" as a lower limit value and an upper limit value, respectively.

In addition, in the present specification, (meth)acrylate represents acrylate and methacrylate, and (meth)acryl represents acryl and methacryl.

In the present specification, the weight-average molecular weight (Mw), the number-average molecular weight (Mn), and the dispersity (Mw/Mn) of a resin are defined as values in terms of polystyrene by means of gel permeation chromatography (GPC) measurement (solvent: tetrahydrofuran, flow amount (amount of a sample injected): 10 μl, columns: TSK gel Multipore HXL-M (×4) manufactured by Tosoh Corporation, column temperature: 40° C., flow rate: 1.0 mL/min, detector: differential refractive index (RI) detector) using a GPC apparatus (HLC-8120GPC manufactured by Tosoh Corporation).

Furthermore, in the present specification, the glass transition temperature is measured by a differential scanning calorimeter DSC Q1000 (manufactured by TA Instruments).

In addition, in the present specification, the viscosity is a viscosity at 25.0° C., which is measured by RE-85L manufactured by TOKI SANGYO.

[Actinic Ray-Sensitive or Radiation-Sensitive Resin Composition]

The actinic ray-sensitive or radiation-sensitive resin composition of the present invention (hereinafter also simply referred to as the composition of the present invention) is an actinic ray-sensitive or radiation-sensitive resin composition, containing a resin (A) having a glass transition temperature of 155° C. or higher, a compound (B) having a glass transition temperature of 150° C. or lower, and a solvent (C), in which a solid content in the actinic ray-sensitive or radiation-sensitive resin composition is 20% by mass or more, and a softening point of a resist pattern formed using the actinic ray-sensitive or radiation-sensitive resin composition is from 130° C. to 170° C.

In the present invention, the softening point of the resist pattern specifically refers to the softening point of an unshared space pattern having a space width of 10 μm, a pitch width of 100 μm, and a thickness of a resist film portion of 7.5 μm.

Since the present invention is configured as above, it is possible of suppressing the roughness on the sidewall of a resist pattern, which can be generated during etching, while satisfying both of excellent resolution and excellent exposure latitude to high extents in a case of forming a pattern from a thick resist film (for example, a resist film having a thickness of 1 μm or more).

The reasons thereof are not clear, but are presumed as follows.

First, by setting the solid content in the actinic ray-sensitive or radiation-sensitive resin composition to 20% by mass or more, the viscosity of the actinic ray-sensitive or radiation-sensitive resin composition increases, and therefore, a thick resist film (for example, a resist film having a thickness of 1 μm or more) is easily coated.

Moreover, the actinic ray-sensitive or radiation-sensitive resin composition contains the resin (A) having a glass transition temperature of 155° C. or higher. Thus, it is presumed that since the film quality of the resist film is not extremely flexible, an acid generated with an acid generator in an exposed area hardly diffuses into an unexposed area, and as a result, an excellent resolution is obtained.

Furthermore, for a reason of, for example, incorporation of the resin (A) having a glass transition temperature of 155° C. or higher into the actinic ray-sensitive or radiation-sensitive resin composition, a softening point of the resist pattern (an unshared space pattern with a space width of 10 μm, a pitch width of 100 μm, and a thickness of a resist film portion of 7.5 μm) of the resist film is set to 130° C. or higher. Thus, it is presumed that since the film quality of the obtained unshared space pattern has rigidity to at least a certain extent or more, for example, even in a case of forming an unshared space pattern having a higher fineness (a shorter space width) than that of the unshared space pattern, or the like, and as a result, excellent exposure latitude is obtained.

In addition, the actinic ray-sensitive or radiation-sensitive resin composition contains the compound (B) having a glass transition temperature of 150° C. or lower, and mainly for this reason, the softening point of the resist pattern (an unshared space pattern with a space width of 10 µm, a pitch width of 100 µm, and a thickness of a resist film portion of 7.5 µm) is set to 170° C. or lower. Thus, the film quality of the obtained pattern is not extremely rigid (has flexibility to at least a certain extent or more). As a result, it is presumed that, for example, even in a case of forming an unshared space pattern having a higher fineness (a shorter space width) than that of the pattern, or the like on a substrate, and etching the substrate, generation of the roughness on the sidewall of a resist pattern can be suppressed. Here, in order to set the softening point to 170° C. or lower, an approach for lowering the glass transition temperature of the resin (A) could be simply conceived, but in this case, there is tendency that excellent resolution or exposure latitude caused by the resin (A) is lost.

However, it is thought that for example, by incorporation of the resin (A) having a glass transition temperature of 155° C. or higher and then the compound (B) having a glass transition temperature of 150° C. or lower into the actinic ray-sensitive or radiation-sensitive resin composition in the present invention, the softening point is set to 170° C. or lower, and as a result, the roughness on the sidewall of a resist pattern, which can be generated during etching can be suppressed while both of excellent resolution and excellent exposure latitude are satisfied.

More specifically, the softening point of the resist pattern (an unshared space pattern with a space width of 10 µm, a pitch width of 100 µm, and a thickness of a resist film portion of 7.5 µm) can be measured by the following procedure.

(1) The resist film having a thickness of 7.5 µm formed from the actinic ray-sensitive or radiation-sensitive resin composition is subjected to pattern exposure and development to form an unshared space pattern with a space width of 10 µm, a pitch width of 100 µm, and a thickness of a resist film portion of 7.5 µm.

(2) A plurality of chips having the unshared space pattern formed above are prepared and subjected to a heating treatment on a hot plate at an interval of 5° C. in a range of 100° C. to 200° C., each for 60 seconds (that is, for example, after the chip as the sample A is subjected to a treatment at 150° C. for 60 seconds, the chip as the sample B is subjected to a treatment at 155° C. for 60 seconds, and the chip as the sample C is subjected to a treatment at 150° C. for 60 seconds), and the respective chips are cleaved.

(3) The interfaces between the resist film portion and the space portion in the cleaved surfaces of the chips are observed by a scanning electron microscope (SEM) (9380II manufactured by Hitachi, Ltd.), and in a case where the thickness of a resist film portion (corresponding to the depth of the space portion) is taken as 100%, a minimum value of the temperatures at which the shape of the resist film portion changes such that the space width of the space portion at a height corresponding to 20% of the depth from the surface (that is, the upper surface) of the resist film portion reaches 1.2 times or more the space width of the space portion at the height corresponding to 50% of the depth from the surface of the resist film portion is taken as a softening point (° C.).

The actinic ray-sensitive or radiation-sensitive resin composition of the present invention is preferably used for KrF exposure.

The actinic ray-sensitive or radiation-sensitive resin composition of the present invention may be either a positive tone resist composition for alkali development or a negative tone resist composition for organic solvent development, with the positive tone resist composition for alkali development being preferable. Incidentally, the composition according to the present invention is typically a chemically amplified resist composition.

<Resin (A)>

The composition of the present invention contains the resin (A) having a glass transition temperature of 155° C. or higher.

The resin (A) is typically a resin whose solubility in a developer changes through decomposition by the action of an acid, and preferably a resin whose solubility in an alkali developer increases by the action of an acid or whose solubility in a developer having an organic solvent as a main component decreases by the action of an acid. The resin (A) also preferably has a group (hereinafter also referred to as an "acid-decomposable group") that decomposes by the action of an acid in the main chain or a side chain, or both the main chain and the side chain of the resin to generate a polar group.

The acid-decomposable group preferably has a structure in which a polar group is protected with a group that decomposes by the action of an acid to leave.

Examples of the polar group include an acidic group (a group that dissociates in a 2.38%-by-mass aqueous tetramethylammonium hydroxide solution which has been used as a developer in a resist in the related art) such as a phenolic hydroxyl group, a carboxyl group, a fluorinated alcohol group, a sulfonic acid group, a sulfonamido group, a sulfonylimido group, an (alkylsulfonyl)(alkylcarbonyl)methylene group, an (alkylsulfonyl)(alkylcarbonyl)imido group, a bis(alkylcarbonyl)methylene group, a bis(alkylcarbonyl)imido group, a bis(alkylsulfonyl)methylene group, a bis(alkylsulfonyl)imido group, a tris(alkylcarbonyl)methylene group, and a tris(alkylsulfonyl)methylene group, and an alcoholic hydroxyl group.

Preferred examples of the polar group include a carboxyl group, a fluorinated alcohol group (preferably a hexafluoroisopropanol group), and a sulfonic acid group.

A group which is preferable as the acid-decomposable group is a group in which a hydrogen atom of the polar group is substituted with a group that leaves by the action of an acid. Examples of the group that leaves by the action of an acid include —C($R_{36}$)($R_{37}$)($R_{38}$), —C($R_{36}$)($R_{37}$)(O$R_{39}$), —C($R_{01}$)($R_{02}$)(O$R_{39}$), —C($R_{01}$)($R_{02}$)—C(=O)—O—C($R_{36}$)($R_{37}$)($R_{38}$), and —CH($R_{36}$)(Ar).

In the formulae. $R_{36}$ to $R_{39}$ each independently represent an alkyl group, a cycloalkyl group, an aryl group, an aralkyl group, or an alkenyl group. $R_{36}$ and $R_{37}$ may be bonded to each other to form a ring.

$R_{01}$ and $R_{02}$ each independently represent a hydrogen atom, an alkyl group, a cycloalkyl group, an aryl group, an aralkyl group, or an alkenyl group.

Ar represents an aryl group.

As the alkyl group as $R_{36}$ to $R_{39}$, $R_{01}$, or $R_{02}$, an alkyl group having 1 to 8 carbon atoms is preferable, and examples thereof include a methyl group, an ethyl group, a propyl group, an n-butyl group, a sec-butyl group, a hexyl group, and an octyl group.

A cycloalkyl group as $R_{36}$ to $R_{39}$, $R_{01}$, or $R_{02}$ may be a monocyclic cycloalkyl group or a polycyclic cycloalkyl group. As the monocyclic cycloalkyl group, a cycloalkyl group having 3 to 8 carbon atoms is preferable, and examples thereof include a cyclopropyl group, a cyclobutyl group, a cyclopentyl group, a cyclohexyl group, and a cyclooctyl group. As the polycyclic cycloalkyl group, a cycloalkyl group having 6 to 20 carbon atoms is preferable, and examples thereof include an adamantyl group, a norbornyl group, an isobornyl group, a camphonyl group, a dicyclopentyl group, an α-pinanyl group, a tricyclodecanyl group, a tetracyclododecyl group, and an androstanyl group. Further, some of the carbon atoms in the cycloalkyl group may be substituted with heteroatoms such as an oxygen atom.

An aryl group as $R_{36}$ to $R_{39}$, $R_{01}$, $R_{02}$, or Ar is preferably an aryl group having 6 to 10 carbon atoms, and examples thereof include a phenyl group, a naphthyl group, and an anthryl group.

An aralkyl group as $R_{36}$ to $R_{39}$, $R_{01}$, or $R_{02}$ is preferably an aralkyl group with 7 to 12 carbon atoms, and is preferably, for example, a benzyl group, a phenethyl group, and a naphthylmethyl group.

An alkenyl group as $R_{36}$ to $R_{39}$, $R_{01}$, or $R_{02}$ is preferably an alkenyl group with 2 to 8 carbon atoms, and examples thereof include a vinyl group, an allyl group, a butenyl group, and a cyclohexenyl group.

A ring which can be formed by the mutual bonding of $R_{36}$ and $R_{37}$ may be monocyclic or polycyclic. The monocyclic ring is preferably a cycloalkyl structure having 3 to 8 carbon atoms, and examples thereof include a cyclopropane structure, a cyclobutane structure, a cyclopentane structure, a cyclohexane structure, a cycloheptane structure, and a cyclooctane structure. The polycyclic ring is preferably a cycloalkyl structure having 6 to 20 carbon atoms, and examples thereof include an adamantane structure, a norbomane structure, a dicyclopentane structure, a tricyclodecane structure, and a tetracyclododecane structure. Further, a part of carbon atoms in the cycloalkyl structure may be substituted with the heteroatom such as an oxygen atom.

Each of the groups may have a substituent. Examples of the substituent include an alkyl group, a cycloalkyl group, an aryl group, an amino group, an amido group, an ureido group, a urethane group, a hydroxyl group, a carboxyl group, a halogen atom, an alkoxy group, a thioether group, an acyl group, an acyloxy group, an alkoxycarbonyl group, a cyano group, and a nitro group. Theses substituents preferably have 8 or less carbon atoms.

The acid-decomposable group is preferably a cumyl ester group, an enol ester group, an acetal group, an acetal ester group, a tertiary alkyl ester group, or the like, and more preferably a tertiary alkyl ester group.

As the repeating unit having an acid-decomposable group, which can be contained in the resin (A), a repeating unit represented by General Formula (AI) is preferable.

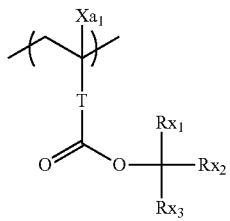

(AI)

In General Formula (AI), $Xa_1$ represents a hydrogen atom, or an alkyl group.

T represents a single bond or a divalent linking group.

$Rx_1$ to $Rx_3$ each independently represent an (linear or branched) alkyl group or a (monocyclic or polycyclic) cycloalkyl group.

Two of $Rx_1$ to $Rx_3$ may be bonded to each other to form a (monocyclic or polycyclic) cycloalkyl group.

The alkyl group represented by $Xa_1$ may or may not have a substituent, and examples thereof include a methyl group and a group represented by $-CH_2-R_{11}$. $R_{11}$ represents a halogen atom (a fluorine atom or the like), a hydroxyl group, or a monovalent organic group, and examples thereof include an alkyl group having 5 or less carbon atoms, and an acyl group having 5 or less carbon atoms. $R_{11}$ is preferably an alkyl group having 3 or less carbon atoms, and more preferably a methyl group. In one aspect, $Xa_1$ is preferably a hydrogen atom, a methyl group, a trifluoromethyl group, a hydroxymethyl group, or the like.

Examples of the divalent linking group of T include an alkylene group, a $-COO-Rt-$group, and an $-O-Rt-$group. In the formulae, Rt represents an alkylene group or a cycloalkylene group.

T is preferably a single bond or a $-COO-Rt-$group. Rt is preferably an alkylene group having 1 to 5 carbon atoms, and more preferably a $-CH_2-$ group, a $-(CH_2)-$ group, or a $-(CH_2)_3-$group.

As the alkyl group of each of $Rx_1$ to $Rx_3$, alkyl groups having 1 to 4 carbon atoms, such as a methyl group, an ethyl group, an n-propyl group, an isopropyl group, an n-butyl group, an isobutyl group, and a t-butyl group are preferable.

As the cycloalkyl group of each of $Rx_1$ to $Rx_3$, monocyclic cycloalkyl groups such as a cyclopentyl group and a cyclohexyl group, and polycyclic cycloalkyl groups such as a norbornyl group, a tetracyclodecanyl group, a tetracyclododecanyl group, and an adamantyl group are preferable.

As the cycloalkyl group formed by the bonding of two of $Rx_1$ to $Rx_3$, monocyclic cycloalkyl groups such as a cyclopentyl group and a cyclohexyl group, and polycyclic cycloalkyl groups such as a norbornyl group, a tetracyclodecanyl group, a tetracyclododecanyl group, and an adamantyl group are preferable, and monocyclic cycloalkyl groups having 5 or 6 carbon atoms are particularly preferable.

In the cycloalkyl group formed by the bonding of two of $Rx_1$ to $Rx_3$, for example, one of the methylene groups constituting the ring may be substituted with a heteroatom such as an oxygen atom, or with a group having a heteroatom, such as a carbonyl group.

For the repeating unit represented by General Formula (AI), for example, an aspect in which $Rx_1$ is a methyl group or an ethyl group, and $Rx_2$ and $Rx_3$ are bonded to form the afore-mentioned cycloalkyl group, is preferable.

Each of the groups may have a substituent, and examples of the substituent include an alkyl group (having 1 to 4 carbon atoms), a halogen atom, a hydroxyl group, an alkoxy group (having 1 to 4 carbon atoms), a carboxyl group, and an alkoxycarbonyl group (having 2 to 6 carbon atoms), with the groups having 8 or less carbon atoms being preferable.

Specific preferred examples of the repeating unit having an acid-decomposable group are set forth below, but the present invention is not limited thereto.

In the specific examples, Rx and $Xa_1$ each represent a hydrogen atom, $CH_3$, $CF_3$, or $CH_2OOH$. Rxa and Rxb each represent an alkyl group having 1 to 4 carbon atoms. Z represents a substituent containing a polar group, and in a case where Z's are present in plural numbers, they are each independent. p represents 0 or a positive integer. Examples of the substituent containing a polar group, represented by Z, include a linear or branched alkyl group, and a cycloalkyl group, each having a hydroxyl group, a cyano group, an amino group, an alkylamido group, or a sulfonamido group, and preferably an alkyl group having a hydroxyl group. As the branched alkyl group, an isopropyl group is particularly preferable.

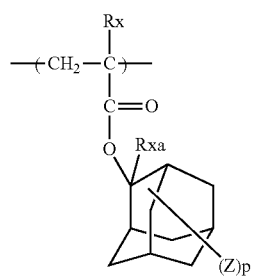
1
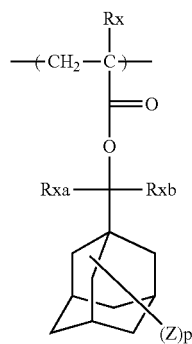
2
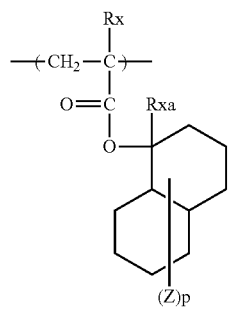
3
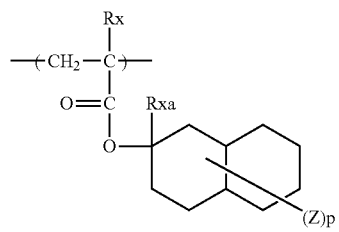
4
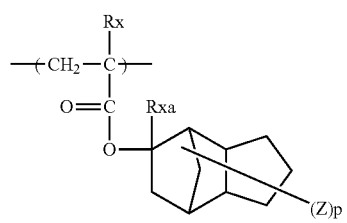
5
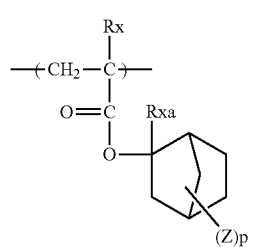
6
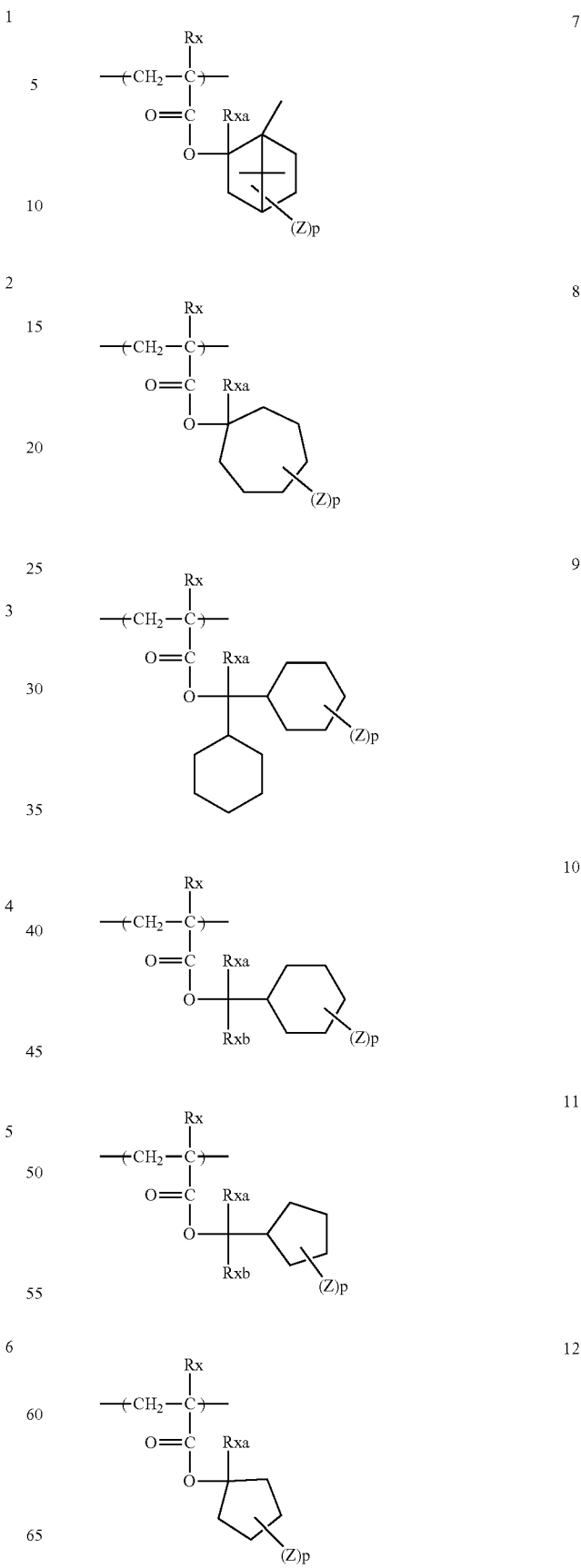

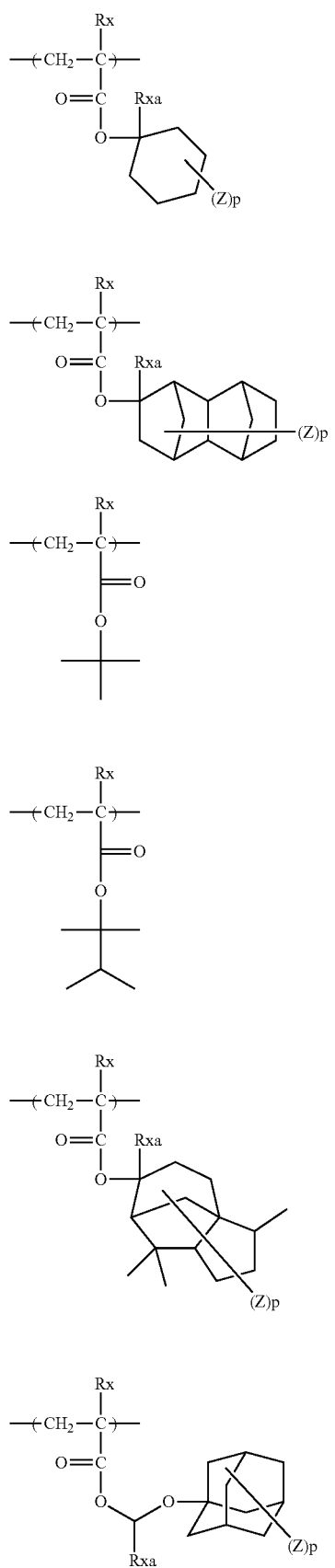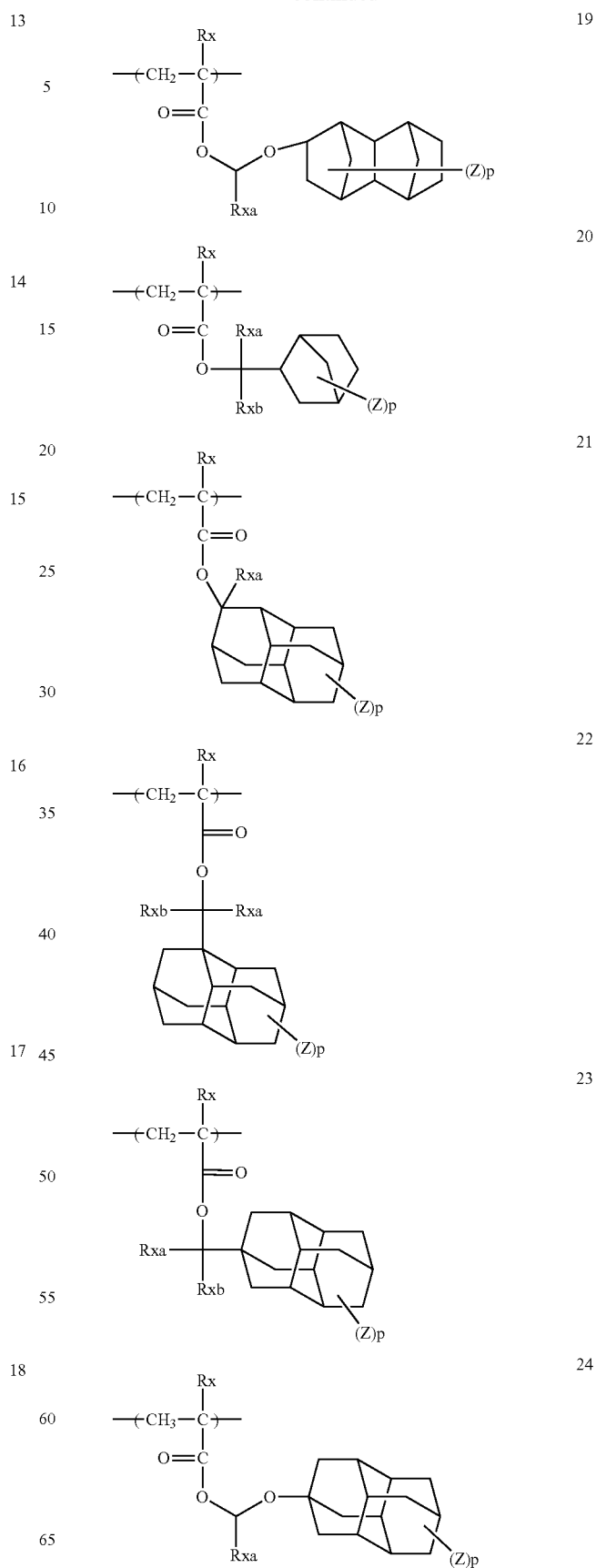

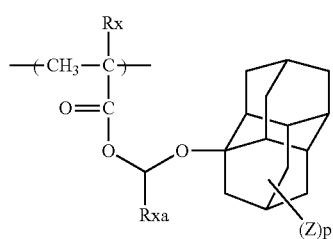

It is preferable that the resin (A) contains, for example, a repeating unit represented by General Formula (3), as the repeating unit represented by General Formula (AI).

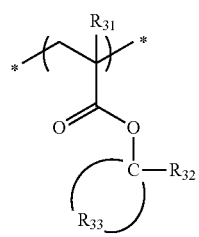

In General Formula (3), $R_{31}$ represents a hydrogen atom or an alkyl group.

$R_{32}$ represents an alkyl group or a cycloalkyl group, and specific examples thereof include a methyl group, an ethyl group, an n-propyl group, an isopropyl group, an n-butyl group, an isobutyl group, a sec-butyl group, a tert-butyl group, and a cyclohexyl group.

$R_{33}$ represents an atomic group required for forming a monocyclic alicyclic hydrocarbon structure together with a carbon atom to which $R_{32}$ is bonded. In the alicyclic hydrocarbon structure, a part of the carbon atoms constituting the ring may be substituted with a heteroatom or a group having a heteroatom.

The alkyl group of $R_{31}$ may have a substituent, and examples of the substituent include a fluorine atom and a hydroxyl group. $R_{31}$ preferably represents a hydrogen atom, a methyl group, a trifluoromethyl group, or a hydroxymethyl group.

$R_{32}$ is preferably a methyl group, an ethyl group, an n-propyl group, an isopropyl group, a tert-butyl group, or a cyclohexyl group, and more preferably a methyl group, an ethyl group, an isopropyl group, or a tert-butyl group.

The monocyclic alicyclic hydrocarbon structure formed by $R_{33}$ together with a carbon atom is preferably a 3- to 8-membered ring, and more preferably a 5- or 6-membered ring.

In the monocyclic alicyclic hydrocarbon structure formed by $R_{33}$ together with a carbon atom, examples of the heteroatom which can constitute a ring include an oxygen atom and a sulfur atom, and examples of the group having a heteroatom include a carbonyl group. However, it is preferable that the group having a heteroatom is not an ester group (ester bond).

It is preferable that the monocyclic alicyclic hydrocarbon structure formed by $R_{33}$ together with a carbon atom is formed of only carbon atoms and hydrogen atoms.

The repeating unit represented by General Formula (3) is preferably a repeating unit represented by General Formula (3').

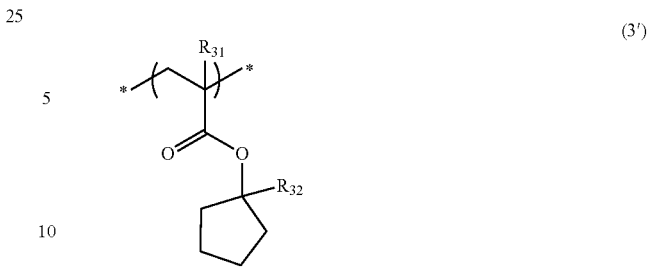

In General Formula (3'), $R_{31}$ and $R_{32}$ each have the same definitions as in General Formula (3).

Specific examples of the repeating unit having the structure represented by General Formula (3) include, not limited to, the following repeating units.

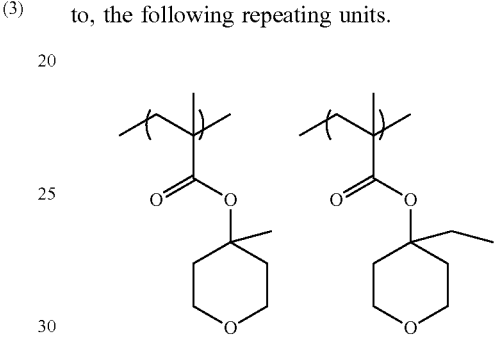

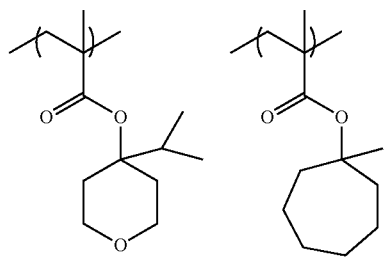

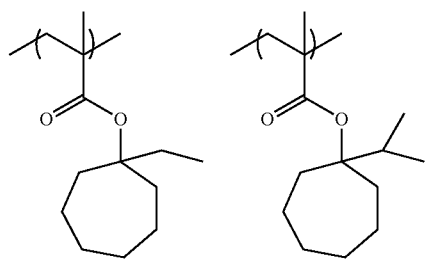

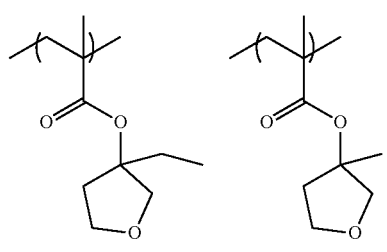

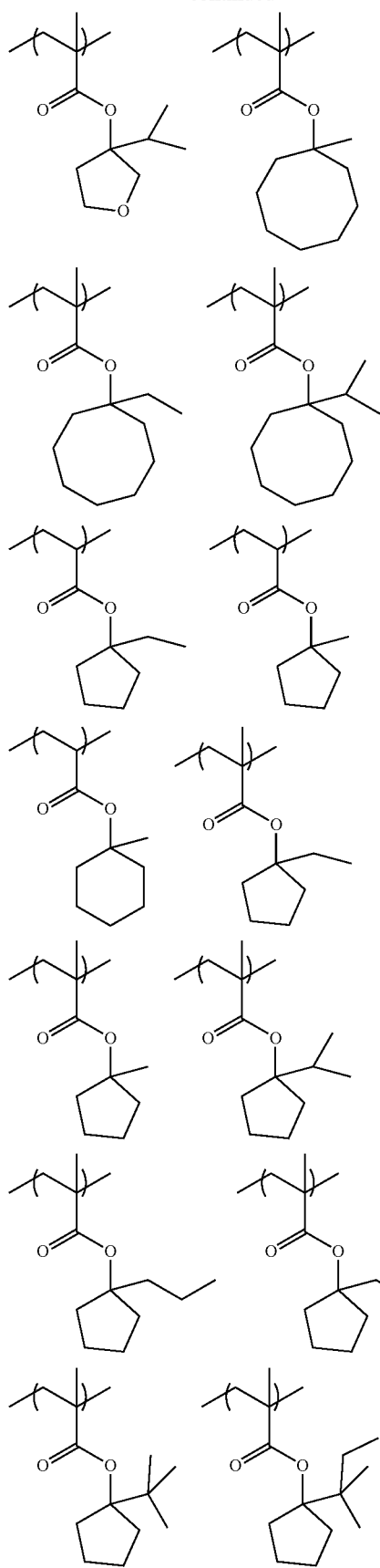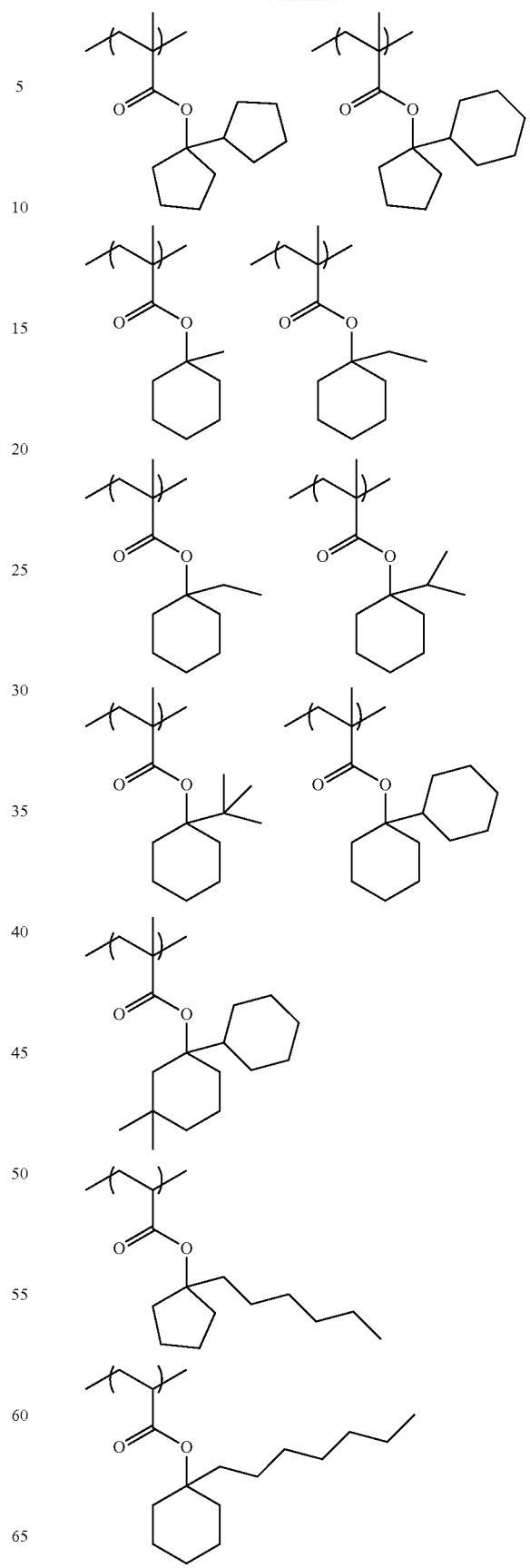

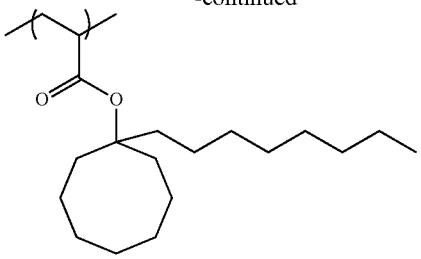

The content of the repeating unit having the structure represented by General Formula (3) is preferably 20% to 80% by mole, more preferably 25% to 75% by mole, and still more preferably 30% to 70% by mole, with respect to all the repeating units in the resin (A).

Furthermore, the repeating unit having an acid-decomposable group is also preferably a repeating unit represented by General Formula (A).

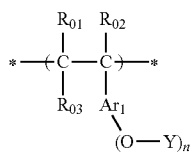

(A)

In the formula, $R_{01}$, $R_{02}$, and $R_{03}$ each independently represent, for example, a hydrogen atom, an alkyl group, a cycloalkyl group, a halogen atom, a cyano group, or an alkoxycarbonyl group. $Ar_1$ represents an aromatic ring group. $R_{03}$ represents an alkylene group or may be bonded to $Ar_1$, together with a —C—C— chain, to form a 5- or 6-membered ring.

n Y's each independently represent a hydrogen atom or a group that leaves by the action of an acid, provided that at least one of Y's represents a group that leaves by the action of an acid.

n represents an integer of 1 to 4, and is preferably 1 or 2, and more preferably 1.

The alkyl group as each of $R_{02}$ to $R_{03}$ is, for example, an alkyl group having 20 or less carbon atoms, preferably a methyl group, an ethyl group, a propyl group, an isopropyl group, an n-butyl group, a sec-butyl group, a hexyl group, a 2-ethylhexyl group, an octyl group, or a dodecyl group. More preferably, these alkyl groups are alkyl groups having 8 or less carbon atoms. Further, these alkyl groups may have a substituent.

The alkyl group included in the alkoxycarbonyl group is preferably the same as the alkyl group in each of $R_{01}$ to $R_{03}$.

The cycloalkyl group may be a monocyclic cycloalkyl group or a polycyclic cycloalkyl group. Preferred examples thereof include a monocyclic cycloalkyl group having 3 to 8 carbon atoms, such as a cyclopropyl group, a cyclopentyl group, and a cyclohexyl group. Further, these cycloalkyl groups may have a substituent.

Examples of the halogen atom include a fluorine atom, a chlorine atom, a bromine atom, and an iodine atom, with the fluorine atom being more preferable.

In a case where $R_{03}$ represents an alkylene group, preferred examples of the alkylene group include ones having 1 to 8 carbon atoms, such as a methylene group, an ethylene group, a propylene group, a butylene group, a hexylene group, and an octylene group.

The aromatic ring group as $Ar_1$ is preferably one having 6 to 14 carbon atoms, and examples thereof include a benzene ring, a toluene ring, and a naphthalene ring. Further, these aromatic ring groups may have a substituent.

Suitable examples of the group that leaves by the action of an acid as at least one of Y's include those described above.

The group that leaves by the action of an acid as at least one of Y's is preferably a structure represented by General Formula (B).

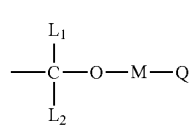

(B)

In the formula, $L_1$ and $L_2$ each independently represent a hydrogen atom, an alkyl group, a cycloalkyl group, an aryl group, or an aralkyl group.

M represents a single bond or a divalent linking group.

Q represents an alkyl group, a cycloalkyl group, a cyclic aliphatic group, an aromatic ring group, an amino group, an ammonium group, a mercapto group, a cyano group, or an aldehyde group. The cyclic aliphatic group and the aromatic ring group may include a heteroatom.

At least two of Q, M, and $L_1$ may be bonded to each other to form a 5- or 6-membered ring.

The alkyl group as each of $L_1$ and $L_2$ is, for example, an alkyl group having 1 to 8 carbon atoms, and specific examples thereof include a methyl group, an ethyl group, a propyl group, an n-butyl group, a sec-butyl group, a hexyl group, and an octyl group.

The cycloalkyl group as each of $L_1$ and $L_2$ is, for example, a cycloalkyl group having 3 to 15 carbon atoms, and specific examples thereof include a cyclopentyl group, a cyclohexyl group, a norbornyl group, and an adamantyl group.

The aryl group as each of $L_1$ and $L_2$ is, for example, an aryl group having 6 to 15 carbon atoms, and specific examples thereof include a phenyl group, a tolyl group, a naphthyl group, and an anthryl group.

The aralkyl group as each of $L_1$ and $L_2$ is, for example, an aralkyl group having 6 to 20 carbon atoms, and specific examples thereof include a benzyl group and a phenethyl group.

Examples of the divalent linking group as M include an alkylene group (for example, a methylene group, an ethylene group, a propylene group, a butylene group, a hexylene group, and an octylene group), a cycloalkylene group (for example, a cyclopentylene group and a cyclohexylene group), an alkenylene group (for example, an ethenylene group, a propenylene group, and a butenylene group), an arylene group (for example, a phenylene group, a tolylene group, and a naphthylene group), —S—, —O—, —CO—, —SO$_2$—, —N($R_0$)—, and a combination of two or more thereof. Here, $R_0$ is a hydrogen atom or an alkyl group. The alkyl group as $R_0$ is, for example, an alkyl group having 1 to 8 carbon atoms, and specific examples thereof include a methyl group, an ethyl group, a propyl group, an n-butyl group, a sec-butyl group, a hexyl group, and an octyl group.

Examples of the alkyl group and the cycloalkyl group as Q are the same as those described above for the alkyl group and the cycloalkyl group of each of $L_1$ and $L_2$, respectively.

Examples of the alicyclic group or the aromatic ring group as Q include the above-described cycloalkyl group and aryl group as each of $L_1$ and $L_2$. The cycloalkyl group and the aryl group are each preferably a group having 3 to 15 carbon atoms.

Examples of the heteroatom-containing alicyclic or aromatic ring group as Q include a group having a heterocyclic structure such as thiirane, cyclothiolane, thiophene, furan, pyrrole, benzothiophene, benzofuran, benzopyrrole, triazine, imidazole, benzimidazole, triazole, thiadiazole, thiazole, and pyrrolidone, but the ring is not limited thereto as long as it is a ring formed of carbon and a heteroatom or a ring formed of only a heteroatom.

Examples of the ring structure which may be formed by the mutual bonding of at least two of Q, M, or $L_1$ include a 5- or 6-membered ring obtained by forming a propylene group or a butylene group by these members. In addition, this 5- or 6-membered ring structure contains an oxygen atom.

Each of the groups represented by $L_1$, $L_2$, M, and Q in General Formula (B) may have a substituent, and examples of the substituent include an alkyl group, a cycloalkyl group, an aryl group, an amino group, an amido group, a ureido group, a urethane group, a hydroxyl group, a carboxyl group, a halogen atom, an alkoxy group, a thioether group, an acyl group, an acyloxy group, an alkoxycarbonyl group, a cyano group, and a nitro group. The substituent preferably has 8 or less carbon atoms.

The group represented by -(M-Q) is preferably a group having 1 to 20 carbon atoms, more preferably a group having 1 to 10 carbon atoms, and still more preferably a group having 1 to 8 carbon atoms.

Moreover, the resin (A) may include a repeating unit represented by General Formula (BZ) as the repeating unit having an acid-decomposable group.

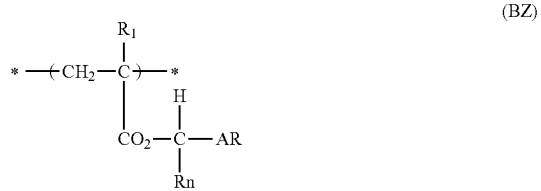

(BZ)

In General Formula (BZ), AR represents an aryl group. Rn represents an alkyl group, a cycloalkyl group, or an aryl group. Rn and AR may be bonded to each other to form a non-aromatic ring.

$R_1$ represents a hydrogen atom, an alkyl group, a cycloalkyl group, a halogen atom, a cyano group, or an alkyloxycarbonyl group.

As the aryl group of AR, an aryl group having 6 to 20 carbon atoms, such as a phenyl group, a naphthyl group, an anthryl group, and a fluorene group is preferable, and an aryl group having 6 to 15 carbon atoms is more preferable.

In a case where AR is a naphthyl group, an anthryl group, or a fluorene group, the position of bonding of AR to the carbon atom to which Rn is bonded is not particularly limited. For example, in a case where AR is a naphthyl group, the carbon atom may be bonded to either of an α-position and a β-position, of the naphthyl group. In a case where AR is an anthryl group, the carbon atom may be bonded to any of the 1-position, 2-position, and 9-position of the anthryl group.

Each of the aryl groups as AR may have one or more substituents. Specific examples of such a substituent include a linear or branched alkyl group having 1 to 20 carbon atoms such as a methyl group, an ethyl group, a propyl group, an isopropyl group, an n-butyl group, an isobutyl group, a t-butyl group, a pentyl group, a hexyl group, an octyl group, and a dodecyl group, an alkoxy group containing any of these alkyl group moieties, a cycloalkyl group such as a cyclopentyl group and a cyclohexyl group, a cycloalkoxy group containing such a cycloalkyl group moiety, a hydroxyl group, a halogen atom, an aryl group, a cyano group, a nitro group, an acyl group, an acyloxy group, an acylamino group, a sulfonylamino group, an alkylthio group, an arylthio group, an aralkylthio group, a thiophenecarbonyloxy group, a thiophenemethylcarbonyloxy group, and a heterocyclic residue such as a pyrrolidone residue. Among these substituents, a linear or branched alkyl group having 1 to 5 carbon atoms and an alkoxy group containing the alkyl group moiety are preferable, and a paramethyl group and a paramethoxy group are more preferable.

In the case where the aryl group of AR has a plurality of substituents, at least two members out of the plurality of substituents may be bonded to each other to form a ring. The ring is preferably a 5- to 8-membered ring, and more preferably a 5- or 6-membered ring. The ring may be also a heterocyclic ring including a heteroatom such as an oxygen atom, a nitrogen atom, and a sulfur atom in the ring members.

Furthermore, this ring may have a substituent. Examples of the substituent are the same as those described later for the further substituent which Rn may have.

Moreover, from the viewpoint of the roughness performance, the repeating unit represented by General Formula (BZ) preferably contains two or more aromatic rings. Usually, the number of aromatic rings contained in this repeating unit is preferably 5 or less, and more preferably 3 or less.

In addition, from the viewpoint of the roughness performance, AR in the repeating unit represented by General Formula (BZ) preferably contains two or more aromatic rings, and AR is more preferably a naphthyl group or a biphenyl group. Usually, the number of aromatic rings contained in AR is preferably 5 or less, and more preferably 3 or less.

Rn represents an alkyl group, a cycloalkyl group, or an aryl group as described above.

The alkyl group of Rn may be a linear alkyl group or a branched alkyl group. This alkyl group is preferably an alkyl group having 1 to 20 carbon atoms, such as a methyl group, an ethyl group, a propyl group, an isopropyl group, an n-butyl group, an isobutyl group, a t-butyl group, a pentyl group, a hexyl group, a cyclohexyl group, an octyl group, and a dodecyl group. The alkyl group of Rn is preferably an alkyl group having 1 to 5 carbon atoms, and more preferably an alkyl group having 1 to 3 carbon atoms.

Examples of the cycloalkyl group of Rn include a cycloalkyl group having 3 to 15 carbon atoms, such as a cyclopentyl group and a cyclohexyl group.

The aryl group of Rn is preferably, for example, an aryl group having 6 to 14 carbon atoms, such as a phenyl group, a xylyl group, a toluoyl group, a cumenyl group, a naphthyl group, and an anthryl group.

Each of the alkyl group, the cycloalkyl group, and the aryl group as Rn may further have a substituent. Examples of the substituent include an alkoxy group, a hydroxyl group, a halogen atom, a nitro group, an acyl group, an acyloxy group, an acylamino group, a sulfonylamino group, a dialkylamino group, an alkylthio group, an arylthio group, an aralkylthio group, a thiophenecarbonyloxy group, a thiophenemethylcarbonyloxy group, and a heterocyclic residue such as pyrrolidone residue. Among these, an alkoxy group, a hydroxyl group, a halogen atom, a nitro group, an acyl group, an acyloxy group, an acylamino group, and a sulfonylamino group are particularly preferable.

$R_1$ represents a hydrogen atom, an alkyl group, a cycloalkyl group, a halogen atom, a cyano group, or an alkyloxycarbonyl group as described above.

Examples of the alkyl group and the cycloalkyl group of $R_1$ are the same as those described above for Rn. Each of these alkyl group and cycloalkyl group may have a substituent. Examples of this substituent are the same as those described above for Rn.

In the case where $R_1$ is an alkyl or cycloalkyl group having a substituent, particularly preferred examples of R1 include a trifluoromethyl group, an alkyloxycarbonylmethyl group, an alkylcarbonyloxymethyl group, a hydroxymethyl group, and an alkoxymethyl group.

The halogen atom of $R_1$ includes fluorine atom, chlorine atom, bromine atom and iodine atom, with the fluorine atom being particularly preferable.

As the alkyl group moiety included in the alkyloxycarbonyl group of $R_1$, for example, the configuration mentioned above as the alkyl group of $R_1$ may be employed.

Rn and AR are preferably bonded to each other to form a non-aromatic ring, and thus, particularly the roughness performance can be more improved.

The non-aromatic ring which may be formed by the mutual bonding of Rn and AR is preferably a 5- to 8-membered ring, and more preferably a 5- or 6-membered ring.

The non-aromatic ring may be an aliphatic ring or a heterocyclic ring containing a heteroatom such as an oxygen atom, a nitrogen atom, and a sulfur atom as a ring member.

The non-aromatic ring may have a substituent. Examples of the substituent are the same as those described above for the further substituent which Rn may have.

Specific preferred examples of the repeating unit represented by General Formula (BZ) are shown below, but the present invention is not limited thereto.

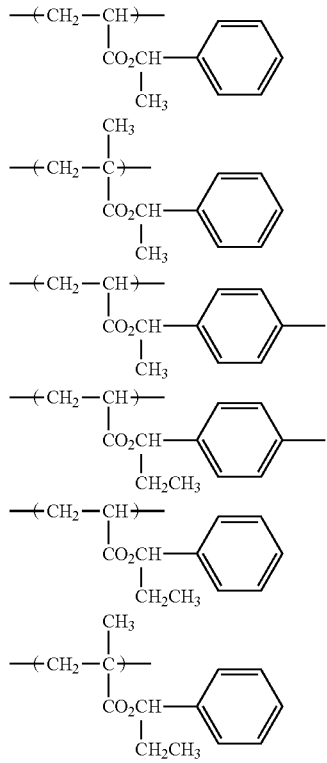

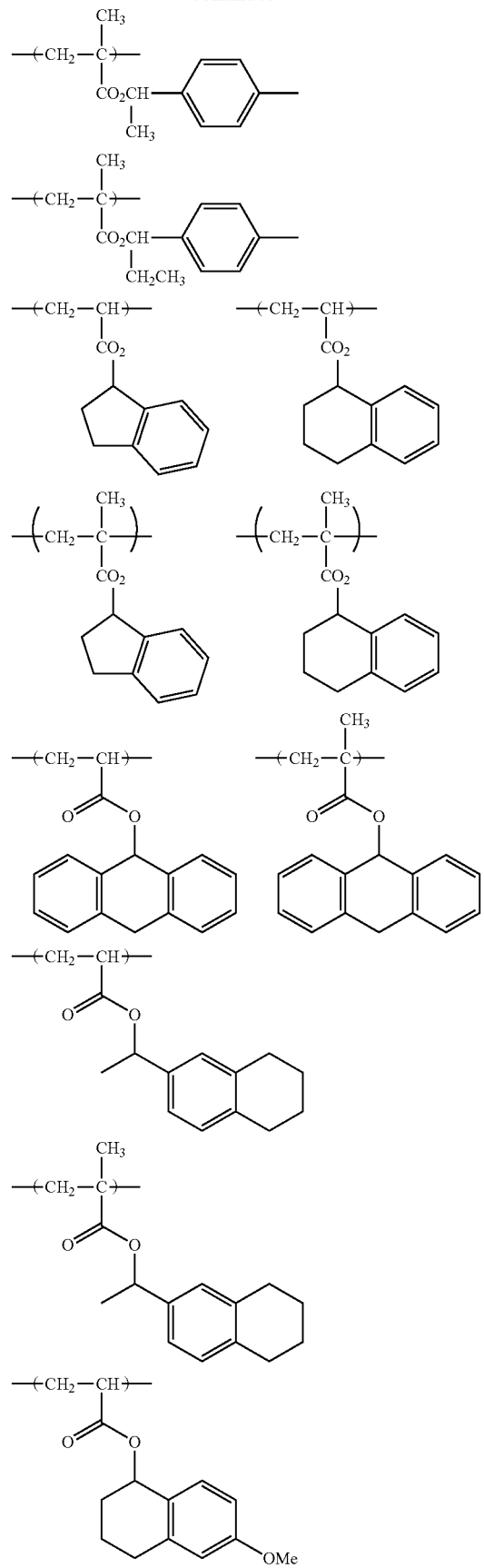

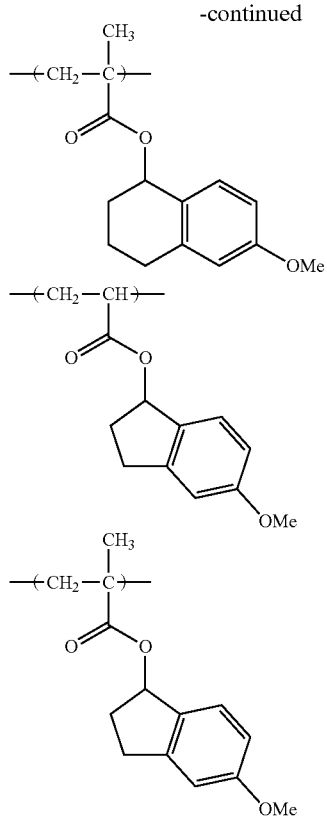

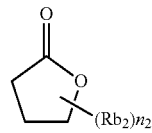  LC1-1

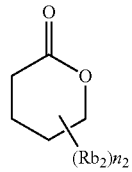  LC1-2

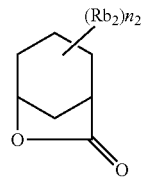  LC1-3

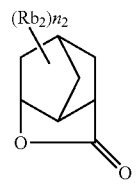  LC1-4

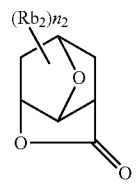  LC1-5

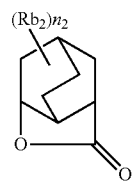  LC1-6

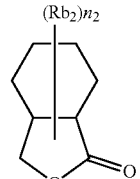  LC1-7

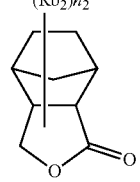  LC1-8

The total content of the repeating units having an acid-decomposable group is preferably 20% to 90% by mole, more preferably 25% to 85% by mole, and still more preferably 30% to 80% by mole, with respect to all the repeating units in the resin (A).

In one aspect, the resin (A) preferably has a repeating unit having a cyclic carbonic acid ester structure. This cyclic carbonic acid ester structure is a structure having a ring including a bond represented by —O—C(=O)—O— as an atomic group constituting the ring. The ring including a bond represented by —O—C(=O)—O— as an atomic group constituting the ring is preferably a 5- to 7-membered ring, and most preferably a 5-membered ring. Such a ring may be fused with another ring to form a fused ring.

Moreover, the resin (A) may contain a repeating unit having a lactone structure or sultone (cyclic sulfonic acid ester) structure.

As the lactone group or the sultone group, any group having a lactone structure or sultone structure can be used, and is preferably a 5- to 7-membered ring lactone structure or sultone structure, with a 5- to 7-membered ring lactone or sultone structure to which another ring structure is fused so as to form a bicyclo structure or spiro structure being preferable. The resin (A) more preferably has a repeating unit having a lactone structure or sultone structure represented by any one of General Formulae (LC1-1) to (LC1-17), (SL1-1), and (SL1-2). Further, the lactone structure or the sultone structure may be directly bonded to a main chain. A preferred lactone structure or sultone structure is (LC1-1), (LC1-4), (LC1-5), or (LC1-8), with (LC1-4) being more preferable. By using a specific lactone structure or sultone structure, line width roughness (LWR) and development defects are improved.

LC1-9 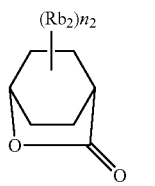

LC1-10 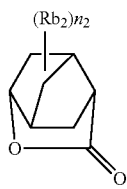

LC1-11 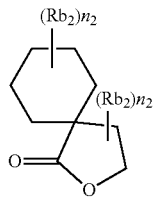

LC1-12 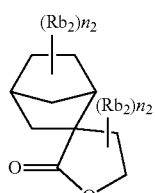

LC1-13 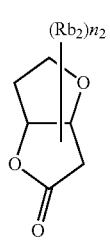

LC1-14 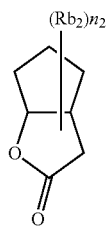

LC1-15 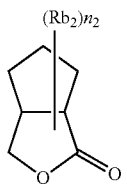

LC1-16 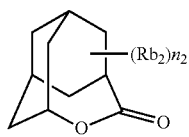

LC1-17 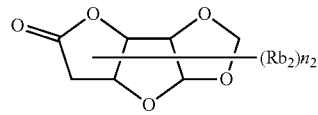

SL1-1 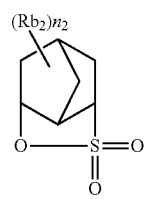

SL1-2 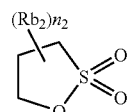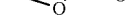

The lactone structure moiety or the sultone structure moiety may or may not have a substituent (Rb$_2$). Preferred examples of the substituent (Rb$_2$) include an alkyl group having 1 to 8 carbon atoms, a cycloalkyl group having 4 to 7 carbon atoms, an alkoxy group having 1 to 8 carbon atoms, an alkoxycarbonyl group having 2 to 8 carbon atoms, a carboxyl group, a halogen atom, a hydroxyl group, a cyano group, and an acid-decomposable group. Among these, an alkyl group having 1 to 4 carbon atoms, a cyano group, and an acid-decomposable group are more preferable. n$_2$ represents an integer of 0 to 4. In a case where n$_2$ is 2 or more, the substituents (Rb$_2$) which are present in plural numbers may be the same as or different from each other, and further, the substituents (Rb$_2$) which are present in plural numbers may be bonded to each other to form a ring.

Specific examples of the repeating unit having a lactone structure or sultone (cyclic sulfonic acid ester) structure include the following repeating units, but the present invention is not limited thereto.

(in the formulae, Rx represents H, CH$_3$, CH$_2$OH, or CF$_3$)

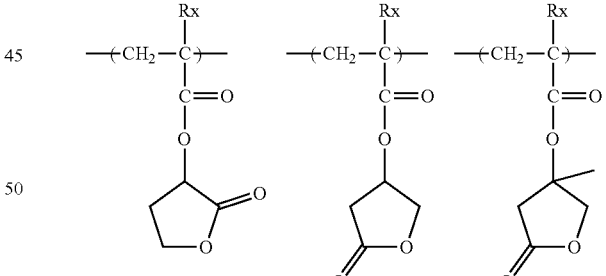

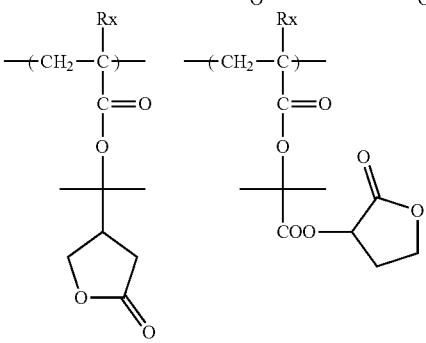

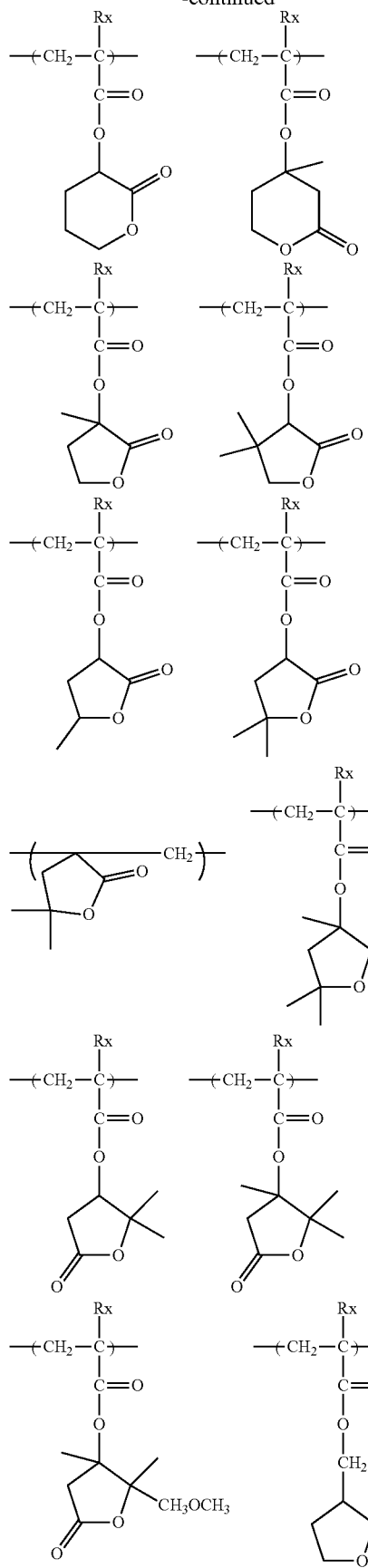
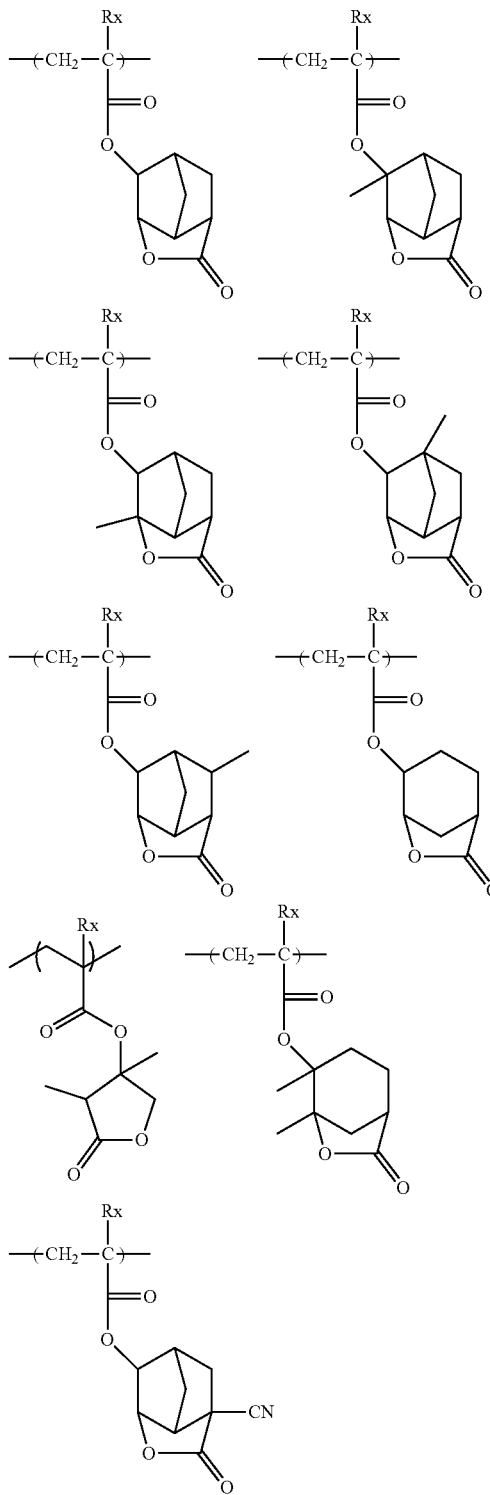
(in the formulae, Rx represents H, CH$_3$, CH$_2$OH, or CF$_3$)

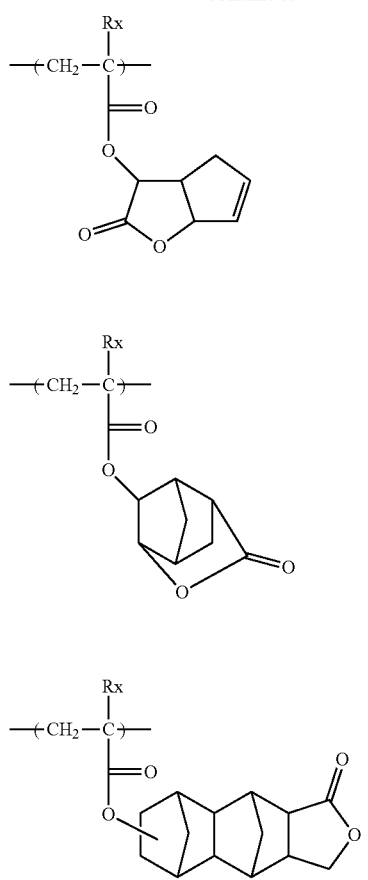
(in the formulae, Rx represents H, CH$_3$, CH$_2$OH, or CF$_3$)
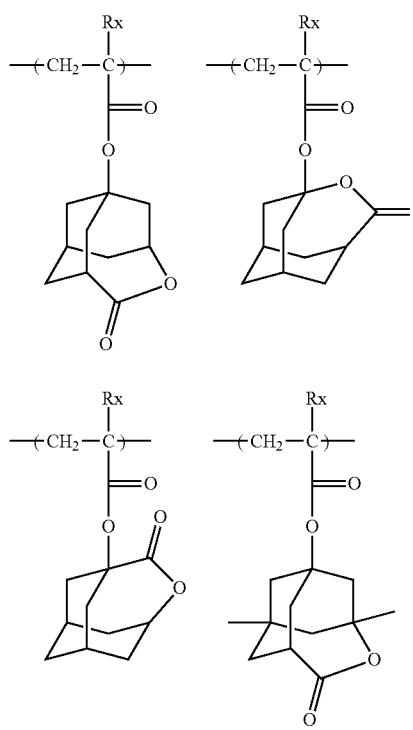
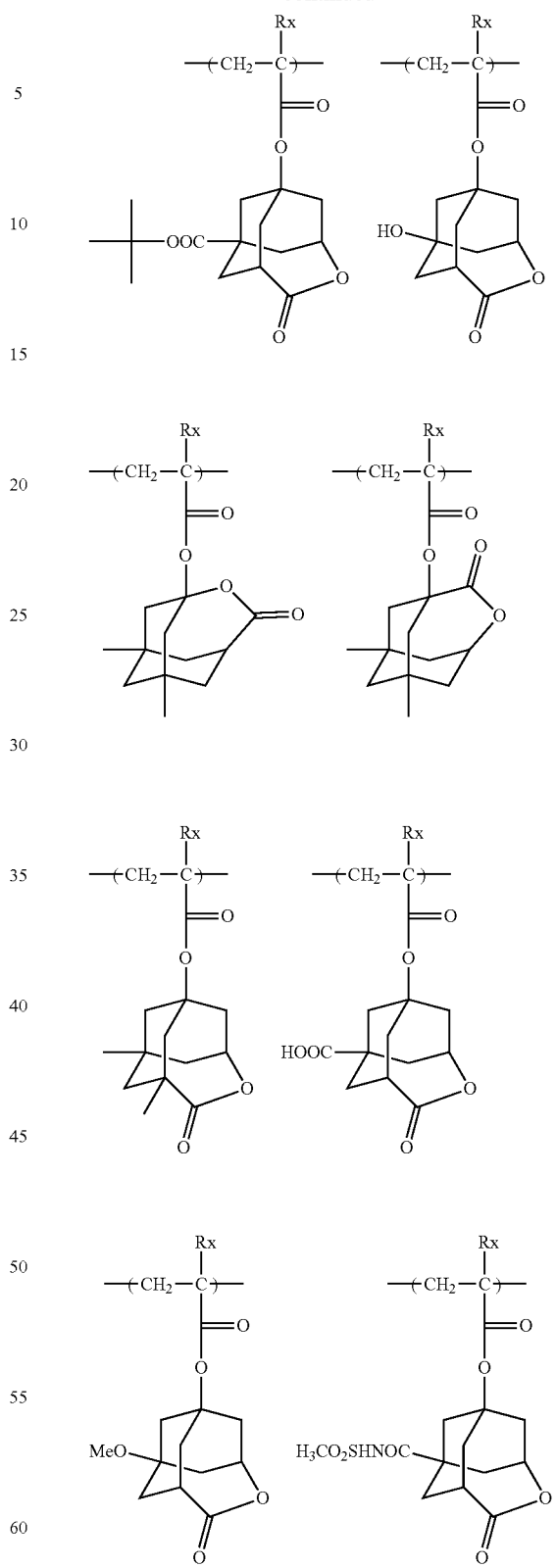
Particularly preferred examples of the repeating units include the following repeating units. By selecting optimal lactone structures, a pattern profile and a density dependence are improved.

(in the formulae, Rx represents H, CH₃, CH₂OH, or CF₃)

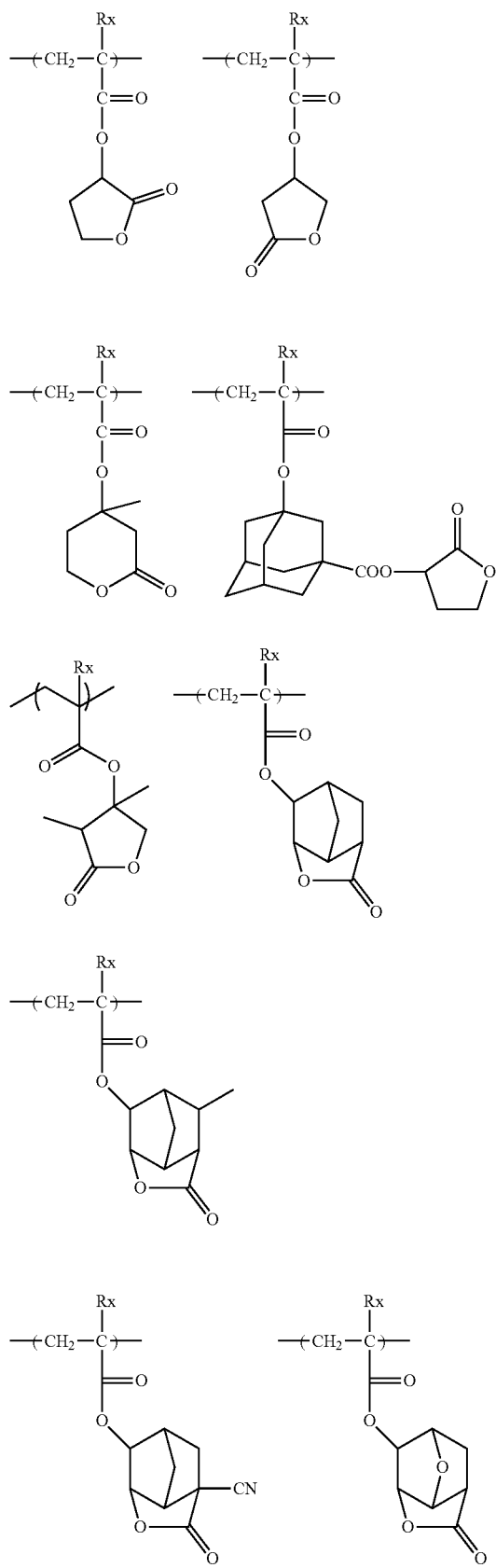

The repeating unit having a lactone group or a sultone group usually has an optical isomer, and any optical isomer may be used. Further, one kind of optical isomer may be used singly or a plurality of optical isomers may be mixed and used. In a case of mainly using one kind of optical isomer, the optical purity (ee) thereof is preferably 90% or more, and more preferably 95% or more.

The resin (A) preferably has a repeating unit having a hydroxyl group or a cyano group other than General Formulae (AI) and (3). Thus, adhesiveness to a substrate and affinity for a developer are improved. The repeating unit having a hydroxyl group or a cyano group is preferably a repeating unit having an alicyclic hydrocarbon structure substituted with a hydroxyl group or a cyano group, and preferably has no acid-decomposable group. In the alicyclic hydrocarbon structure substituted with a hydroxyl group or a cyano group, as the alicyclic hydrocarbon structure, an adamantyl group, a diadamantyl group, and a norbornane group are preferable. As the preferred alicyclic hydrocarbon structure substituted with a hydroxyl group or a cyano group, structures represented by the following general formulae are preferable.

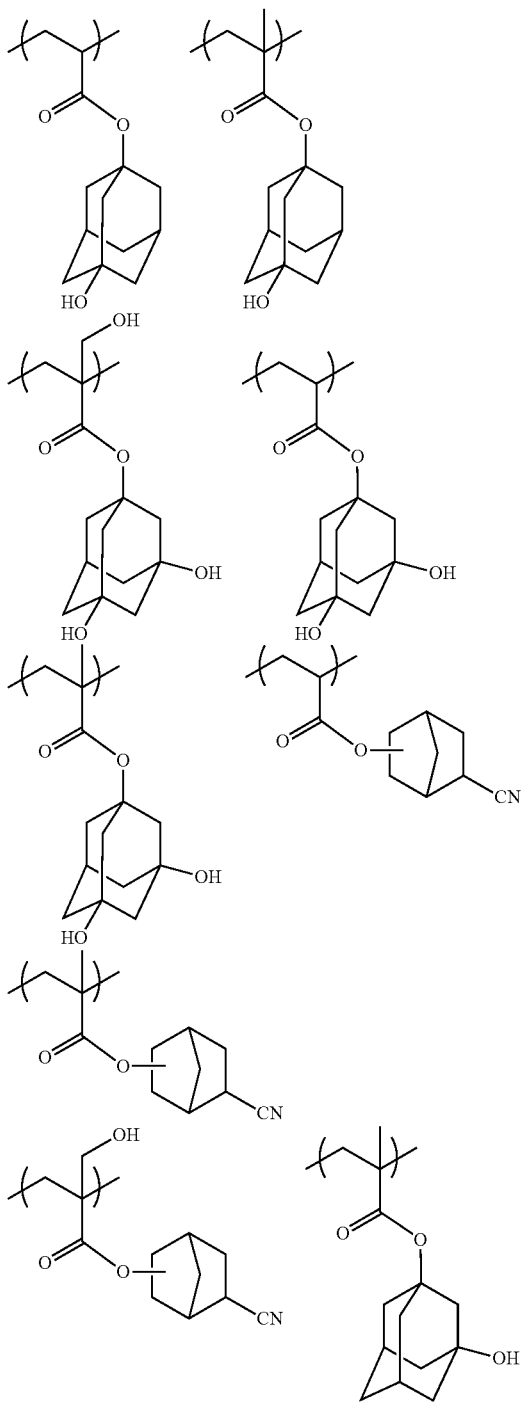

The content of the repeating unit having a hydroxyl group or a cyano group is preferably 5% to 40% by mole, more preferably 5% to 30% by mole, and still more preferably 10% to 25% by mole, with respect to all the repeating units in the resin (A).

Specific examples of the repeating unit having a hydroxyl group or a cyano group include the repeating units disclosed in paragraph 0340 of WO2012/0135348A, but the present invention is not limited thereto.

The resin (A) used in the actinic ray-sensitive or radiation-sensitive resin composition of the present invention may have a repeating unit having an alkali-soluble group.

Examples of the alkali-soluble group include a carboxyl group, a sulfonamido group, a sulfonylimido group, a bis-sulfonylimido group, and an aliphatic alcohol group (for example, a hexafluoroisopropanol group) which is substituted by an electron withdrawing group at an α-position, and more preferably having a repeating unit with a carboxyl group. Due to the resin containing a repeating unit with an alkali-soluble group, resolution during formation of contact holes is enhanced. As the repeating unit having an alkali-soluble group, any of a repeating unit where an alkali-soluble group is bonded directly to the main chain of the resin such as repeating units derived from acrylic acid or methacrylic acid, a repeating unit where an alkali-soluble group is bonded to the main chain of the resin via a linking group, or further, introduction of a polymerization initiator or a chain transfer agent which has an alkali-soluble group to a terminal of a polymer chain used during polymerization is preferable, and the linking group may have a monocyclic or polycyclic hydrocarbon structure. The repeating unit derived from acrylic acid or methacrylic acid is particularly preferable.

The content of the repeating unit having an alkali-soluble group is preferably 0% to 20% by mole, more preferably 3% to 15% by mole, and still more preferably 5% to 10% by mole, with respect to all the repeating units in the resin (A).

Specific examples of the repeating unit having an alkali-soluble group include the repeating units disclosed in paragraph 0344 of WO2012/0135348A, but the present invention is not limited thereto.

Furthermore, the resin (A) preferably has a repeating unit having a phenolic hydroxyl group, and more preferably has a repeating unit derived from hydroxystyrene, as the repeating unit having an alkali-soluble group.

The phenolic hydroxyl group is a group formed by substituting a hydrogen atom of an aromatic ring group with a hydroxyl group. The aromatic ring is a monocyclic or polycyclic aromatic ring, and examples thereof include aromatic hydrocarbon rings having 6 to 18 carbon atoms, which may have a substituent, such as a benzene ring, a naphthalene ring, an anthracene ring, a fluorene ring, and a phenanthrene ring, or aromatic hetero rings including a hetero ring, such as a thiophene ring, a furan ring, a pyrrole ring, a benzothiophene ring, a benzofuran ring, a benzopyrrole ring, a triazine ring, an imidazole ring, a benzimidazole ring, a triazole ring, a thiadiazole ring, and a thiazole ring. Among these, from the viewpoint of resolution, the benzene ring or the naphthalene ring is preferable, and the benzene ring is the most preferable.

In a case where the resin (A) has the repeating unit having a phenolic hydroxyl group, the content of the repeating unit having a phenolic hydroxyl group is preferably 30% to 90% by mole, more preferably 35% to 85% by mole, and still more preferably 40% to 80% by mole, with respect to all the repeating units in the resin (A).

Specific examples of the repeating unit having a phenolic hydroxyl group are set forth below, but the present invention is not limited thereto.

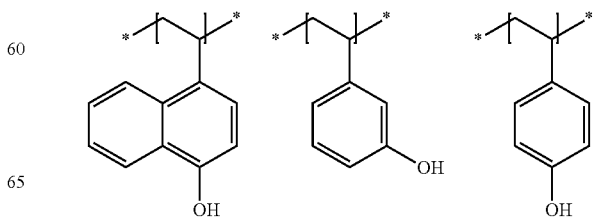

-continued
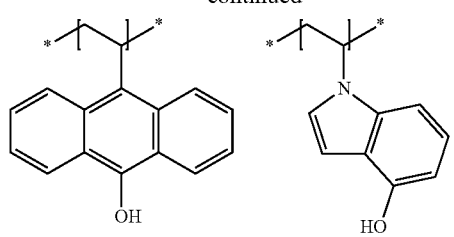
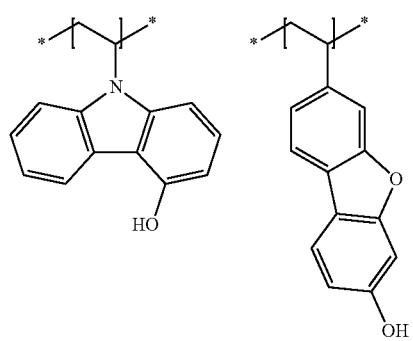
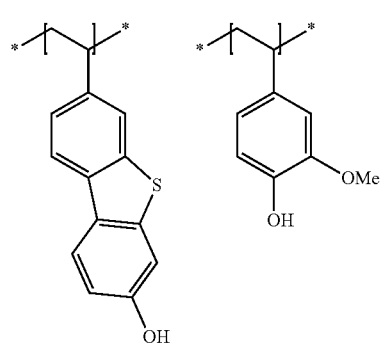
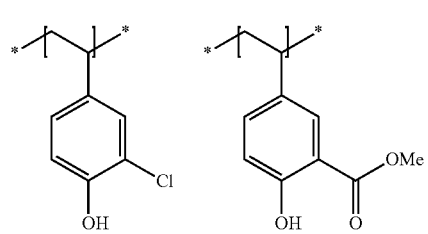
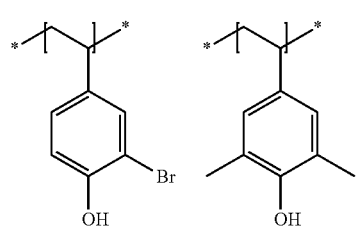
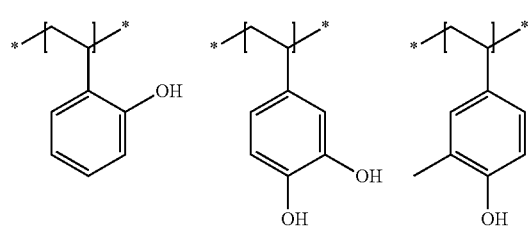
-continued
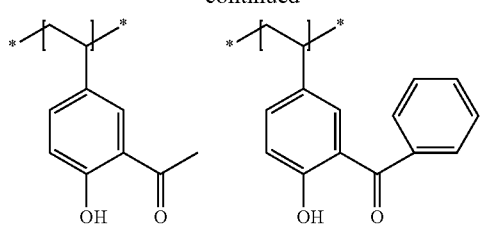
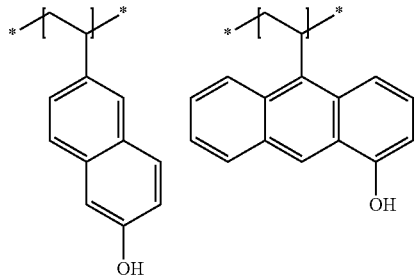
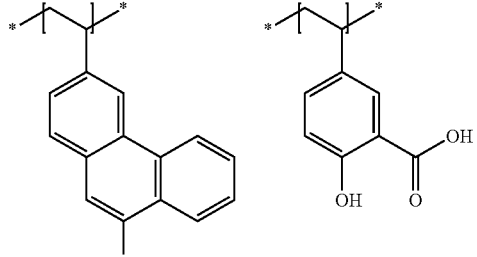
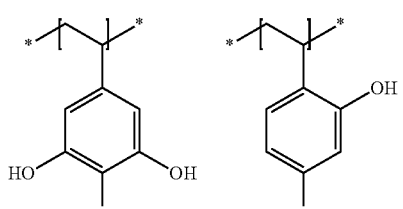
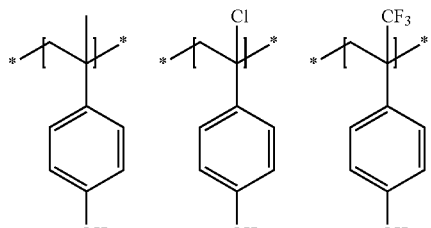
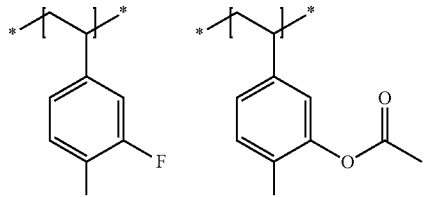
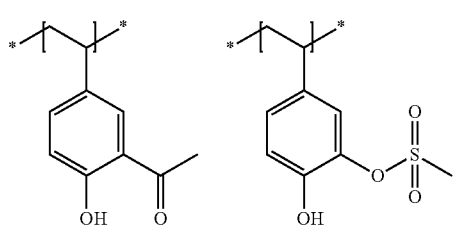

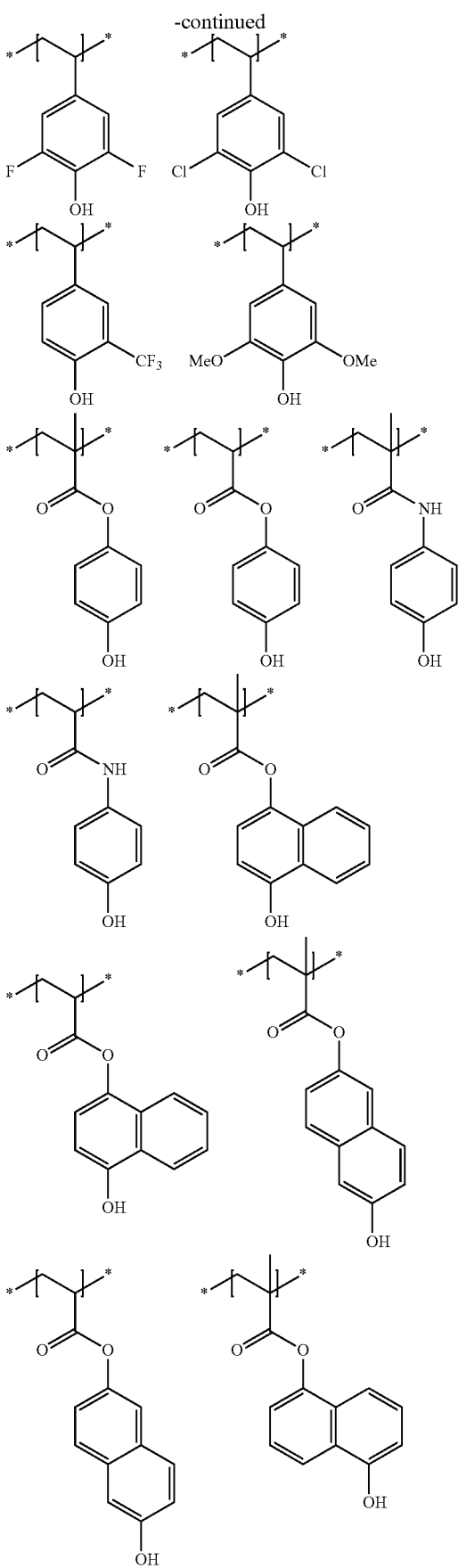
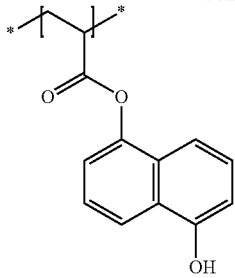
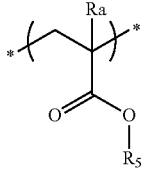

The resin (A) of the present invention can have a repeating unit having an alicyclic hydrocarbon structure having no polar group (for example, the alkali-soluble group, a hydroxyl group, and a cyano group) and not exhibiting acid decomposability. Examples of such a repeating unit include a repeating unit represented by General Formula (IV).

$$(IV)$$

In General Formula (IV), $R_5$ represents a hydrocarbon group which has at least one cyclic structure and does not have a polar group.

Ra represents a hydrogen atom, an alkyl group, or a —$CH_2$—O—$Ra_2$ group. In the formula, $Ra_2$ represents a hydrogen atom, an alkyl group, or an acyl group. Ra is preferably a hydrogen atom, a methyl group, a hydroxymethyl group, or a trifluoromethyl group, and particularly preferably a hydrogen atom or a methyl group.

The cyclic structure contained in $R_5$ includes a monocyclic hydrocarbon group and a polycyclic hydrocarbon group. Examples of the monocyclic hydrocarbon group include cycloalkyl groups having 3 to 12 carbon atoms, such as a cyclopentyl group, a cyclohexyl group, a cycloheptyl group, and a cyclooctyl group, and cycloalkenyl groups having 3 to 12 carbon atoms, such as a cyclohexenyl group. Preferred examples of the monocyclic hydrocarbon group include a monocyclic hydrocarbon group having 3 to 7 carbon atoms, and more preferably a cyclopentyl group and a cyclohexyl group.

Examples of the polycyclic hydrocarbon group include a ring-aggregated hydrocarbon group and a crosslinked cyclic hydrocarbon group, and examples of the ring-aggregated hydrocarbon group include a bicyclohexyl group, and a perhydronaphthalenyl group. Examples of the crosslinked cyclic hydrocarbon group include bicyclic hydrocarbon group such as a pinane ring, a bornane ring, a norpinane ring, a norbornane ring, and a bicyclooctane ring (a bicyclo[2.2.2]octane ring, a bicyclo[3.2.1]octane ring, and the like); tricyclic hydrocarbon rings such as a homobrendane ring, an adamantane ring, a tricyclo[5.2.1.0$^{2,6}$]decane ring, and a tricyclo[4.3.1.1$^{2,5}$]undecane ring; and tetracyclic hydrocarbon group such as a tetracyclo[4.4.0.1$^{2,5}$.1$^{7,10}$]dodecane ring and a perhydro-1,4-methano-5,8-methanonaphthalene ring. Other examples of the crosslinked cyclic hydrocarbon group include a hydrocarbon group of a fused ring, for example, a fused ring in which a plurality of 5- to 8-membered cycloalkane rings such as a perhydronaphthalene ring (decalin), a perhydroanthracene ring, a perhydrophenanthrene ring, a perhydroacenaphthene ring, a perhydrofluorene ring, a perhydroindene ring, and a perhydrophenalene ring are fused.

Preferred examples of the crosslinked cyclic hydrocarbon group include a norbornyl group, an adamantyl group, a bicyclooctanyl group, and a tricyclo[5,2,1,0$^{2,6}$]decanyl group. More preferred examples of the crosslinked cyclic hydrocarbon group include a norbornyl group and an adamantyl group.

These alicyclic hydrocarbon groups may include a substituent, and preferred examples of the substituent include a halogen atom, an alkyl group, a hydroxyl group substituted with a hydrogen atom, an amino group substituted with a hydrogen atom, and the like. Preferred examples of the halogen atom include a bromine atom, a chlorine atom, and a fluorine atom, and preferred examples of the alkyl group include a methyl group, an ethyl group, a butyl group, and a t-butyl group. The alkyl group may further have a substituent, and examples of this substituent that may be further contained include a halogen atom, an alkyl group, a hydroxyl group substituted with a hydrogen atom, and an amino group substituted with a hydrogen atom.

Examples of the group substituted with a hydrogen atom include an alkyl group, a cycloalkyl group, an aralkyl group, a substituted methyl group, a substituted ethyl group, an alkoxycarbonyl group, and an aralkyloxycarbonyl group. Preferred examples of the alkyl group include an alkyl group having 1 to 4 carbon atoms, preferred examples of the substituted methyl group include a methoxymethyl group, a methoxythiomethyl group, a benzyloxymethyl group, a t-butoxymethyl group, and a 2-methoxyethoxymethyl group, preferred examples of the substituted ethyl group include 1-ethoxyethyl and 1-methyl-1-methoxyethyl, preferred examples of the acyl group include an aliphatic acyl group having 1 to 6 carbon atoms, such as a formyl group, an acetyl group, a propionyl group, a butyryl group, an isobutyryl group, a valeryl group, and a pivaloyl group, and examples of the alkoxycarbonyl group include an alkoxycarbonyl group having 1 to 4 carbon atoms.

The resin (A) may or may not contain a repeating unit having an alicyclic hydrocarbon structure having no polar group and not exhibiting acid decomposability, but in a case where the resin (A) contains the repeating unit, the content of the repeating unit is preferably 1% to 40% by mole, and more preferably 2% to 20% by mole, with respect to all the repeating units in the resin (A).

Specific examples of the repeating unit having an alicyclic hydrocarbon structure having no polar group and not exhibiting acid decomposability include the repeating units disclosed in paragraph 0354 of WO2012/0135348A, but the present invention is not limited thereto.

In addition to the repeating structural units, the resin (A) used in the composition of the present invention can have a variety of repeating structural units for the purpose of adjusting dry etching resistance, suitability for a standard developer, adhesiveness to a substrate, and a resist profile, and in addition, resolving power, heat resistance, sensitivity, and the like, which are characteristics generally required for the resist. Examples of such repeating structural units include, but are not limited to, repeating structural units corresponding to the following monomers.

Thus, it becomes possible to perform fine adjustments to performance required for the resin used in the composition of the present invention, in particular, (1) solubility with respect to a coating solvent, (2) film-forming properties (glass transition point), (3) alkali developability, (4) film reduction (selection of hydrophilic, hydrophobic, or alkali-soluble groups), (5) adhesiveness of an unexposed area to a substrate, (6) dry etching resistance, and the like.

Examples of such a monomer include a compound having one addition-polymerizable unsaturated bond selected from acrylic esters, methacrylic esters, acrylamides, methacrylamides, allyl compounds, vinyl ethers, vinyl esters, and the like.

In addition to these, an addition-polymerizable unsaturated compound that is copolymerizable with the monomers corresponding to various repeating structural units as described above may be copolymerized.

In the resin (A) used in the composition of the present invention, the molar ratio of each repeating structural unit content is appropriately set in order to adjust dry etching resistance, suitability for a standard developer, adhesiveness to a substrate, and a resist profile of the resist, and in addition, resolving power, heat resistance, sensitivity, and the like, each of which is performance generally required for the resist.

The resin (A) in the present invention can be synthesized in accordance with an ordinary method (for example, radical polymerization). Examples of the general synthesis method include a bulk polymerization method in which polymerization is carried out by dissolving monomer species and an initiator in a solvent and heating the solution, a dropwise addition polymerization method in which a solution of monomer species and an initiator is added dropwise to a heating solvent for 1 to 10 hours, with the dropwise addition polymerization method being preferable. Examples of the reaction solvent include ethers such as tetrahydrofuran, 1,4-dioxane, and diisopropyl ether, ketones such as methyl ethyl ketone and methyl isobutyl ketone, ester solvents such as ethyl acetate, amide solvents such as dimethyl formamide and dimethyl acetamide, and a solvent which dissolves the composition of the present invention, such as propylene glycol monomethyl ether acetate, propylene glycol monomethyl ether, and cyclohexanone, which will be described later. It is preferable to perform polymerization using the same solvent as the solvent used in the composition of the present invention. Thus, generation of the particles during storage can be suppressed.

It is preferable that the polymerization reaction is carried out in an inert gas atmosphere such as nitrogen and argon. As the polymerization initiator, commercially available radical initiators (an azo-based initiator, peroxide, or the like) are used to initiate the polymerization. As the radical initiator, an azo-based initiator is preferable, and the azo-based initiator having an ester group, a cyano group, or a carboxyl group is preferable. Preferred examples of the initiator include azobisisobutyronitrile, azobisdimethylvaleronitrile, dimethyl 2,2'-azobis(2-methyl propionate), or the like. The initiator is added in addition or in portionwise, as desired, a desired polymer is recovered after the reaction is completed, the reaction mixture is poured into a solvent, and then a method such as powder and solid recovery is used. The concentration of the reactant is 5% to 50% by mass and preferably 10% to 30% by mass. The reaction temperature is normally 10° C. to 150° C., preferably 30° C. to 120° C., and more preferably 60° C. to 100° C.

The weight-average molecular weight (Mw) of the resin (A) of the present invention is preferably 18,000 or more, and more preferably 20,000 or more. On the other hand, the weight-average molecular weight of the resin (A) is usually 200,000 or less, and preferably 100,000 or less.

By setting the weight-average molecular weight of the resin (A) to the range, the glass transition temperature of the resin (A) is more reliably easily set to 155° C. or higher, and the softening point of resist pattern (an unshared space pattern with a space width of 10 µm, a pitch width of 100 µm, and a thickness of a resist film portion of 7.5 µm) is more reliably set to 130° C. or higher.

The dispersity (molecular weight distribution) is usually 1.0 to 3.0, and the dispersity in the range of preferably 1.0 to 2.6, more preferably 1.0 to 2.0, and particularly preferably 1.1 to 2.0 is used. As the molecular weight distribution is smaller, the resolution and the resist shape are superior, the sidewall of the resist pattern is smoother, and the roughness is superior.

The resin (A) may be used singly or in combination of two or more kinds thereof.

As described above, the glass transition temperature of the resin (A) is 155° C. or higher, preferably 160° C. or higher, more preferably 165° C. or higher, and still more preferably 170° C. or higher.

Furthermore, the glass transition temperature of the resin (A) is preferably 200° C. or lower, more preferably 195° C. or lower, and still more preferably 190° C. or lower.

A method for measuring the glass transition temperature is the same as described above.

The resin (A) is not particularly limited as long as it has a glass transition temperature of 155° C. or higher, and such a resin can be suitably obtained by setting the content the above-mentioned suitable range, the weight-average molecular weight, or the like of the repeating unit (in particular, a repeating unit having a phenolic hydroxyl group) which the resin (A) may have, as described above.

The content of the resin (A) in the entire composition is preferably 50% to 90% by mass, and more preferably 50% to 80% by mass, with respect to the total solid content of the composition.

By setting the content of the resin (A) to the range, the softening point of the resist pattern (an unshared space pattern with a space width of 10 µm, a pitch width of 100 µm, and a thickness of a resist film portion of 7.5 µm) can be more reliably set to 130° C. or higher.

<Compound (B) Having Glass Transition Temperature of 150° C. or Lower>

The composition of the present invention contains a compound (B) having a glass transition temperature of 150° C. or lower.

A preferred embodiment of the compound (B) may be a resin.

Examples of the resin (hereinafter simply also referred as a "resin (B)") as the compound (B) include resins having the repeating units mentioned for the resin (A).

The resin (B) is not particularly limited as long as its glass transition temperature is 150° C. or lower, but the content of the repeating unit having a phenolic hydroxyl group is preferably 53% by mole or less, and more preferably 50% by mole or less, with respect to all the repeating units of the resin (B). Thus, the glass transition temperature of the resin (B) can be suitably set to 150° C. or lower.

In a case where the resin (B) has a repeating unit having a phenolic hydroxyl group, the content of the repeating unit is preferably 10% by mole or more, and more preferably 20% by mole or more, with respect to all the repeating units of the resin (B).

The resin (B) preferably has a repeating unit derived from hydroxystyrene as the repeating unit having a phenolic hydroxyl group.

Furthermore, the weight-average molecular weight of the resin (B) is preferably 1,000 to 18,000, more preferably 3,000 to 17,000, and still more preferably 5,000 to 16,000.

With this content, the glass transition temperature of the resin (B) can be more reliably set to 150° C. or lower, and the softening point of the resist pattern (an unshared space pattern with a space width of 10 µm, a pitch width of 100 µm, and a thickness of a resist film portion of 7.5 µm) can be more reliably set to 170° C. or lower.

A preferred range of the dispersity (molecular weight distribution) of the resin as the compound (B) of the present invention is the same as described for the resin (A).

Another preferred embodiment of the compound (B) may include a polyether-based compound.

The polyether-based compound is a compound having two or more ether bonds. By using the polyether-based compound, it is possible to suitably accomplish the requirement that the glass transition temperature should be 150° C. or lower.

Examples of the polyether-based compound include a compound having a partial structure represented by General Formula (1).

General Formula (1)

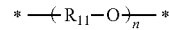

In General Formula (1), $R_{11}$ represents an alkylene group which may have a substituent. The number of carbon atoms of the alkylene group is not particularly limited, but is preferably 1 to 15, more preferably 2 to 8, and still more preferably 2. The substituent is not particularly limited, but is preferably an alkyl group (preferably having 1 to 10 carbon atoms).

In General Formula (1), n represents an integer of 2 or more. Among those, it is preferably an integer of 2 to 20. $R_{11}$'s which are present in plural numbers may be the same as or different from each other. The average value of n's is preferably 2 to 25, more preferably 2 to 10, and still more preferably 4 to 8.

In General Formula (1), * represents a bonding arm.

The compound having the partial structure represented by General Formula (1) is preferably a compound represented by General Formula (1-1) or General Formula (1-2).

General Formula (1-1)

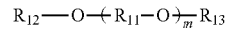

The definition, specific examples, and suitable aspects of $R_{11}$ in General Formula (1-1) are each the same as those of $R_{11}$ in General Formula (1) as described above.

$R_{12}$ and $R_{13}$ in General Formula (1-1) each independently represent a hydrogen atom or an alkyl group. The number of carbon atoms of the alkyl group is not particularly limited, but is preferably 1 to 15.

In General Formula (1-1), m represents an integer of 2 or more. m is preferably an integer of 2 to 20, and among these, it is more preferably 10 or less for a reason that the depth of focus (DOF) increases. $R_{11}$'s which are present in plural numbers may be the same as or different from each other. The average value of m's is preferably 25 or less, more preferably 20 or less, still more preferably 10 or less, particularly preferably 8 or less, and most preferably 6 or less, for a reason that the DOF increases. The lower limit is preferably 2 or more, and more preferably 4 or more. More specifically, the average value of m's is preferably 2 to 25, more preferably 2 to 15, still more preferably 2 to 8, particularly preferably 4 to 8, and most preferably 4 to 6.

General Formula (1-2)

The definition, specific examples, and suitable aspects of $R_{11}$ in General Formula (1-2) are each the same as those of $R_{11}$ in General Formula (1) as described above.

The definition and suitable aspects of m in General Formula (1-2) are each the same as those of m in General Formula (1-1) as described above.

Examples of the compound represented by General Formula (1-2) include a crown ether.

The compound (B) is preferably a polyether-based compound having a group represented by General Formula (a).

Thus, for a resist pattern obtained from a thick resist film (for example, a resist film having a thickness of 1 μm or more), cracks are hardly generated upon observation in a vacuum chamber using a critical SEM. As a result, the performance evaluation of the resist pattern can be more accurately carried out.

The reason why the effect is obtained is not clear, but is presumed to be as follows.

First, by using a polyether-based compound having a group represented by General Formula (a) as the compound (B), the actinic ray-sensitive or radiation-sensitive film is softened. Thus, in the formation of the actinic ray-sensitive or radiation-sensitive film, the solvent in the actinic ray-sensitive or radiation-sensitive resin composition is easily volatilized, and thus, the amount of the solvent remaining in the formed actinic ray-sensitive or radiation-sensitive film is further reduced. Even in a case a resist pattern obtained from the actinic ray-sensitive or radiation-sensitive film having a reduction in the amount of the residual solvent is stored in a vacuum chamber at a time of measurement by means of a critical SEM, the solvent hardly volatilizes from the resist pattern. Accordingly, it is presumed that a change in the strain due to the volatilization of the solvent from the resist pattern hardly occurs in the resist pattern, and thus, cracks are more hardly generated in the resist pattern.

(a)

In General Formula (a), A represents an alkylene group which may have a substituent. A's which are present in plural numbers may be the same as or different from each other. n' represents an integer of 2 or more. * represents a bonding arm.

Specific examples and suitable aspects of A and n' in General Formula (a) are each the same as those described for $R_{11}$ and n in General Formula (1).

The polyether-based compound having a group represented by General Formula (a) may have one or two or more represented by General Formula (a).

The polyether-based compound having a group represented by General Formula (a) is preferably a polyether-based compound represented by General Formula (A).

(A)

In General Formula (A), A and n' are each the same as in General Formula (a).

R represents a hydrogen atom or a hydroxyl group.

R is preferably a hydroxyl group.

The boiling point of the polyether-based compound having a group represented by General Formula (a) is preferably 220° C. or higher, more preferably 300° C. or higher, and still more preferably 350° C. or higher.

The boiling point of the polyether-based compound having a group represented by General Formula (a) is typically 550° C. or lower.

Furthermore, the C log P value of the polyether-based compound having a group represented by General Formula (a) is preferably −2.5 to −0.3, more preferably −2.5 to −0.5, and still more preferably −2.5 to −1.0.

Here, the C log P value is a C log P value of a monomer (compound having an unsaturated double bond group) corresponding to the repeating unit, and is a value calculated by Chem DrawUltra ver. 12.0.2.1076 (Cambridge Corporation).

By making the polyether-based compound having a group represented by General Formula (a) satisfy the preferred range of the boiling point as described above and the preferred range of the C log P value as described above, there is tendency that the above-mentioned effects the cracks are hardly generated are more easily obtained.

In a suitable embodiment of the present invention, the polyether-based compound having a group represented by General Formula (a) is a compound represented by General Formula (A), in which R in General Formula (A) is a hydroxyl group, having a boiling point of 350° C. or higher.

The molecular weight of the polyether-based compound is not particularly limited, but is preferably 100 to 5,000, more preferably 150 to 3,000, and still more preferably 200 to 2,000.

It is preferable that the polyether-based compound does not contain a basic site (for example, an amino group and a proton-accepting functional group which will be described later).

The pKa of the conjugate acid of the polyether-based compound is preferably 0 or less, more preferably −1 or less, still more preferably −2 or less, and particularly preferably −3 or less. The lower limit value of the pKa is, for example, −15 or more. In the present invention, the pKa value is expressed as a value obtained by calculating using ACD/ChemSketch (ACD/Labs 8.00, Release Product Version: 8.08).

It is preferable that the polyether-based compound does not have a functional group having a nitrogen atom having an unshared electron pair that less contributes to π-conjugation. Examples of the nitrogen atom having an unshared electron pair that less contributes to π-conjugation include nitrogen atoms having partial structures represented by the following general formulae. Examples of the structure (compound) having a functional group having the nitrogen atom having an unshared electron pair that less contributes to π-conjugation include a chained amide, a cyclic amide, an aromatic amine, a chained aliphatic amine, and a cyclic aliphatic amine.

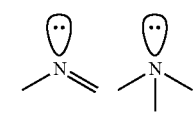

Specific examples of the polyether-based compound include the following compounds, but the present invention is not limited thereto.

The compound (B) may be used singly or in combination of two or more kinds thereof.

As described above, the glass transition temperature of the compound (B) is 150° C. or lower.

In a case where the compound (B) is a resin, its glass transition temperature is preferably 100° C. or higher, more preferably 120° C. or higher, and still more preferably 130° C. or higher.

In a case where the compound (B) is not a resin (polymer), its glass transition temperature is preferably −20° C. or

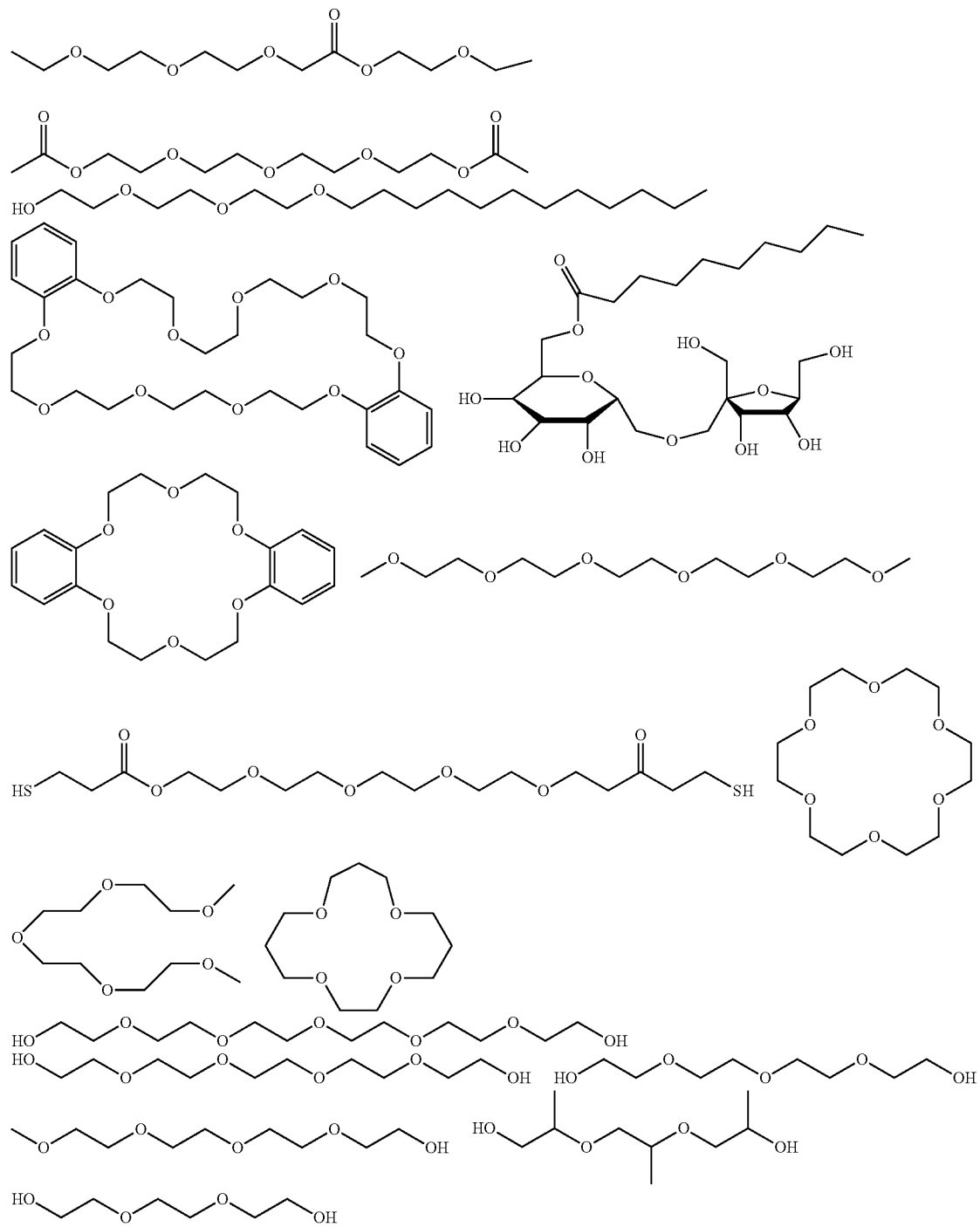

higher, and preferably −15° C. or higher. In this case, the glass transition temperature of the compound (B) is usually 0° C. or lower.

A method for measuring the glass transition temperature is the same as described above.

The glass transition temperature of the compound (B) is not particularly limited as long as it is 150° C. or lower, and in a case where such a compound is a resin, by setting the content, the weight-average molecular weight, and the like of the repeating unit (in particular, a repeating unit having a phenolic hydroxyl group) which may be contained in the resin (B) to the above-mentioned suitable ranges, and appropriately selecting the kind of the compound (for example, by selecting the polyether-based compound as described above) in a case where the compound (B) is not a resin, as described above, the compound can be suitably obtained.

The content of the compound (B) in the composition of the present invention is preferably 1% to 50% by mass, more preferably 5% to 50% by mass, and still more preferably 15% to 50% by mass, with respect to the total solid content of the composition.

By setting the content of the compound (B) to the range, the softening point of the resist pattern (an unshared space pattern with a space width of 10 μm, a pitch width of 100 μm, and a thickness of a resist film portion of 7.5 μm) can be more reliably set to 170° C. or lower.

The resin (A) and the compound (B) are described above, but a difference between the glass transition temperature of the resin (A) and the glass transition temperature of the compound (B) is preferably in the range of 50° C. to 60° C., more preferably in the range of 40° C. to 50° C., and still more preferably in the range of 30° C. to 40° C.

As described above, the present invention relates to an actinic ray-sensitive or radiation-sensitive resin composition, containing the resin (A) having a glass transition temperature of 155° C. or higher, the compound (B) having a glass transition temperature of 150° C. or lower, and the solvent (C), in which a solid content in the actinic ray-sensitive or radiation-sensitive resin composition is 20% by mass or more, and a softening point of a resist pattern formed using the actinic ray-sensitive or radiation-sensitive resin composition is from 130° C. to 170° C. The present invention also relates to an actinic ray-sensitive or radiation-sensitive resin composition containing the resin (A) having a glass transition temperature of 155° C. or higher, the compound (B) having a glass transition temperature of 150° C. or lower, and the solvent (C), each of which makes it possible to suitably accomplish the actinic ray-sensitive or radiation-sensitive resin composition, in which a solid content in the actinic ray-sensitive or radiation-sensitive resin composition is 20% by mass or more, a content of the resin (A) is 50% to 90% by mass with respect to the total solid content in the actinic ray-sensitive or radiation-sensitive resin composition, and a content of the compound (B) is 1% to 50% by mass with respect to the total solid content in the actinic ray-sensitive or radiation-sensitive resin composition.

<Acid Generator (Compound that Generates Acid Upon Irradiation with Actinic Rays or Radiation)>

The composition of the present invention preferably contains an acid generator. The acid generator is not particularly limited as long as it is a compound that generates an acid upon irradiation with actinic rays or radiation (hereinafter also referred to as an "acid generator").

The acid generator is preferably a compound that generates an organic acid upon irradiation with actinic rays or radiation.

The acid generator may be in a form of a low-molecular-weight compound or a form incorporated into a part of a polymer. Further, a combination of the form of a low-molecular-weight compound and the form incorporated into a part of a polymer may also be used.

In a case where the acid generator is in the form of a low-molecular-weight compound, the molecular weight is preferably 3,000 or less, more preferably 2,000 or less, and still more preferably 1,000 or less.

In a case where the acid generator is in the form incorporated into a part of a polymer, it may be incorporated into a part of the resin (A) as described above or into a resin other than the resin (A). Specific examples of a case where the acid generator is in the form incorporated into a part of a polymer include those described in, for example, paragraphs <0191> to <0209> of JP2013-54196A.

The acid generator which is appropriately selected from a photoinitiator for cationic photopolymerization, a photoinitiator for radical photopolymerization, a photodecoloring agent for dyes, a photodiscoloring agent, a known compound capable of generating an acid upon irradiation with actinic rays or radiation, which is used for a microresist or the like, and a mixture thereof, can be used.

Examples of the acid generator include a diazonium salt, a phosphonium salt, a sulfonium salt, an iodonium salt, imidosulfonate, oxime sulfonate, diazodisulfone, disulfone, and o-nitrobenzyl sulfonate.

As the acid generator, an acid generator having a pKa of a generated acid of −2 or more is preferable. Among those, in a view of a smaller deviation of the thickness among the formed patterns, pKa is preferably −1.5 or more, and more preferably −1 or more. Further, the upper limit of pKa is not particularly limited, but is preferably 1 or less.

The pKa (acid strength) is one of indices for quantitatively expressing the strength of an acid, and has the same definition as an acidity constant. The acid strength (pKa) refers to, upon contemplation of a dissociation reaction in which a hydrogen ion is released from an acid, the equilibrium constant Ka of the reaction expressed by the negative common logarithm pKa thereof. As the value of pKa is smaller, the acid is the stronger. In the present invention, pKa is calculated by a calculation using an analysis software package ACD/pKa DB V8.0 manufactured by Advanced Chemistry Development (ACD).

Examples of the preferred compounds among the acid generators include compounds represented by General Formula (ZI), (ZI), and (ZIII).

In General Formula (ZI), $R_{201}$, $R_{202}$, and $R_{203}$ each independently represent an organic group.

The number of carbon atoms of the organic group as $R_{201}$, $R_{202}$, and $R_{203}$ is generally 1 to 30, and preferably 1 to 20.

Furthermore, two of $R_{201}$ to $R_{203}$ may be bonded to each other to form a ring structure, and the ring may include an oxygen atom, a sulfur atom, an ester bond, an amide bond, or a carbonyl group, and examples of the group formed by the bonding of two of $R_{201}$ to $R_{203}$ include an alkylene group (for example, a butylene group and a pentylene group).

$Z^-$ represents a non-nucleophilic anion.

Examples of the non-nucleophilic anion as $Z^-$ include a sulfonate anion, a carboxylate anion, a sulfonylimide anion, a bis(alkylsulfonyl)imide anion, and a tris(alkylsulfonyl)methyl anion.

The non-nucleophilic anion is an anion having a noticeably low ability for causing a nucleophilic reaction, and is an anion which can suppress temporal decomposition caused by an intra-molecular nucleophilic reaction. Thus, the temporal stability of the composition is improved.

Examples of the sulfonate anion include an aliphatic sulfonate anion, an aromatic sulfonate anion, and a camphorsulfonate anion.

Examples of the carboxylate anion include an aliphatic carboxylate anion, an aromatic carboxylate anion, and an aralkyl carboxylate anion.

The aliphatic site in the aliphatic sulfonate anion and the aliphatic carboxylate anion may be either an alkyl group or a cycloalkyl group, but preferred examples thereof include an alkyl group having 1 to 30 carbon atoms and a cycloalkyl group having 3 to 30 carbon atoms. Examples of the aromatic group in the aromatic sulfonate anion and the aromatic carboxylate anion is preferably an aryl group having 6 to 14 carbon atoms, and examples thereof include a phenyl group, a tolyl group, and a naphthyl group.

The alkyl group, the cycloalkyl group, and the aryl group in the aliphatic sulfonate anion and the aromatic sulfonate anion may have a substituent.

Other examples of the non-nucleophilic anions include fluorinated phosphorus (for example, $PF_6^-$), fluorinated boron (for example, $BF_4^-$), and fluorinated antimony (for example, $SbF_6^-$).

The non-nucleophilic anion of $Z^-$ is preferably an aliphatic sulfonate anion substituted with a fluorine atom at least at the α-position of sulfonic acid, an aromatic sulfonate anion substituted with a fluorine atom or a fluorine atom-containing group, a bis(alkylsulfonyl)imide anion in which the alkyl group is substituted with a fluorine atom, or a tris(alkylsulfonyl)methide anion in which the alkyl group is substituted with a fluorine atom. The non-nucleophilic anion is more preferably a perfluoroaliphatic sulfonate anion having 4 to 8 carbon atoms or a benzenesulfonate anion having a fluorine atom, and still more preferably a nonafluorobutanesulfonate anion, a perfluorooctanesulfonate anion, a pentafluorobenzenesulfonate anion, or a 3,5-bis(trifluoromethyl)benzenesulfonate anion.

The non-nucleophilic anion of $Z^-$ is preferably represented by General Formula (2). In this case, the volume of the generated acid is increased, and thus, diffusion of an acid is suppressed.

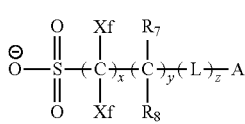

(2)

In General Formula (2),

Xf's each independently represent a fluorine atom or an alkyl group substituted with at least one fluorine atom.

$R_7$ and $R_8$ each independently represent a hydrogen atom, a fluorine atom, an alkyl group, or an alkyl group substituted with at least one fluorine atom, and in a case where $R_7$'s and $R_8$'s are present in plural numbers, they may be the same as or different from each other.

L represents a divalent linking group, and in a case where L's are present in plural numbers, they may be the same as or different from each other.

A represents an organic group including a cyclic structure.

x represents an integer of 1 to 20, y represents an integer of 0 to 10, and z represents an integer of 0 to 10.

The anion of General Formula (2) will be described in more detail.

As described above. Xf is a fluorine atom or an alkyl group substituted with at least one fluorine atom, and the alkyl group in the alkyl group substituted with a fluorine atom is preferably an alkyl group having 1 to 10 carbon atoms, and more preferably an alkyl group having 1 to 4 carbon atoms. Further, the alkyl group substituted with a fluorine atom of Xf is preferably a perfluoroalkyl group.

Xf is preferably a fluorine atom or a perfluoroalkyl group having 1 to 4 carbon atoms. Specific examples of Xf include a fluorine atom, $CF_3$, $C_2F_5$, $C_3F_7$, $C_4F_9$, $C_5F_{11}$, $C_6F_{11}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$, and $CH_2CH_2C_4F_9$, with the fluorine atom and $CF_3$ being preferred. In particular, it is preferable that both Xf's are fluorine atoms.

As described above, $R_7$ and $R_8$ each represent a hydrogen atom, a fluorine atom, an alkyl group, or an alkyl group substituted with at least one fluorine atom. An alkyl group having 1 to 4 carbon atoms is preferable, and a perfluoroalkyl group having 1 to 4 carbon atoms is more preferable. Specific examples of the alkyl group substituted with at least one fluorine atom of $R_7$ and $R_8$ include $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$, and $CH_2CH_2C_4F_9$, and among these, $CF_3$ is preferable.

L represents a divalent linking group, and examples thereof include —COO—, —OCO—, —CO—, —O—, —S—, —SO—, —SO$_2$—, —N(Ri)- (in the formula, Ri represents a hydrogen atom or alkyl), an alkylene group (preferably an alkylene group having 1 to 6 carbon atoms, more preferably an alkylene group having 1 to 4 carbon atoms, particularly preferably a methylene group or an ethylene group, and most preferably a methylene group), a cycloalkylene group (preferably having 3 to 10 carbon atoms), an alkenylene group (preferably having 2 to 6 carbon atoms), and a divalent linking group obtained by combining a plurality of the groups. L is preferably —COO—, —OCO—, —CO—, —SO$_2$—, —CON(Ri)-, —SO$_2$N(Ri)-, —CON(Ri)-alkylene group-, —N(Ri)CO-alkylene group-, —COO-alkylene group-, or —OCO-alkylene group-, and more preferably —SO$_2$—, —COO—, —OCO—, —COO-alkylene group-, or —OCO-alkylene group-. The alkylene group in —CON(Ri)-alkylene group-, —N(Ri)CO-alkylene group-, —COO-alkylene group-, and —OCO— alkylene group—is preferably an alkylene group having 1 to 20 carbon atoms, and more preferably an alkylene group having 1 to 10 carbon atoms. In a case where L's are present in plural numbers, they may be the same as or different from each other.

Specific examples of the alkyl group for Ri, and preferred examples thereof include the same ones as the specific examples and the preferred examples mentioned above as each of $R_1$ to $R_4$ in General Formula (1).

The organic group including the cyclic structure of A is not particularly limited as long as it has a cyclic structure, and examples of the organic group include an alicyclic group, an aryl group, a heterocyclic group (including the group having aromaticity or not having aromaticity, and including, for example, a tetrahydropyran ring, a lactone ring structure, and a sultone ring structure).

The alicyclic group may be monocyclic or polycyclic, and is preferably a monocyclic cycloalkyl group such as a cyclopentyl group, a cyclohexyl group, and a cyclooctyl group, or polycyclic cycloalkyl group such as a norbornyl group, a norbornenyl group, a tricyclodecanyl group (for example, a tricyclo[5.2.1.0$^{2,6}$]decanyl group), a tetracyclodecanyl group, a tetracyclododecanyl group, and an adamantyl group, with the adamantyl group being particularly preferable. Further, a nitrogen atom-containing alicyclic group such as a piperidine group, a decahydroquinoline group, and a decahydroisoquinoline group is also preferable. Among those, an alicyclic group with a bulky structure having 7 or more carbon atoms, such as a norbornyl group, a tricyclodecanyl group, a tetracyclodecanyl group, a tetracyclododecanyl group, an adamantyl group, a decahydroquinoline group, and a decahydroisoquinoline is preferable in a view that the diffusivity into a film in the post-exposure baking (PEB) step can be suppressed. Among those, an adamantyl group and a decahydroisoquinoline group are particularly preferable.

Examples of the aryl group include a benzene ring, a naphthalene ring, a phenanthrene ring, and an anthracene ring. Among those, naphthalene with low absorbance is preferable from the viewpoint of light absorbance at 193 nm.

Examples of the heterocyclic group include a furan ring, a thiophene ring, a benzofuran ring, a benzothiophene ring, a dibenzofuran ring, a dibenzothiophene ring, and a pyridine ring. Among those, a furan ring, a thiophene ring, and a pyridine ring are preferable. Other preferred examples of the heterocyclic group include structures shown below (in the formula, X represents a methylene group or an oxygen atom, and R represents a monovalent organic group).

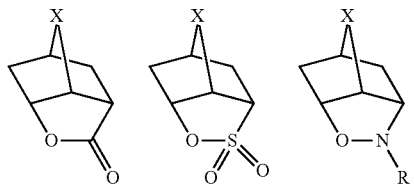

The cyclic organic group may have a substituent, and examples of the substituent include an alkyl group (may be linear, branched, or cyclic; preferably having 1 to 12 carbon atoms), an aryl group (preferably having 6 to 14 carbon atoms), a hydroxyl group, an alkoxy group, an ester group, an amido group, a urethane group, a ureido group, a thioether group, a sulfonamido group, and a sulfonic acid ester group.

Incidentally, the carbon constituting the cyclic organic group (the carbon contributing to ring formation) may be a carbonyl carbon.

x is preferably 1 to 8, more preferably 1 to 4, and particularly preferably 1. y is preferably 0 to 4, more preferably 0 or 1, and still more preferably 1. z is preferably 0 to 8, more preferably 0 to 4, and still more preferably 1.

In the anion in General Formula (2), as a combination of partial structures other than A, $SO_3^-$—$CF_2$—$CH_2$—$OCO$—, $SO_3^-$—$CF_2$—$CHF$—$CH_2$—$OCO$—, $SO_3^-$—$CF_2$—$COO$—, $SO_3^-$—$CF_2$—$CF_2$—$CH_2$—, or $SO_3^-$—$CF_2$—$CH(CF_3)$—$OCO$— is preferable.

Furthermore, in another embodiment of the present invention, the non-nucleophilic anion of $Z^-$ may be a disulfonylimide acid anion.

As the disulfonylimide acid anion, a bis(alkylsulfonyl)imide anion is preferable.

The alkyl group in the bis(alkylsulfonyl)imide anion is preferably an alkyl group having 1 to 5 carbon atoms.

Two alkyl groups in the bis(alkylsulfonyl)imide anion may be linked to each other to form an alkylene group (preferably having 2 to 4 carbon atoms), and the alkylene group may be bonded to an imido group and two sulfonyl groups to form a ring. As the ring structure formed by the bis(alkylsulfonyl)imide anion, a 5- to 7-membered ring is preferable, and a 6-membered ring is more preferable.

Examples of a substituent which may be contained in these alkyl groups and an alkylene group formed by linking two alkyl groups include a halogen atom, an alkyl group substituted with a halogen atom, an alkoxy group, an alkylthio group, an alkyloxysulfonyl group, an aryloxysulfonyl group, and a cycloalkylaryloxysulfonyl group, and a fluorine atom and an alkyl group substituted with a fluorine atom are preferable.

The non-nucleophilic anion of $Z^-$ preferably has a fluorine content represented by (a total mass of all the fluorine atoms contained in the anion)/(a total mass of all the atoms contained in the anion) of 0.25 or less, more preferably has the fluorine content of 0.20 or less, and still more preferably has the fluorine content of 0.15 or less.

Examples of the organic group represented by $R_{201}$, $R_{202}$, and $R_{203}$ include corresponding groups in the compounds (ZI-1), (ZI-2), (ZI-3), and (ZI-4) which will be described later.

Incidentally, the compound may be a compound having a plurality of structures represented by General Formula (ZI). For example, the compound may be a compound having a structure in which at least one of $R_{201}$, . . . , or $R_{203}$ in a compound represented by General Formula (ZI) is bonded to at least one of $R_{201}$, . . . , or $R_{203}$ in another compound represented by General Formula (ZI) through a single bond or a linking group.

More preferred examples of the components (ZI) include the compounds (ZI-1), (ZI-2), (ZI-3), and (ZI-4) which will be described below.

First, the compound (ZI-1) will be described.

The compound (ZI-1) is an arylsulfonium compound in which at least one of $R_{201}$, . . . , or $R_{203}$ in General Formula (ZI) is an aryl group, that is, a compound having arylsulfonium as the cation.

In the arylsulfonium compound, all of $R_{201}$ to $R_{203}$ may be an aryl group, or a part of $R_{201}$ to $R_{203}$ may be an aryl group, with the remainder being an alkyl group or a cycloalkyl group.

Examples of the arylsulfonium compound include a triarylsulfonium compound, a diarylalkylsulfonium compound, an aryldialkylsulfonium compound, a diarylcycloalkylsulfonium compound, and an aryldicycloalkylsulfonium compound.

The aryl group in the arylsulfonium compound is preferably a phenyl group or a naphthyl group, and more preferably a phenyl group. The aryl group may be an aryl group having a heterocyclic structure containing an oxygen atom, a nitrogen atom, a sulfur atom, or the like. Examples of the heterocyclic structure include a pyrrole residue, a furan residue, a thiophene residue, an indole residue, a benzofuran residue, and a benzothiophene residue. In a case where the arylsulfonium compound has two or more aryl groups, these two or more aryl groups may be the same as or different from each other.

The alkyl group or the cycloalkyl group which may be contained, if desired, in the arylsulfonium compound, is preferably a linear or branched alkyl group having 1 to 15 carbon atoms or a cycloalkyl group having 3 to 15 carbon atoms, and examples thereof include a methyl group, an ethyl group, a propyl group, an n-butyl group, a sec-butyl group, a t-butyl group, a cyclopropyl group, a cyclobutyl group, and a cyclohexyl group.

The aryl group, the alkyl group, and the cycloalkyl group of $R_{201}$ to $R_{203}$ may have, as the substituent, an alkyl group (for example, an alkyl group having 1 to 15 carbon atoms), a cycloalkyl group (for example, a cycloalkyl group having 3 to 15 carbon atoms), an aryl group (for example, an aryl group having 6 to 14 carbon atoms), an alkoxy group (for example, an alkoxy group having 1 to 15 carbon atoms), a halogen atom, a hydroxyl group, or a phenylthio group.

Next, the compound (ZI-2) will be described.

The compound (ZI-2) is a compound in which $R_{201}$ to $R_{203}$ in Formula (ZI) each independently represent an organic group not having an aromatic ring. The aromatic ring as used herein encompasses an aromatic ring containing a heteroatom.

The organic group not having an aromatic ring as each of $R_{201}$ to $R_{203}$ has generally 1 to 30 carbon atoms, and preferably 1 to 20 carbon atoms.

$R_{201}$ to $R_{203}$ are each independently preferably an alkyl group, a cycloalkyl group, an allyl group, or a vinyl group, more preferably a linear or branched 2-oxoalkyl group, a 2-oxocycloalkyl group, or an alkoxycarbonylmethyl group, and still more preferably a linear or branched 2-oxoalkyl group.

As the alkyl group and the cycloalkyl group of each of $R_{201}$ to $R_{203}$, a linear or branched alkyl group having 1 to 10 carbon atoms (for example, a methyl group, an ethyl group, a propyl group, a butyl group, and a pentyl group), or a cycloalkyl group having 3 to 10 carbon atoms (a cyclopentyl group, a cyclohexyl group, and a norbornyl group) is preferable.

$R_{201}$ to $R_{203}$ may further be substituted with a halogen atom, an alkoxy group (for example, an alkoxy group having 1 to 5 carbon atoms), a hydroxyl group, a cyano group, and a nitro group.

Next, the compound (ZI-3) will be described.

The compound (ZI-3) is a compound represented by General Formula (ZI-3), which has a phenacylsulfonium salt structure.

group, an aryloxy group, an alkoxycarbonyl group, an alkylcarbonyloxy group, a cycloalkylcarbonyloxy group, a halogen atom, a hydroxyl group, a nitro group, an alkylthio group, or an arylthio group, $R_{6c}$ and $R_{7c}$ each independently represent a hydrogen atom, an alkyl group, a cycloalkyl group, a halogen atom, a cyano group, or an aryl group, and $R_x$ and $R_y$ each independently represent an alkyl group, a cycloalkyl group, a 2-oxoalkyl group, a 2-oxocycloalkyl group, an alkoxycarbonylalkyl group, an allyl group, or a vinyl group. Any two or more of $R_{1c}$ to $R_{5c}$, $R_{5c}$ and $R_{6c}$, $R_{6c}$ and $R_{7c}$, $R_{5c}$ and $R_x$, or $R_x$ and $R_y$ may be respectively bonded to each other to form a ring structure, and this ring structure may contain an oxygen atom, a sulfur atom, a ketone group, an ester bond, or an amide bond.

Examples of the ring structure include an aromatic or non-aromatic hydrocarbon ring, an aromatic or non-aromatic heterocyclic ring, and a polycyclic fused ring formed by combination of two or more of these rings. Examples of the ring structure include 3- to 10-membered rings, with 4- to 8-membered rings being preferable, and 5- or 6-membered rings being more preferable.

Examples of the group formed by the mutual bonding of any two or more of $R_{1c}$ to $R_{5c}$, $R_{6c}$ and $R_{7c}$, or $R_x$ and $R_y$ include a butylene group, and a pentylene group.

The group formed by the mutual bonding of $R_{5c}$ and $R_{6c}$, or $R_{5c}$ and $R_x$ is preferably a single bond or an alkylene group, and examples of the alkylene group include a methylene group and an ethylene group.

$Zc^-$ represents a non-nucleophilic anion, and examples thereof include the same ones as the non-nucleophilic anions of $Z^-$ in General Formula (ZI).

Specific examples of the alkoxy group in the alkoxycarbonyl group as each of $R_{1c}$ to $R_{5c}$ are the same as the specific examples of the alkoxy group as each of $R_{1c}$ to $R_{5c}$.

Specific examples of the alkyl group in the alkylcarbonyloxy group and the alkylthio group as each of $R_{1c}$ to $R_{5c}$ are the same as the specific examples of the alkyl group as each of $R_{1c}$ to $R_{5c}$.

Specific examples of the cycloalkyl group in the cycloalkylcarbonyloxy group as each of $R_{1c}$ to $R_{5c}$ are the same as the specific examples of the cycloalkyl group as each of $R_{1c}$ to $R_{5c}$.

Specific examples of the aryl group in the aryloxy group and the arylthio group as each of $R_{1c}$ to $R_{5c}$ are the same as the specific examples of the aryl group as each of $R_{1c}$ to $R_{5c}$.

Examples of the cation in the compound (ZI-2) or (ZI-3) in the present invention include the cations described after paragraph <0036> of US2012/0076996A.

Next, the compound (ZI-4) will be described.

The compound (ZI-4) is represented by General Formula (ZI-4).

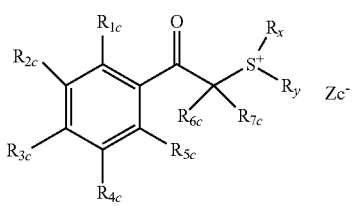

(ZI-3)

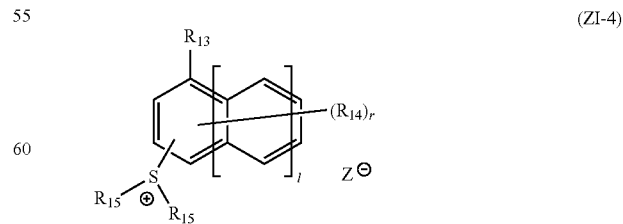

(ZI-4)

In General Formula (ZI-3), $R_{1c}$ to $R_{5c}$ each independently represent a hydrogen atom, an alkyl group, a cycloalkyl group, an aryl group, an alkoxy In General Formula (ZI-4), $R_{13}$ represents a hydrogen atom, a fluorine atom, a hydroxyl group, an alkyl group, a cycloalkyl group, an alkoxy group, an alkoxycarbonyl group, or a group having a cycloalkyl group, and these groups may have a substituent.

In a case where $R_{14}$'s are present in plural numbers, they each independently represent a hydroxyl group, an alkyl group, a cycloalkyl group, an alkoxy group, an alkoxycarbonyl group, an alkylcarbonyl group, an alkylsulfonyl group, a cycloalkylsulfonyl group, or a group having a cycloalkyl group, and these groups may have a substituent, $R_{15}$'s each independently represent an alkyl group, a cycloalkyl group, or a naphthyl group, these groups may have a substituent, two $R_{15}$'s may be bonded to each other to form a ring, and in a case where two $R_{15}$'s are bonded to each other to form a ring, the ring skeleton may contain a heteroatom such as an oxygen atom and a nitrogen atom; and in an aspect, two $R_{15}$'s are alkylene groups, and are preferably bonded to each other to form a ring structure, l represents an integer of 0 to 2, r represents an integer of 0 to 8, and $Z^-$ represents a non-nucleophilic anion, and examples thereof include the same non-nucleophilic anions as $Z^-$ in General Formula (ZI).

In General Formula (ZI-4), the alkyl group of each of $R_{13}$, $R_{14}$, and $R_{15}$ is linear or branched, and preferably has 1 to 10 carbon atoms, and preferred examples thereof include a methyl group, an ethyl group, an n-butyl group, and a t-butyl group.

Examples of the cation of the compound represented by General Formula (ZI-4) in the present invention include the cations described in paragraphs <0121>, <0123>, and <0124> of JP2010-256842A, paragraphs <0127>, <0129>, and <0130> of JP2011-76056A, and the like.

Next, General Formulae (ZII) and (ZIII) will be described.

In General Formulae (ZII) and (ZIII), $R_{204}$ to $R_{207}$ each independently represent an aryl group, an alkyl group, or a cycloalkyl group.

The aryl group of $R_{204}$ to $R_{207}$ is preferably a phenyl group or a naphthyl group, and more preferably a phenyl group. The aryl group of $R_{204}$ to $R_{207}$ may be an aryl group having a heterocyclic structure containing an oxygen atom, a nitrogen atom, a sulfur atom, or the like. Examples of the skeleton of the aryl group having a heterocyclic structure include pyrrole, furan, thiophene, indole, benzofuran, and benzothiophene.

Preferred examples of the alkyl group and the cycloalkyl group with respect to $R_{204}$ to $R_{207}$ include a linear or branched alkyl group having 1 to 10 carbon atoms (for example, a methyl group, an ethyl group, a propyl group, a butyl group, and a pentyl group) and a cycloalkyl group having 3 to 10 carbon atoms (for example, a cyclopentyl group, a cyclohexyl group, and a norbornyl group).

The aryl group, the alkyl group, and the cycloalkyl group of $R_{204}$ to $R_{207}$ may have a substituent, and examples of the substituent which may be contained in the aryl group, the alkyl group, and the cycloalkyl group of each of $R_{204}$ to $R_{207}$ include an alkyl group (for example, an alkyl group having 1 to 15 carbon atoms), a cycloalkyl group (for example, a cycloalkyl group having 3 to 15 carbon atoms), an aryl group (for example, an aryl group having 6 to 15 carbon atoms), an alkoxy group (for example, an alkoxy group having 1 to 15 carbon atoms), a halogen atom, a hydroxyl group, and a phenylthio group.

$Z^-$ represents a non-nucleophilic anion, and examples thereof include the same ones as the non-nucleophilic anions of $Z^-$ in General Formula (ZI).

Other examples of the acid generator include compounds represented by General Formulae (ZIV), (ZV), and (ZVI).

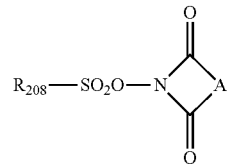

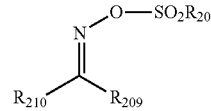

In General Formulae (ZIV) to (ZVI), $Ar_3$ and $Ar_4$ each independently represent an aryl group.

$R_{208}$, $R_{209}$, and $R_{210}$ each independently represent an alkyl group, a cycloalkyl group, or an aryl group.

A represents an alkylene group, an alkenylene group, or an arylene group.

Specific examples of the aryl group of each of $Ar_3$, $Ar_4$, $R_{208}$, $R_{209}$, and $R_{210}$ include the same ones as the specific examples of the aryl group of each of $R_{201}$, $R_{202}$, and $R_{203}$ in the compound (ZI-1).

Specific examples of the alkyl group and the cycloalkyl group of $R_{208}$, $R_{209}$, and $R_{210}$ include the same ones as the specific examples of the alkyl group and the cycloalkyl group of each of $R_{201}$, $R_{202}$, and $R_{203}$ in the compound (ZI-2).

Examples of the alkylene group of A include an alkylene group having 1 to 12 carbon atoms (for example, a methylene group, an ethylene group, a propylene group, an isopropylene group, a butylene group, and an isobutylene group); examples of the alkenylene group of A include an alkenylene group having 2 to 12 carbon atoms (for example, an ethenylene group, a propenylene group, and a butenylene group); and examples of the arylene group of A include an arylene group having 6 to 10 carbon atoms (for example, a phenylene group, a tolylene group, and a naphthylene group).

Furthermore, another aspect of the acid generator may include a compound capable of generating an acid represented by General Formula (III) or (IV) upon irradiation with actinic rays or radiation.

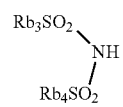

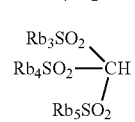

In General Formulae (III) and (IV), $Rb_3$ to $Rb_5$ each independently represent an alkyl group, a cycloalkyl group, or an aryl group. $Rb_3$ and $Rb_4$ may be bonded to each other to form a ring structure.

In General Formulae (III) and (IV), $Rb_3$ to $Rb_5$ are each more preferably an alkyl group substituted with a fluorine atom or a fluoroalkyl group at the first position, or an aryl group (preferably a phenyl group) substituted with a fluorine atom or a fluoroalkyl group. In a case where the fluorine atom or the fluoroalkyl group is contained, the acidity of an acid generated upon irradiation with light is increased, and thus, the sensitivity is improved. In a case where $Rb_3$ to $Rb_5$ each have 5 or more carbon atoms, it is preferable that all of the hydrogen atoms of at least one carbon atom is not substituted with fluorine atoms, and it is more preferable that the number of hydrogen atoms is larger than that of fluorine atoms. In a case where a perfluoroalkyl group having 5 or more carbon atoms is not contained, the toxicity to ecology is reduced.

$Rb_3$ to $Rb_5$ are each preferably a perfluoroalkyl group having 1 to 4 carbon atoms, and more preferably a perfluoroalkyl group having 1 to 3 carbon atoms.

Examples of a group formed by the bonding of $Rb_3$ and $Rb_4$ include an alkylene group and an arylene group.

The group formed by the bonding of $Rb_3$ and $Rb_4$ is preferably a perfluoroalkylene group having 2 to 4 carbon atoms, and more preferably a perfluoropropylene group. In a case where $Rb_3$ and $Rb_4$ are bonded to form a ring structure, the acidity is improved and the sensitivity of the composition is also improved, as compared with a case of not forming the ring structure.

Particularly preferred aspects of $Rb_3$ to $Rb_5$ include a group represented by the following general formula.

$$Rc_7\text{-}Ax\text{-}Rc_6\text{-}$$

In the general formula, $Rc_6$ represents a perfluoroalkylene group, and is more preferably a perfluoroalkylene group having 2 to 4 carbon atoms.

Ax represents a single bond or a divalent linking group (preferably —O—, —$CO_2$—, —S—, —$SO_3$—, or —$SO_2N(Rd_1)$—). $Rd_1$ represents a hydrogen atom or an alkyl group, or may be bonded to $Rc_7$ to form a ring structure.

$Rc_7$ represents a hydrogen atom, a fluorine atom, an alkyl group, a cycloalkyl group, or an aryl group. It is preferable that the alkyl group, the cycloalkyl group, or the aryl group as $Rc_7$ does not have a fluorine atom as the substituent.

Specific examples of the acid represented by General Formula (III) are set forth below, but the present invention is not limited thereto.

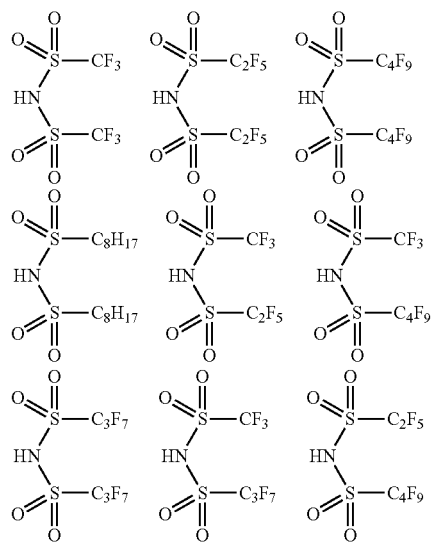

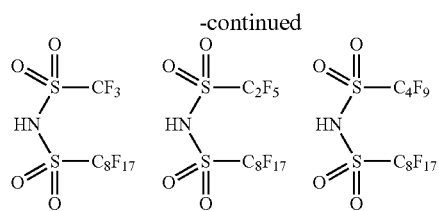

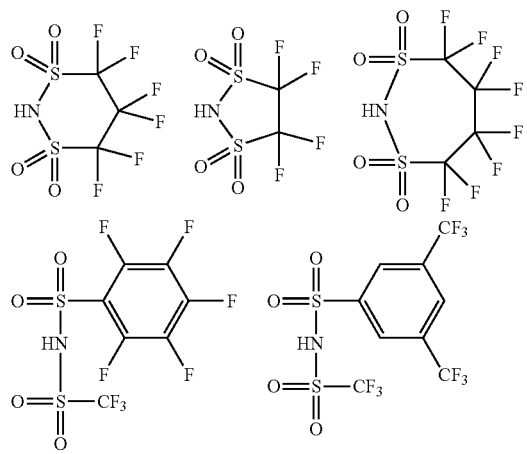

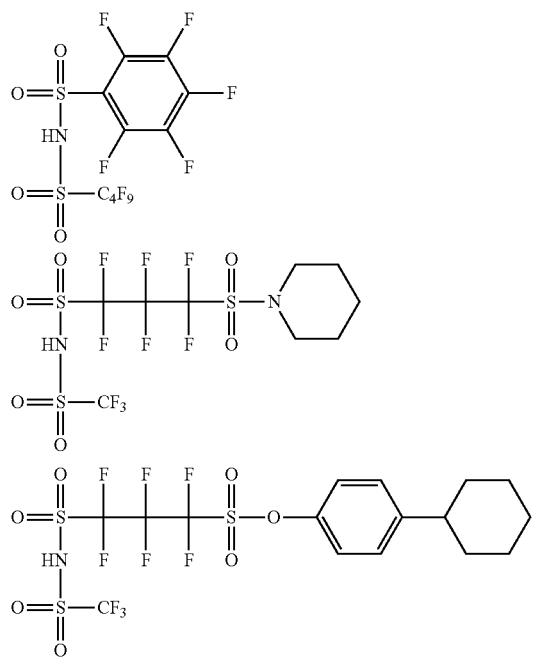

Specific examples of the acid represented by General Formula (IV) are set forth below, but the present invention is not limited thereto.

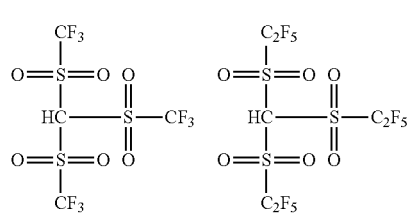

-continued

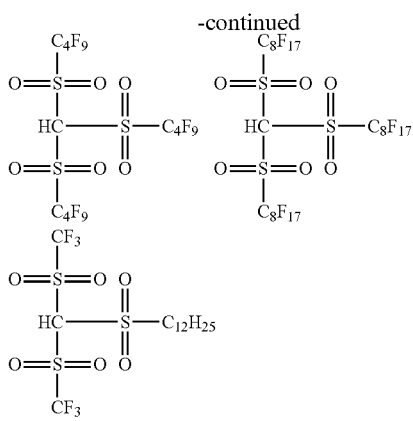

Examples of the compound which generates an acid represented by General Formula (III) or (IV) upon irradiation with actinic rays or radiation include a diazonium salt, a phosphonium salt, a sulfonium salt, an iodonium salt, imidosulfonate, oxime sulfonate, and o-nitrobenzyl sulfonate.

In addition, compounds obtained by introducing into the polymer main chain or side chain thereof, these groups or compounds which generates an acid represented by General Formula (III) or (IV) upon irradiation with actinic rays or radiation, for example, the compounds described in U.S. Pat. No. 3,849,137A, DE3914407B, JP1988-26653A (JP-S63-26653A), JP1980-164824A (JP-S55-164824A), JP1987-69263A (JP-S62-69263A), JP1988-146038A (JP-S63-146038A), JP1988-163452A (JP-S63-163452A), JP1987-153853A (JP-S62-153853A), JP1988-146029A (JP-S63-146029A), and the like can be used.

Furthermore, the compounds capable of generating an acid by light, which are described in U.S. Pat. No. 3,779,778A, EP126712B, and the like can also be used.

Examples of preferred compounds among the compounds capable of generating an acid represented by General Formula (III) or (IV) upon irradiation with actinic rays or radiation include a compound represented by General Formula (ZIa) or (ZIIa).

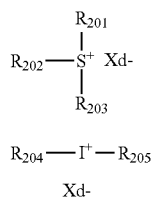

In General Formula (ZIa), $R_{201}$, $R_{202}$, and $R_{203}$ each independently represent an organic group.

$Xd^-$ represents an anion of the acid represented by General Formula (III) or (IV).

Specific examples of the organic group as $R_{201}$, $R_{202}$, and $R_{203}$ in General Formula (ZIa) include groups corresponding to compounds (ZI-1a), (ZI-2a), and (ZI-3a) which will be described later.

Two of $R_{201}$ to $R_{203}$ may be bonded to each other to form a ring structure, and may include an oxygen atom, a sulfur atom, an ester bond, an amide bond, or a carbonyl group within the ring. Examples of the ring formed by the mutual bonding of two of $R_{201}$ to $R_{203}$ include alkylene groups (for example, a butylene group and a pentylene group).

Furthermore, the organic group may also be a compound having a plurality of structures represented by General Formula (ZIa). For example, the organic group may be a compound having a structure in which at least one of $R_{201}$, ..., or $R_{203}$ of a compound represented by General Formula (ZIa) is bonded to at least one of $R_{201}$, ..., or $R_{203}$ of another compound represented by General Formula (ZIa).

More preferred examples of the component (ZIa) include compounds (ZI-1a), (ZI-2a) and (ZI-3a) described below.

The compound (ZI-1a) is an arylsulfonium compound having an aryl group as at least one of $R_{201}$, ..., or $R_{203}$ in General Formula (ZIa), that is, a compound having an arylsulfonium as a cation.

In the arylsulfonium compound, all of $R_{201}$ to $R_{203}$ may be an aryl group or some of $R_{201}$ to $R_{203}$ may be an aryl group with the remaining being an alkyl group or a cycloalkyl group.

Examples of the arylsulfonium compound include a triarylsulfonium compound, a diarylalkylsulfonium compound, an aryldialkylsulfonium compound, a diarylcycloalkylsulfonium compound, and an aryldicycloalkylsulfonium compound.

The aryl group of the arylsulfonium compound is preferably an aryl group such as a phenyl group and a naphthyl group, or a heteroaryl group such as an indole residue and a pyrrole residue, and more preferably a phenyl group or an indole residue. In a case where the arylsulfonium compound has two or more aryl groups, these two or more aryl groups may be the same as or different from each other.

The alkyl group which is contained in the arylsulfonium compound, as necessary, is preferably a linear or branched alkyl group having 1 to 15 carbon atoms, and examples thereof include a methyl group, an ethyl group, a propyl group, an n-butyl group, a sec-butyl group, and a t-butyl group.

The cycloalkyl group which is contained in the arylsulfonium compound, as necessary, is preferably a cycloalkyl group having 3 to 15 carbon atoms, and examples thereof include a cyclopropyl group, a cyclobutyl group, and a cyclohexyl group.

The aryl group, the alkyl group, and the cycloalkyl group of each of $R_{201}$ to $R_{203}$ may have an alkyl group (for example, an alkyl group having 1 to 15 carbon atoms), a cycloalkyl group (for example, a cycloalkyl group having 3 to 15 carbon atoms), an aryl group (for example, an aryl group having 6 to 14 carbon atoms), an alkoxy group (for example, an alkoxy group having 1 to 15 carbon atoms), a halogen atom, a hydroxyl group, or a phenylthio group as a substituent. Preferred examples of the substituent include a linear, branched alkyl group having 1 to 12 carbon atoms, a cycloalkyl group having 3 to 12 carbon atoms, and a linear, branched, or cyclic alkoxy group having 1 to 12 carbon atoms, and more preferably an alkyl group having 1 to 4 carbon atoms and an alkoxy group having 1 to 4 carbon atoms. The substituent may be substituted to any one of three $R_{201}$ to $R_{203}$ or may be substituted to three all of them. Further, in a case where $R_{201}$ to $R_{203}$ are each an aryl group, the substituent is preferably substituted at the p-position of the aryl group.

As the arylsulfonium cation, a triphenylsulfonium cation which may be substituted, a naphthyltetrahydrothiophenium cation which may be substituted, or a phenyltetrahydrothiophenium cation which may be substituted is preferable.

The compound (ZI-2a) will be described next.

The compound (ZI-2a) is a compound of General Formula (ZIa) in which $R_{201}$ to $R_{203}$ each independently represent an organic group containing no aromatic ring. Here, the aromatic ring also encompasses an aromatic ring containing a heteroatom.

The organic group, as each of $R_{201}$ to $R_{203}$, containing no aromatic ring has generally 1 to 30 carbon atoms, and preferably 1 to 20 carbon atoms.

$R_{201}$ to $R_{203}$ each independently preferably represent an alkyl group, a cycloalkyl group, an allyl group, or a vinyl group, more preferably a linear, branched, or cyclic 2-oxoalkyl group, or an alkoxycarbonylmethyl group, and still more preferably a linear or branched 2-oxoalkyl group.

The alkyl group as each of $R_{201}$ to $R_{203}$ may be linear, branched, or cyclic, and preferred examples thereof include a linear or branched alkyl group having 1 to 10 carbon atoms (such as a methyl group, an ethyl group, a propyl group, a butyl group, and a pentyl group). The alkyl group as each of $R_{201}$ to $R_{203}$ is preferably a linear or branched 2-oxoalkyl group, or an alkoxycarbonylmethyl group.

The cycloalkyl group as each of $R_{201}$ to $R_{203}$ is preferably a cycloalkyl group having 3 to 10 carbon atoms (a cyclopentyl group, a cyclohexyl group, or a norbornyl group). The cycloalkyl group as each of $R_{201}$ to $R_{203}$ is more preferably a cyclic 2-oxoalkyl group.

Preferred examples of the linear, branched, or cyclic 2-oxoalkyl group in each of $R_{201}$ to $R_{203}$ include a group having >C=O at the 2-position of the alkyl group or the cycloalkyl group.

Preferred examples of the alkoxy group in the alkoxycarbonylmethyl group as each of $R_{201}$ to $R_{203}$ include an alkoxy group having 1 to 5 carbon atoms (such as a methoxy group, an ethoxy group, a propoxy group, a butoxy group, and a pentoxy group).

$R_{201}$ to $R_{203}$ may further be substituted with a halogen atom, an alkoxy group (for example, an alkoxy group having 1 to 5 carbon atoms), a hydroxyl group, a cyano group, or a nitro group.

The compound (ZI-3a) is a compound represented by General Formula (ZI-3a), which has a phenacylsulfonium salt structure.

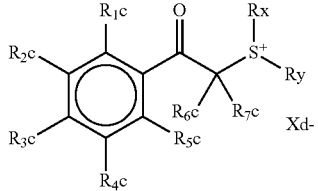

(ZI-3a)

In General Formula (ZI-3a), $R_1c$ to $R_5c$ each independently represent a hydrogen atom, an alkyl group, a cycloalkyl group, an alkoxy group, or a halogen atom.

$R_6c$ and $R_7c$ each independently represent a hydrogen atom, an alkyl group, or a cycloalkyl group.

Rx and Ry each independently represent an alkyl group, a cycloalkyl group, an allyl group, or a vinyl group.

Any two or more of $R_1c$ to $R_5c$, or Rx and Ry may be bonded to each other to form a ring structure, and the ring structure may include an oxygen atom, a sulfur atom, an ester bond, or an amide bond. Examples of the group formed by the mutual bonding of any two or more of $R_1c$ to $R_5c$, or Rx and Ry include a butylene group and a pentylene group.

$Xd^-$ represents an anion of an acid represented by General Formula (III) or (IV), and is the same as $Xd^-$ in General Formula (ZIa).

The alkyl group as each of $R_1c$ to $R_7c$ may be linear or branched, and examples thereof include an alkyl group having 1 to 20 carbon atoms, and preferably a linear or branched alkyl group having 1 to 12 carbon atoms (such as a methyl group, an ethyl group, a linear or branched propyl group, a linear or branched butyl group, and a linear or branched pentyl group).

Examples of the cycloalkyl group as each of $R_1c$ to $R_7c$ include a cycloalkyl group having 3 to 20 carbon atoms, preferably cycloalkyl group having 3 to 8 carbon atoms (for example, a cyclopentyl group and a cyclohexyl group).

The alkoxy group as each of $R_1c$ to $R_5c$ may be linear, branched, or cyclic, and examples thereof include an alkoxy group having 1 to 10 carbon atoms, and preferably a linear or branched alkoxy group having 1 to 5 carbon atoms (such as a methoxy group, an ethoxy group, a linear or branched propoxy group, a linear or branched butoxy group, and a linear or branched pentoxy group), and a cyclic alkoxy group having 3 to 8 carbon atoms (such as a cyclopentyloxy group and a cyclohexyloxy group).

Preferably, any one of $R_1c$ to $R_5c$ is a linear or branched alkyl group, a cycloalkyl group, or a linear, branched, or cyclic alkoxy group. More preferably, the sum of carbon atoms of $R_1c$ to $R_5c$ is 2 to 15. Thus, the solubility in a solvent is improved, and generation of particles during storage is suppressed.

Examples of the alkyl group as each of $R_x$ and $R_y$ include the same ones as the alkyl group as each of $R_1c$ to $R_7c$. The alkyl group as each of $R_x$ and $R_y$ is more preferably a linear or branched 2-oxoalkyl group, or an alkoxycarbonylmethyl group.

Examples of the cycloalkyl group as each of $R_x$ and $R_y$ include the same ones as the cycloalkyl group as each of $R_1c$ to $R_7c$. The cycloalkyl group as each of $R_x$ and $R_y$ is more preferably a cyclic 2-oxoalkyl group.

Examples of the linear, branched, or cyclic 2-oxoalkyl group include the alkyl group as each of $R_1c$ to $R_7c$, and a group having >C=O at the 2-position of a cycloalkyl group.

Examples of the alkoxy group of the alkoxycarbonylmethyl group are similar to those of the alkoxy group as each of $R_1c$ to $R_5c$.

Rx and Ry are each preferably an alkyl group having 4 or more carbon atoms, more preferably an alkyl group having 6 or more carbon atoms, and still more preferably an alkyl group having 8 or more carbon atoms.

In General Formula (ZIIa), $R_{204}$ to $R_{205}$ each independently represent an aryl group, an alkyl group, or a cycloalkyl group.

The aryl group as each of $R_{204}$ to $R_{205}$ is preferably a phenyl group or a naphthyl group, and more preferably a phenyl group.

The alkyl group as each of $R_{204}$ to $R_{205}$ is preferably linear or branched, and preferred examples thereof include a linear or branched alkyl group having 1 to 10 carbon atoms (for example, a methyl group, an ethyl group, a propyl group, a butyl group, and a pentyl group).

Preferred examples of the cycloalkyl group as each of $R_{204}$ to $R_{205}$ include a cycloalkyl group having 3 to 10 carbon atoms (a cyclopentyl group, a cyclohexyl group, and a norbornyl group).

Examples of the substituent which may be contained in each of $R_{204}$ to $R_{207}$ include an alkyl group (for example, an alkyl group having 1 to 15 carbon atoms), a cycloalkyl group (for example, a cycloalkyl group having 3 to 15 carbon atoms), an aryl group (for example, an aryl group having 6 to 15 carbon atoms), an alkoxy group (for example, an alkoxy group having 1 to 15 carbon atoms), a halogen atom, a hydroxyl group, and a phenylthio group.

The compound capable of generating an acid represented by General Formula (III) or (IV) upon irradiation with actinic rays or radiation is more preferably a sulfonium salt compound or iodonium salt compound having an anion of an acid represented by General Formula (III) or (IV), still more preferably a compound represented by General Formula (ZIa), and particularly preferably a compound represented by (ZI-1a) to (ZI-3a).

Among the compounds represented by General Formula (ZIa), particularly preferred examples thereof are set forth below, but the present invention is not limited thereto.

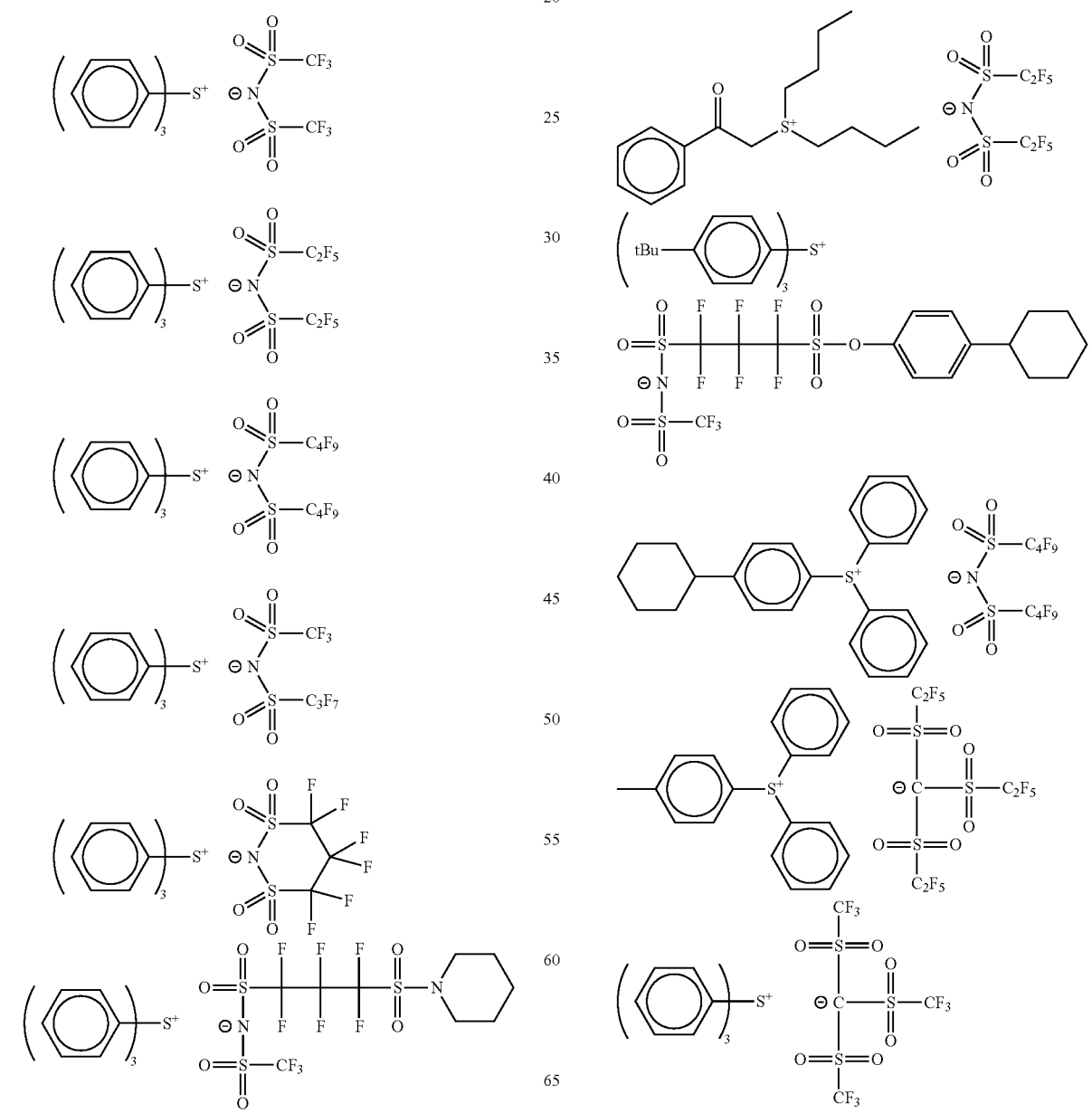

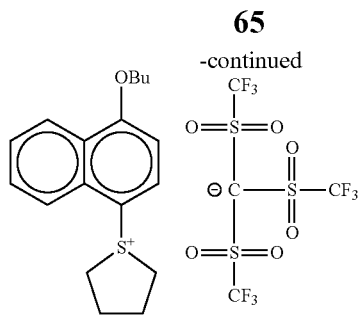

Among the acid generators, particularly preferred examples thereof include the compounds exemplified in <0143> of US2012/0207978A1.

The acid generator can be synthesized by a known method, and can be synthesized in accordance with, for example, the method described in JP2007-161707A.

The acid generators may be used singly or in combination of two or more kinds thereof.

The content (the total content in a case where two or more kinds of the acid generators are present) of the acid generator in the composition is preferably 0.1% to 30% by mass, more preferably 0.5% to 25% by mass, still more preferably 0.5% to 20% by mass, and particularly preferably 0.5% to 15% by mass, with respect to the total solid content of the composition.

Incidentally, in a case where the acid generator is represented by General Formula (ZI-3) or (ZI-4) (the total content in a case where the acid generators are present in plural numbers), the content thereof is preferably 0.1% to 35% by mass, more preferably 0.5% to 30% by mass, and still more preferably 0.5% to 25% by mass, with respect to the total solid content of the composition.

Specific examples of the acid generator are set forth below, but the present invention is not limited thereto.

PAG-1

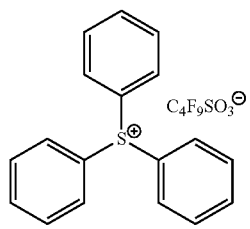

PAG-2

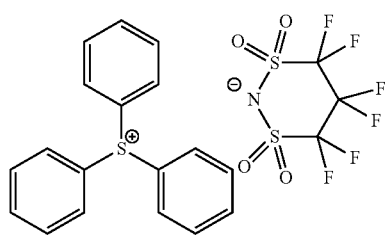

PAG-3

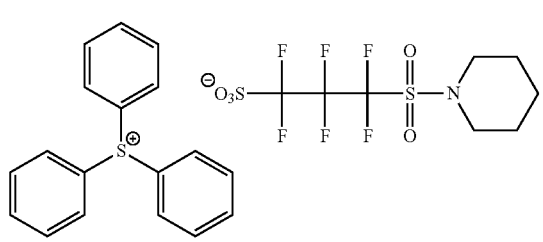

PAG-4

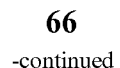
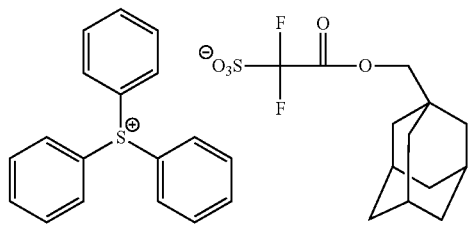

PAG-5

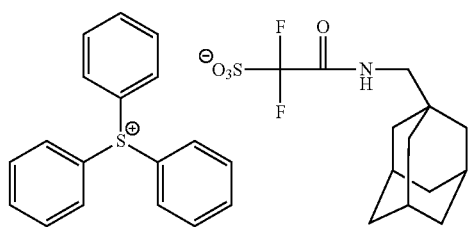

PAG-6

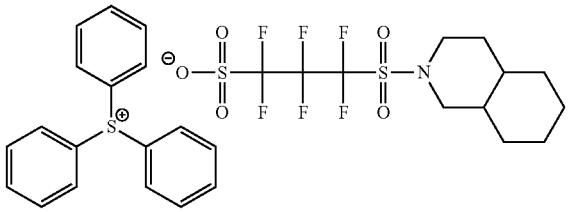

PAG-7

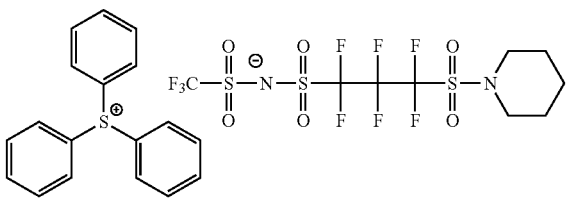

PAG-8

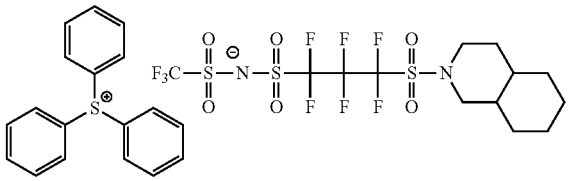

PAG-9

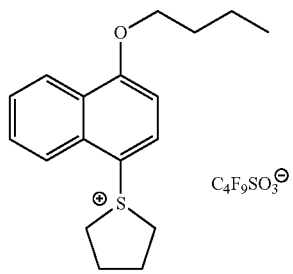

PAG-10
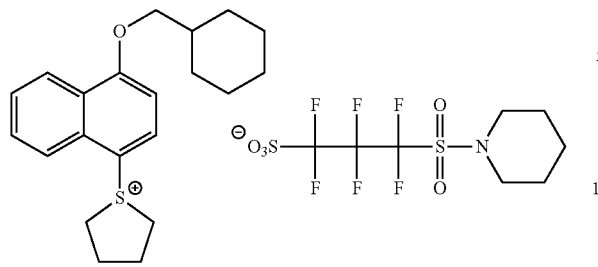

PAG-15
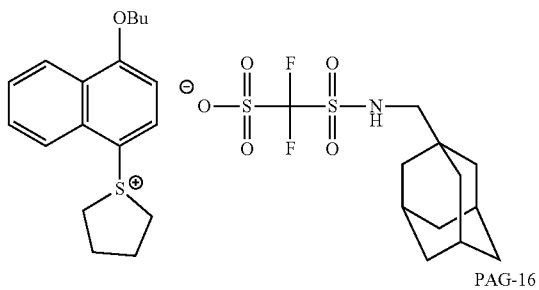

PAG-11
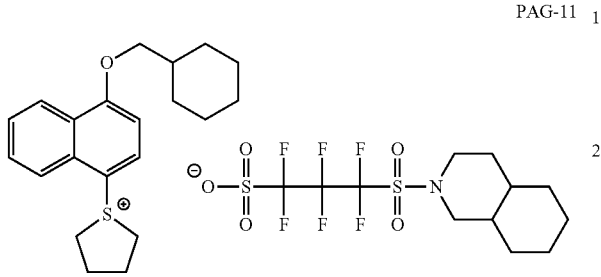

PAG-16
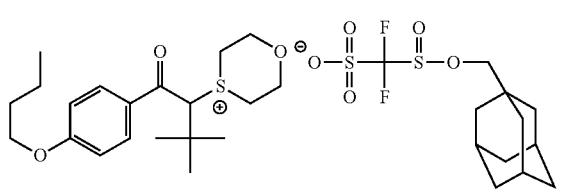

PAG-12
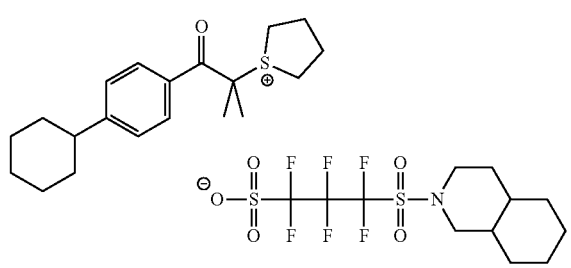

PAG-17
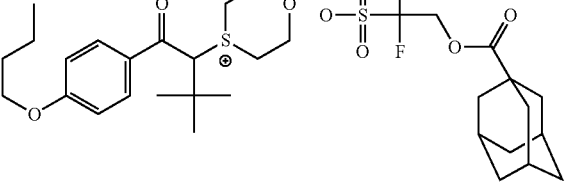

PAG-18
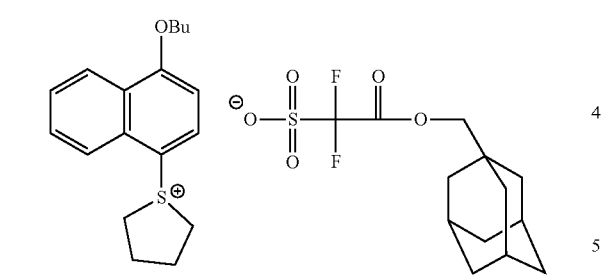

PAG-19

PAG-13
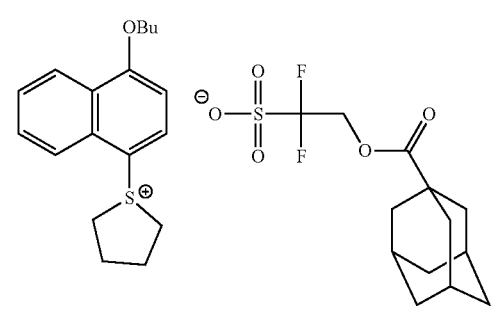

PAG-20
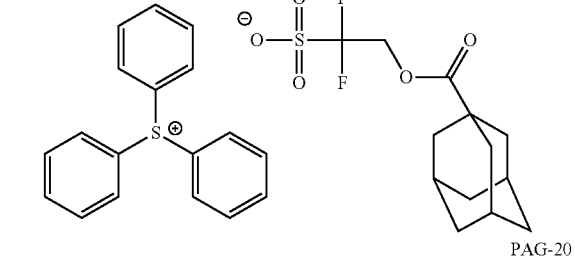

PAG-14
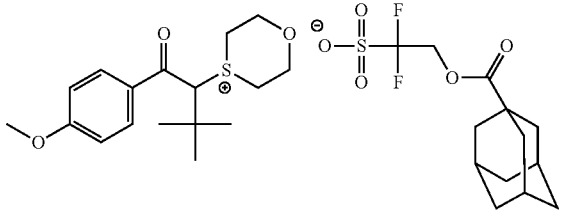

<Hydrophobic Resin>

The composition of the present invention may contain a hydrophobic resin. Further, the hydrophobic resin is preferably different from the resin (A).

Although the hydrophobic resin is preferably designed to be unevenly distributed on an interface as described above, it does not need to have a hydrophilic group in its molecule as different from the surfactant, and does not need to contribute to uniform mixing of polar/nonpolar materials.

Examples of the effect of addition of the hydrophobic resin include suppression of out gas.

The hydrophobic resin preferably has any one of a "fluorine atom", a "silicon atom", and a "CH$_3$ partial structure which is contained in a side chain moiety of a resin" from the viewpoint of uneven distribution on the film surface layer, and more preferably has two or more kinds.

In a case where hydrophobic resin includes a fluorine atom and/or a silicon atom, the fluorine atom and/or the silicon atom in the hydrophobic resin may be contained in the main chain or the side chain of the resin.

In a case where the hydrophobic resin includes a fluorine atom, it is preferably a resin having an alkyl group having a fluorine atom, a cycloalkyl group having a fluorine atom, or an aryl group having a fluorine atom, as a partial structure having a fluorine atom.

The alkyl group having a fluorine atom (preferably having 1 to 10 carbon atoms, and more preferably having 1 to 4 carbon atoms) is a linear or branched alkyl group in which at least one hydrogen atom is substituted with a fluorine atom, and may further have a substituent other than a fluorine atom.

The cycloalkyl group having a fluorine atom is a monocyclic or polycyclic cycloalkyl group in which at least one hydrogen atom is substituted with a fluorine atom, and may further have a substituent other than a fluorine atom.

The aryl group having a fluorine atom is an aryl group such as a phenyl group and a naphthyl group, in which at least one hydrogen atom is substituted with a fluorine atom, and may further have a substituent other than a fluorine atom.

Preferred examples of the alkyl group having a fluorine atom, the cycloalkyl group having a fluorine atom, and the aryl group having a fluorine atom include groups represented by General Formulae (F2) to (F4), but the present invention is not limited thereto.

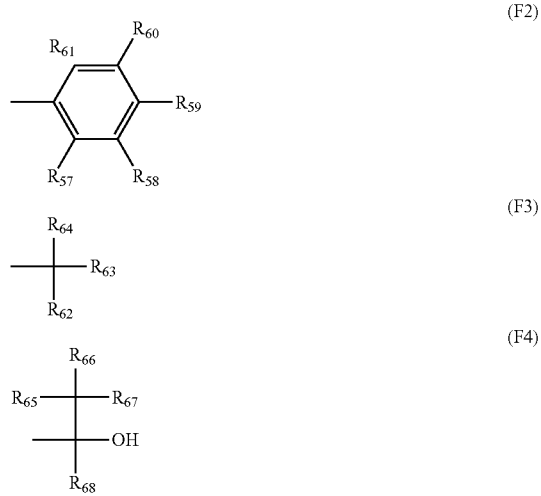

In General Formulae (F2) to (F4), $R_{57}$ to $R_{68}$ each independently represent a hydrogen atom, a fluorine atom, or an (linear or branched) alkyl group, a provided that at least one of $R_{57}$, . . . , or $R_{61}$, at least one of $R_{62}$, . . . , or $R_{64}$, and at least one of $R_{65}$, . . . , or $R_{68}$ each independently represent a fluorine atom or an alkyl group (preferably having 1 to 4 carbon atoms) in which at least one hydrogen atom is substituted with a fluorine atom.

It is preferable that all of $R_{57}$ to $R_{61}$, and $R_{65}$ to $R_{67}$ are fluorine atoms. $R_{62}$, $R_{63}$, and $R_{68}$ are each preferably an alkyl group (preferably having 1 to 4 carbon atoms) in which at least one hydrogen atom is substituted with a fluorine atom, and more preferably a perfluoroalkyl group having 1 to 4 carbon atoms. $R_{62}$ and $R_{63}$ may be linked to each other to form a ring.

Specific examples of the group represented by General Formula (F2) include a p-fluorophenyl group, a pentafluorophenyl group, and a 3,5-di(trifluoromethyl)phenyl group.

Specific examples of the group represented by General Formula (F3) include those exemplified in [0500] of US2012/0251948A1.

Specific examples of the group represented by General Formula (F4) include —C(CF$_3$)$_2$OH, —C(C$_2$F$_5$)$_2$OH, —C(CF$_3$)(CH$_3$)OH, and —CH(CF$_3$)OH, with —C(CF$_3$)$_2$OH being preferable.

The partial structure including a fluorine atom may be directly bonded to a main chain, or bonded to a main chain via a group selected from the group consisting of an alkylene group, a phenylene group, an ether bond, a thioether bond, a carbonyl group, an ester bond, an amide bond, a urethane bond, and a ureylene bond, or a group formed by combining two or more of these groups.

The hydrophobic resin may contain a silicon atom. The hydrophobic resin is preferably a resin having an alkylsilyl structure (preferably a trialkylsilyl group) or a cyclic siloxane structure as the partial structure having a silicon atom.

Examples of the alkylsilyl structure or the cyclic siloxane structure include the partial structures described in paragraphs <0304> to <0307> of JP2013-178370A.

Examples of the repeating unit having a fluorine atom or a silicon atom include those exemplified in [0519] of US2012/0251948A1.

Moreover, it is also preferable that the hydrophobic resin includes a CH$_3$ partial structure in the side chain moiety as described above.

Here, the CH$_3$ partial structure contained in the side chain moiety in the hydrophobic resin includes a CH$_3$ partial structure contained in an ethyl group, a propyl group, and the like.

On the other hand, a methyl group bonded directly to the main chain of the hydrophobic resin (for example, an α-methyl group in the repeating unit having a methacrylic acid structure) makes only a small contribution of uneven distribution to the surface of the hydrophobic resin due to the effect of the main chain, and it is therefore not included in the CH$_3$ partial structure.

More specifically, in a case where the hydrophobic resin includes a repeating unit derived from a monomer having a polymerizable site with a carbon-carbon double bond, such as a repeating unit represented by General Formula (M), and in addition, $R_{11}$ to $R_{14}$ are each CH$_3$ "itself", such the CH$_3$ is not included in the CH$_3$ partial structure contained in the side chain moiety in the present invention.

On the other hand, a CH$_3$ partial structure which is present via a certain atom from a C—C main chain corresponds to the CH$_3$ partial structure in the present invention. For example, in a case where $R_{11}$ is an ethyl group (CH$_2$CH$_3$), the hydrophobic resin has "one" CH$_3$ partial structure in the present invention.

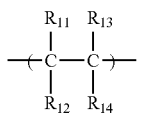
(M)

In General Formula (M), $R_{11}$ to $R_{14}$ each independently represent a side chain moiety.

Examples of $R_{11}$ to $R_{14}$ at the side chain moiety include a hydrogen atom and a monovalent organic group.

Examples of the monovalent organic group for $R_{11}$ to $R_{14}$ include an alkyl group, a cycloalkyl group, an aryl group, an alkyloxycarbonyl group, a cycloalkyloxycarbonyl group, an aryloxycarbonyl group, an alkylaminocarbonyl group, a cycloalkylaminocarbonyl group, and an arylaminocarbonyl group, and these groups may further have a substituent.

The hydrophobic resin is preferably a resin including a repeating unit having the $CH_3$ partial structure in the side chain moiety thereof. Further, the hydrophobic resin more preferably has, as such a repeating unit, at least one repeating unit (x) selected from a repeating unit represented by General Formula (II) or a repeating unit represented by General Formula (III).

Hereinafter, the repeating unit represented by General Formula (II) will be described in detail.

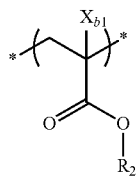
(II)

In General Formula (II), $X_{b1}$ represents a hydrogen atom, an alkyl group, a cyano group, or a halogen atom, and $R_2$ represents an organic group which has one or more $CH_3$ partial structures and is stable against an acid. Here, more specifically, the organic group which is stable against an acid is preferably an organic group which does not have an "acid-decomposable group" described with respect to the resin (A).

The alkyl group of $X_{b1}$ is preferably an alkyl group having 1 to 4 carbon atoms, and examples thereof include a methyl group, an ethyl group, a propyl group, a hydroxymethyl group, and a trifluoromethyl group, with the methyl group being preferable.

$X_{b1}$ is preferably a hydrogen atom or a methyl group.

Examples of $R_2$ include an alkyl group, a cycloalkyl group, an alkenyl group, a cycloalkenyl group, an aryl group, and an aralkyl group, each of which has one or more $CH_3$ partial structures. Each of the cycloalkyl group, the alkenyl group, the cycloalkenyl group, the aryl group and the aralkyl group may further have an alkyl group as a substituent.

$R_2$ is preferably an alkyl group or an alkyl-substituted cycloalkyl group, each of which has one or more $CH_3$ partial structures.

The number of the $CH_3$ partial structures contained in the organic group which has one or more $CH_3$ partial structures and is stable against an acid as $R_2$ is preferably from 2 to 10, and more preferably from 2 to 8.

Specific preferred examples of the repeating unit represented by General Formula (II) include the following repeating units, but the present invention is not limited thereto.

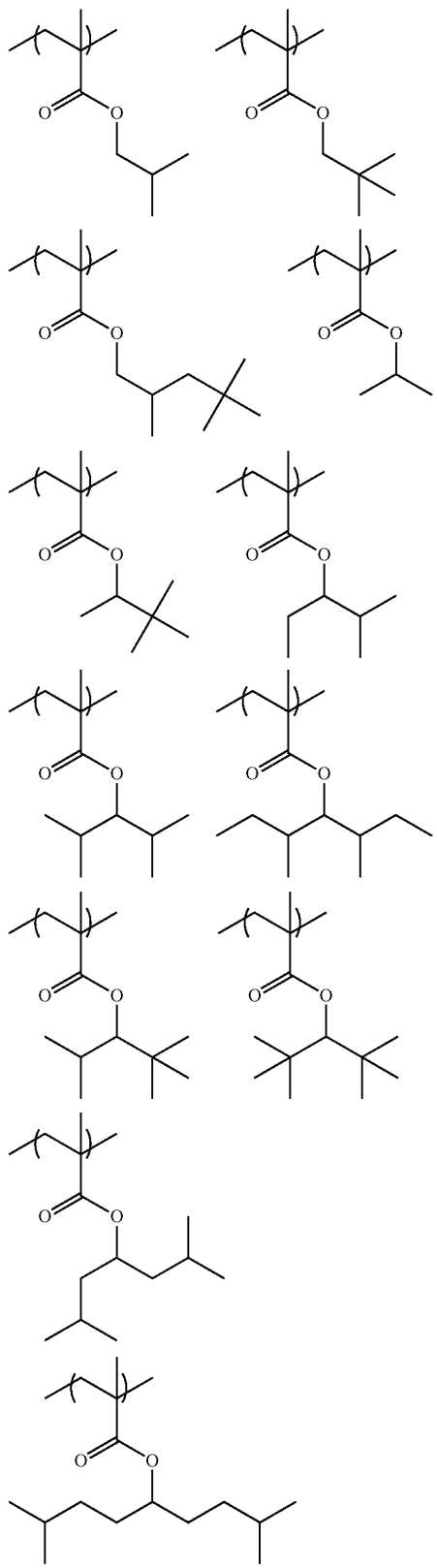

-continued

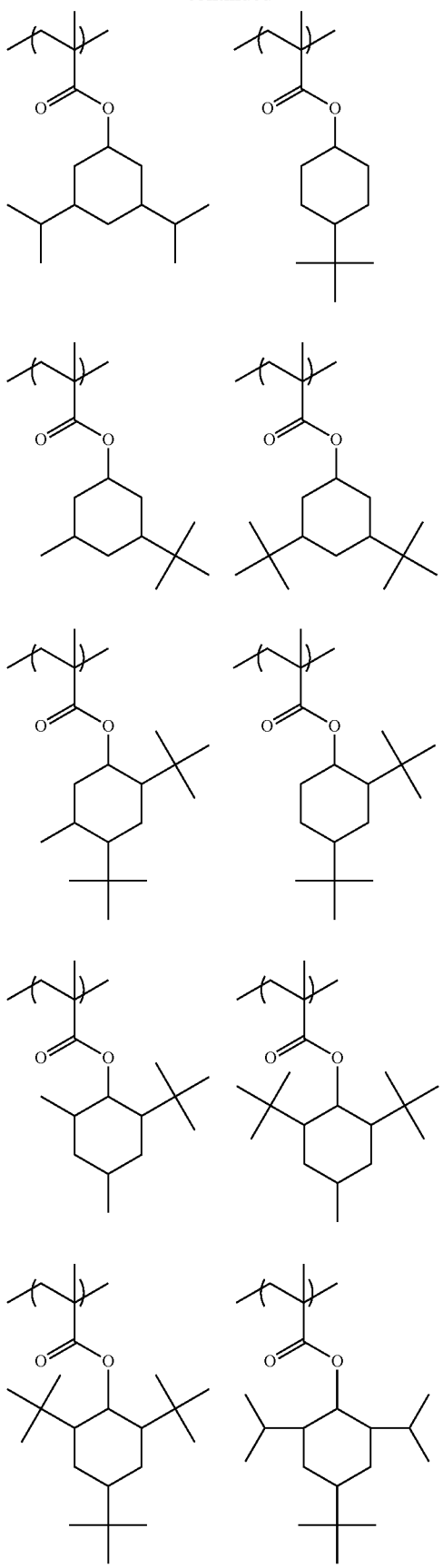

-continued

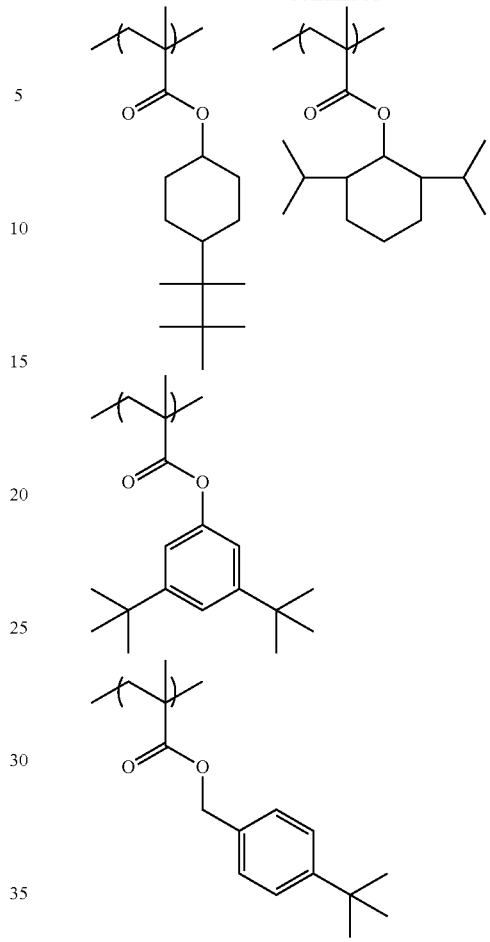

The repeating unit represented by General Formula (II) is preferably a repeating unit which is stable against an acid (non-acid-decomposable), and specifically, it is preferably a repeating unit not having a group capable of decomposing by the action of an acid to generate a polar group.

Hereinafter, the repeating unit represented by General Formula (III) will be described in detail.

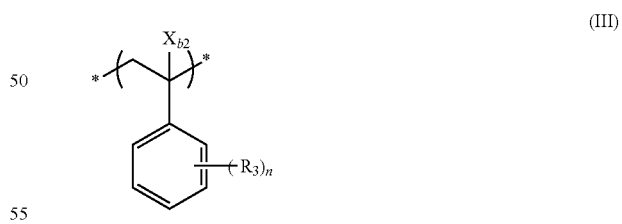

(III)

In General Formula (III), $X_{b2}$ represents a hydrogen atom, an alkyl group, a cyano group, or a halogen atom, $R_3$ represents an organic group which has one or more $CH_3$ partial structures and is stable against an acid, and n represents an integer of 1 to 5.

The alkyl group of $X_{b2}$ is preferably an alkyl group having 1 to 4 carbon atoms, and examples thereof include a methyl group, an ethyl group, a propyl group, a hydroxymethyl group, and a trifluoromethyl group, but a hydrogen atom is preferable.

$X_{b2}$ is preferably a hydrogen atom.

Since $R_3$ is an organic group stable against an acid, more specifically, $R_3$ is preferably an organic group which does not have the "acid-decomposable group" described for the resin (A).

Examples of $R_3$ include an alkyl group having one or more $CH_3$ partial structures.

The number of the $CH_3$ partial structures contained in the organic group which has one or more $CH_3$ partial structures and is stable against an acid as $R_3$ is preferably from 1 to 10, more preferably from 1 to 8, and still more preferably from 1 to 4.

n represents an integer of 1 to 5, more preferably 1 to 3, and still more preferably 1 or 2.

Specific preferred examples of the repeating unit represented by General Formula (III) include the following repeating units, but the present invention is not limited thereto.

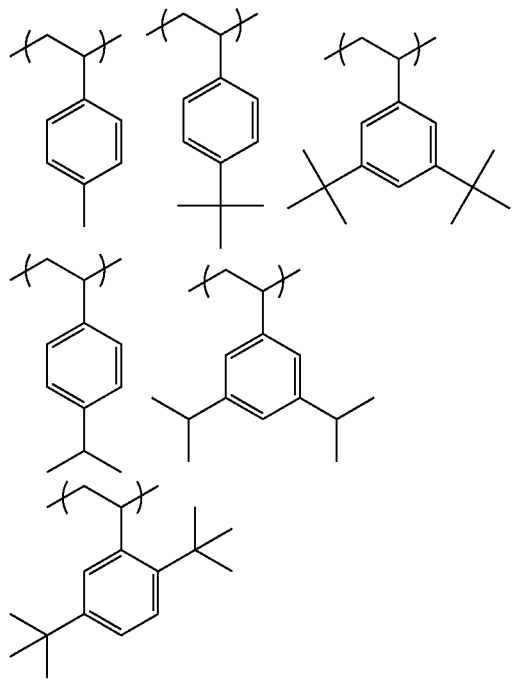

The repeating unit represented by General Formula (III) is preferably a repeating unit which is stable against an acid (non-acid-decomposable), and specifically, it is preferably a repeating unit which does not have "a group that decomposes by the action of an acid to generate a polar group".

In a case where the hydrophobic resin includes a $CH_3$ partial structure in the side chain portion thereof, and in particular, it has neither a fluorine atom nor a silicon atom, the content of at least one repeating unit (x) of the repeating unit represented by General Formula (II) or the repeating unit represented by General Formula (III) is preferably 90% by mole or more, and more preferably 95% by mole or more, with respect to all the repeating units of the hydrophobic resin. Further, the content is usually 100% by mole or less with respect to all the repeating units of the hydrophobic resin.

By incorporating at least one repeating unit (x) of the repeating unit represented by General Formula (II) or the repeating unit represented by General Formula (III) in a proportion of 90% by mole or more with respect to all the repeating units of the hydrophobic resin into the hydrophobic resin, the surface free energy of the hydrophobic resin is increased. As a result, it is difficult for the hydrophobic resin to be unevenly distributed on the surface of the resist film and the static/dynamic contact angle of the resist film with respect to water can be securely increased, thereby enhancing the immersion liquid tracking properties.

In addition, in a case where the hydrophobic resin contains (i) a fluorine atom and/or a silicon atom or (ii) a $CH_3$ partial structure in the side chain moiety, the hydrophobic resin may have at least one group selected from the following groups (x) to (z):

(x) an acid group, (y) a group having a lactone structure, an acid anhydride group, or an acid imido group, and (z) a group that decomposes by the action of an acid.

Examples of the acid group (x) include a phenolic hydroxyl group, a carboxylic acid group, a fluorinated alcohol group, a sulfonic acid group, a sulfonamido group, a sulfonylimido group, an (alkylsulfonyl)alkylcarbonyl)methylene group, an (alkylsulfonyl)(alkylcarbonyl)imido group, a bis(alkylcarbonyl)methylene group, a bis(alkylcarbonyl)imido group, a bis(alkylsulfonyl)methylene group, a bis(alkylsulfonyl)imido group, a tris(alkylcarbonyl)methylene group, and a tris(alkylsulfonyl)methylene group.

Preferred examples of the acid group include a fluorinated alcohol group (preferably a hexafluoroisopropanol group), a sulfonimido group, and a bis(alkylcarbonyl)methylene group.

Examples of the repeating unit having an acid group (x) include a repeating unit in which the acid group is directly bonded to the main chain of the resin, such as a repeating unit by an acrylic acid or a methacrylic acid, and a repeating unit in which the acid group is bonded to the main chain of the resin through a linking group, and the acid group may also be introduced into the polymer chain terminal by using a polymerization initiator or chain transfer agent containing an acid group during the polymerization. All of these cases are preferable. The repeating unit having an acid group (x) may have at least one of a fluorine atom or a silicon atom.

The content of the repeating units having an acid group (x) is preferably 1% to 50% by mole, more preferably 3% to 35% by mole, and still more preferably 5% to 20% by mole, with respect to all the repeating units in the hydrophobic resin.

Specific examples of the repeating unit having an acid group (x) are set forth below, but the present invention is not limited thereto. In the formulae, $R_x$ represents a hydrogen atom, $CH_3$, $CF_3$, or $CH_2OH$.

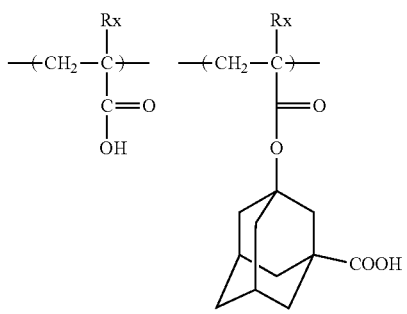

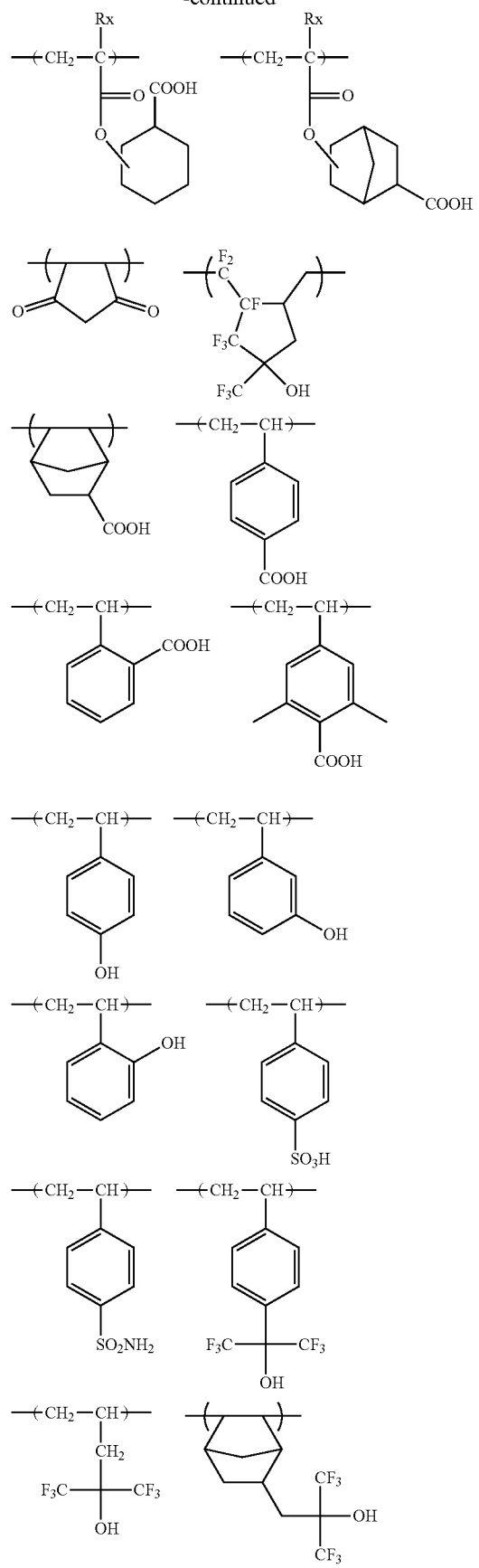
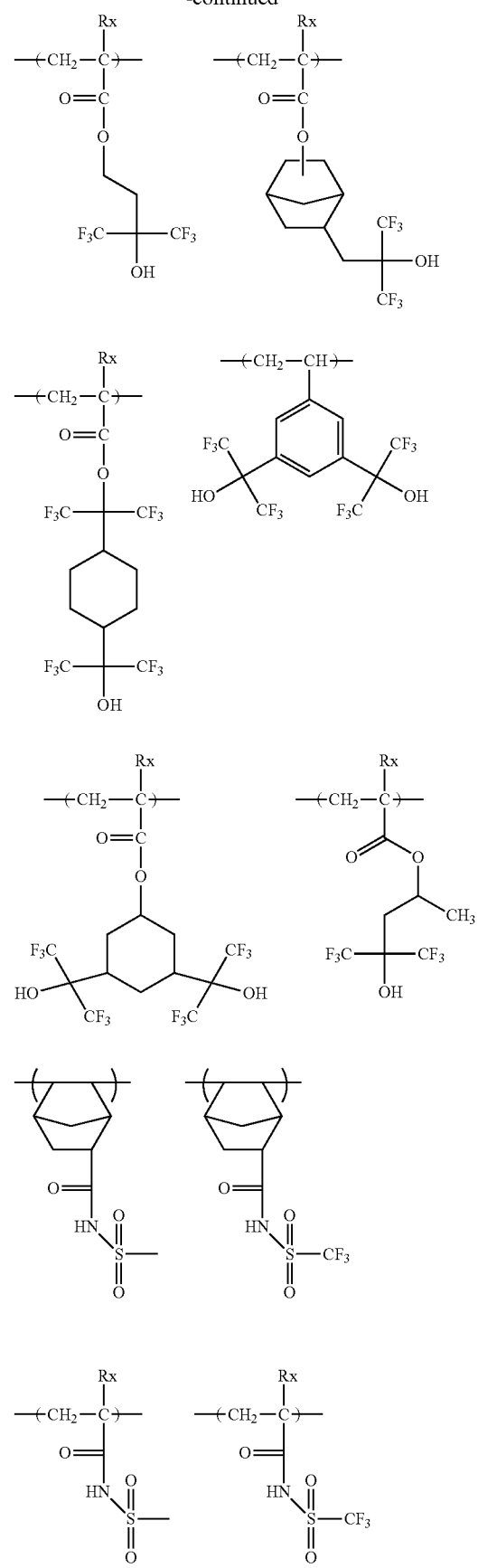

-continued

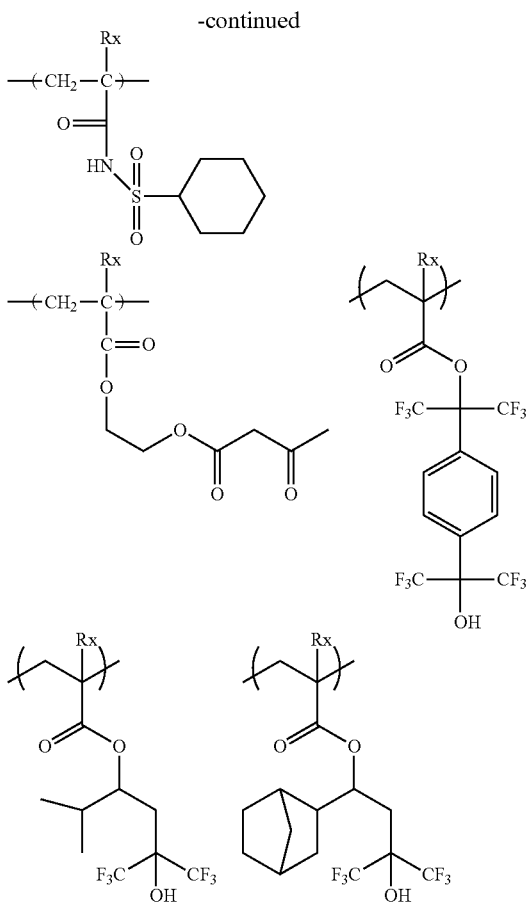

As the group having a lactone structure, the acid anhydride group, or the acid imido group (y), a group having a lactone structure is particularly preferable.

The repeating unit including the group is, for example, a repeating unit in which the group is directly bonded to the main chain of the resin, such as a repeating unit by an acrylic ester or a methacrylic ester. This repeating unit may be a repeating unit in which the group is bonded to the main chain of the resin through a linking group. Alternatively this repeating unit may be introduced into the terminal of the resin by using a polymerization initiator or chain transfer agent containing the group during the polymerization.

Examples of the repeating unit containing a group having a lactone structure include the same ones as the repeating unit having a lactone structure as described earlier in the section of the resin (A).

The content of the repeating units having a group having a lactone structure, an acid anhydride group, or an acid imido group is preferably 1% to 100% by mole, more preferably 3% to 98% by mole, and still more preferably 5% to 95% by mole, with respect to all the repeating units in the hydrophobic resin.

With respect to the hydrophobic resin, examples of the repeating unit having a group (z) that decomposes by the action of an acid include the same ones as the repeating units having an acid-decomposable group, as exemplified in the resin (A). The repeating unit having a group (z) that decomposes by the action of an acid may have at least one of a fluorine atom or a silicon atom. With respect to the hydrophobic resin, the content of the repeating units having a group (z) that decomposes by the action of an acid is preferably 1% to 80% by mole, more preferably 10% to 80% by mole, and still more preferably 20% to 60% by mole, with respect to all the repeating units in the hydrophobic resin.

In a case where the hydrophobic resin has fluorine atoms, the content of the fluorine atoms is preferably 5% to 80% by mass, and more preferably 10% to 80% by mass, with respect to the weight-average molecular weight of the hydrophobic resin. In addition, the repeating unit including a fluorine atom is preferably in the amount of 10% to 100% by mole, and more preferably in the amount of 30% to 100% by mole, with respect to all the repeating units included in the hydrophobic resin.

In a case where the hydrophobic resin has a silicon atom, the content of the silicon atom is preferably 2% to 50% by mass, and more preferably 2% to 30% by mass, with respect to the weight-average molecular weight of the hydrophobic resin. In addition, the repeating unit including a silicon atom is preferably in the amount of 10% to 100% by mole, and more preferably in the amount of 20% to 100% by mole, with respect to all the repeating units in the hydrophobic resin.

On the other hand, in particular, in a case where the hydrophobic resin includes a $CH_3$ partial structure in the side chain moiety thereof, it is also preferable that the hydrophobic resin has a form substantially not having any one of fluorine atoms and silicon atoms. In this case, specifically, the content of the repeating unit having a fluorine atom or a silicon atom is preferably 5% by mole or less, more preferably 3% by mole or less, and still more preferably 1% by mole or less, with respect to all the repeating units in the hydrophobic resin, and ideally, the content is 0% by mole, that is, the hydrophobic resin does not contain a fluorine atom and a silicon atom. In addition, it is preferable that the hydrophobic resin is substantially composed only of repeating units which are composed only of atoms selected from a carbon atom, an oxygen atom, a hydrogen atom, a nitrogen atom, and a sulfur atom. More specifically, the proportion of the repeating units which are composed only of atoms selected from a carbon atom, an oxygen atom, a hydrogen atom, a nitrogen atom, and a sulfur atom is preferably 95% by mole or more, more preferably 97% by mole or more, still more preferably 99% by mole or more, and ideally 100% by mole, in all the repeating units in the hydrophobic resin.

The weight-average molecular weight in terms of standard polystyrene, of the hydrophobic resin, is preferably 1,000 to 100,000, more preferably 1,000 to 50,000, and still more preferably 2,000 to 15,000.

Furthermore, the hydrophobic resin may be used singly or in combination of a plurality of kinds thereof.

The content of the hydrophobic resin in the composition is preferably 0.01% to 10% by mass, more preferably 0.05% to 8% by mass, and still more preferably 0.1% to 7% by mass, with respect to the total solid contents of the composition of the present invention.

It is natural that the hydrophobic resin contains a small amount of impurities such as metals, but the amount of remaining monomers and oligomer components in the hydrophobic resin is preferably 0.01% to 5% by mass, more preferably 0.01% to 3% by mass, and still more preferably 0.05% to 1% by mass. Thus, a composition having no temporal change in foreign substances in a liquid, sensitivity, and the like is obtained. Further, the molecular weight distribution (Mw/Mn, also referred to as a dispersity) is preferably in a range of 1 to 5, more preferably in a range of 1 to 3, and still more preferably in a range of 1 to 2, in views of a resolution, a resist shape, sidewalls of a resist pattern, roughness, and the like.

As the hydrophobic resin, various commercial products can also be used, or the resin can be synthesized by an ordinary method (for example, radical polymerization). Examples of the general synthesis method include a bulk polymerization method in which polymerization is carried out by dissolving monomer species and an initiator in a solvent and heating the solution, a dropwise addition polymerization method in which a solution of monomer species and an initiator is added dropwise to a heating solvent for 1 to 10 hours, with the dropwise addition polymerization method being preferable.

A reaction solvent, a polymerization initiator, reaction conditions (a temperature, a concentration, and the like), and a purification method after the reaction are the same as those described for the resin (A), but in the synthesis of the hydrophobic resin, the concentration of the reaction is preferably 30% to 50% by mass.

<Acid Diffusion Control Agent (D)>

The composition of the present invention preferably contains an acid diffusion control agent (D). The acid diffusion control agent (D) acts as a quencher that inhibits a reaction of the acid-decomposable resin in the unexposed area by excessive generated acids by trapping the acids generated from an acid generator or the like upon exposure. As the acid diffusion control agent (D), a basic compound, a low-molecular-weight compound which has a nitrogen atom and a group that leaves by the action of an acid, a basic compound whose basicity is reduced or lost upon irradiation with actinic rays or radiation, or an onium salt which becomes a relatively weak acid with respect to the acid generator upon irradiation with actinic rays or radiation can be used.

Preferred examples of the basic compound include compounds having structures represented by Formulae (A) to (E).

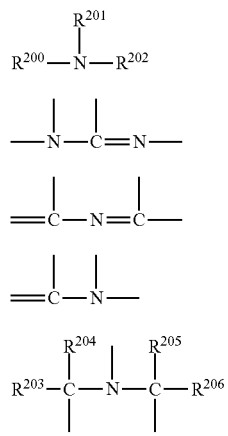

In General Formulae (A) and (E), $R^{200}$, $R^{201}$, and $R^{202}$ may be the same as or different from each other, and each represent a hydrogen atom, an alkyl group (preferably having 1 to 20 carbon atoms), a cycloalkyl group (preferably having 3 to 20 carbon atoms), or an aryl group (having 6 to 20 carbon atoms), and $R^{201}$ and $R^{202}$ may be bonded to each other to form a ring.

$R^{203}$, $R^{204}$, $R^{205}$, and $R^{206}$ may be the same as or different from each other, and each represent an alkyl group having 1 to 20 carbon atoms.

With regard to the alkyl group, the alkyl group having a substituent is preferably an aminoalkyl group having 1 to 20 carbon atoms, a hydroxyalkyl group having 1 to 20 carbon atoms, or a cyanoalkyl group having 1 to 20 carbon atoms.

The alkyl groups in General Formulae (A) and (E) are more preferably unsubstituted.

Preferred examples of the compound include guanidine, aminopyrrolidine, pyrazole, pyrazoline, piperazine, aminomorpholine, aminoalkylmorpholine, and piperidine. More preferred examples of the compound include a compound having an imidazole structure, a diazabicyclo structure, an onium hydroxide structure, an onium carboxylate structure, a trialkylamine structure, an aniline structure, or a pyridine structure; an alkylamine derivative having a hydroxyl group and/or an ether bond; and an aniline derivative having a hydroxyl group and/or an ether bond.

Specific preferred examples of the compound include the compounds exemplified in <0379> of US2012/0219913A1.

Preferred examples of the basic compound include an amine compound having a phenoxy group, an ammonium salt compound having a phenoxy group, an amine compound containing a sulfonic ester group, and an ammonium salt compound having a sulfonic ester group.

As the amine compound, a primary, secondary, or tertiary amine compound can be used, and an amine compound in which at least one alkyl group is bonded to a nitrogen atom is preferable. The amine compound is more preferably a tertiary amine compound. Any amine compound is available as long as at least one alkyl group (preferably having 1 to 20 carbon atoms) is bonded to a nitrogen atom, and a cycloalkyl group (preferably having 3 to 20 carbon atoms) or an aryl group (preferably having 6 to 12 carbon atoms) may be bonded to the nitrogen atom, in addition to the alkyl group. The amine compound preferably has an oxygen atom in the alkyl chain to form an oxyalkylene group. The number of the oxyalkylene groups within the molecule is 1 or more, preferably 3 to 9, and more preferably from 4 to 6. Among the oxyalkylene groups, an oxyethylene group ($-CH_2CH_2O-$) or an oxypropylene group ($-CH(CH_3)CH_2O-$ or $-CH_2CH_2CH_2O-$) is preferable, and an oxyethylene group is more preferable.

As the ammonium salt compound, a primary, secondary, tertiary, or quaternary ammonium salt compound can be used, and an ammonium salt compound in which at least one alkyl group is bonded to a nitrogen atom is preferable. Any ammonium salt compound is available as long as at least one alkyl group (preferably having 1 to 20 carbon atoms) is bonded to a nitrogen atom, and a cycloalkyl group (preferably having 3 to 20 carbon atoms) or an aryl group (preferably having 6 to 12 carbon atoms) may be bonded to the nitrogen atom, in addition to the alkyl group. The ammonium salt compound preferably has an oxygen atom in the alkyl chain to form an oxyalkylene group. The number of the oxyalkylene groups within the molecule is 1 or more, preferably 3 to 9, and more preferably 4 to 6. Among the oxyalkylene groups, an oxyethylene group ($-CH_2CH_2O-$) or an oxypropylene group ($-CH(CH_3)CH_2O-$ or $-CH_2CH_2CH_2O-$) is preferable, and an oxyethylene group is more preferable.

Examples of the anion of the ammonium salt compound include a halogen atom, sulfonate, borate, and phosphate, and among these, the halogen atom and sulfonate are preferable.

Furthermore, the following compounds are also preferable as the basic compound.

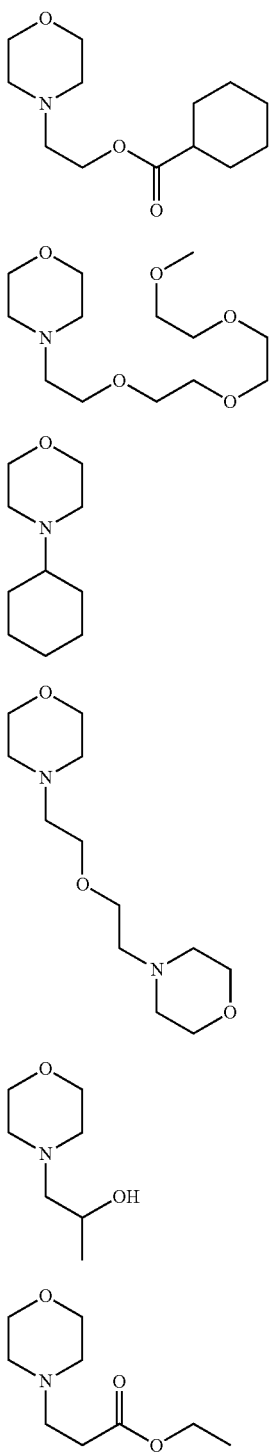

(M0-1)
(M0-2)
(M0-3)
(M0-4)
(M0-5)
(M0-6)

In addition to the compounds as described above, as the basic compound, the compounds described in [0180] to [0225] of JP2011-22560A, [0218] and [0219] of JP2012-137735A, and [0416] to [0438] of WO2011/158687A1, and the like can also be used.

These basic compounds may be used singly or in combination of two or more kinds thereof.

The composition of the present invention may or may not contain a basic compound, but in a case where it contains the basic compound, the content of the basic compound is usually 0.001% to 10% by mass, and preferably 0.01% to 5% by mass, with respect to the solid content of the composition.

The ratio of between the acid generator (a total amount in a case of using plural kinds of the acid generators) and the basic compound to be used in the composition is preferably acid generator/basic compound (molar ratio)=2.5 to 300. That is, the molar ratio is preferably 2.5 or more in a view of sensitivity and resolution, and is preferably 300 or less in a view of suppressing the reduction in resolution due to thickening of the resist pattern with aging after exposure until the heat treatment. The acid generator/basic compound (molar ratio) is more preferably 5.0 to 200, and still more preferably 7.0 to 150.

The low-molecular-weight compound (hereinafter also referred to as a "compound (D-1)") which has a nitrogen atom and a group that leaves by the action of an acid is preferably an amine derivative having a group that leaves by the action of an acid on a nitrogen atom.

As the group that leaves by the action of an acid, an acetal group, a carbonate group, a carbamate group, a tertiary ester group, a tertiary hydroxyl group, or a hemiaminal ether group is preferable, and a carbamate group or a hemiaminal ether group is particularly preferable.

The molecular weight of the compound (D-1) is preferably 100 to 1.000, more preferably 100 to 700, and particularly preferably 100 to 500.

The compound (D-1) may have a carbamate group having a protecting group on a nitrogen atom. The protecting group constituting the carbamate group can be represented by General Formula (d-1).

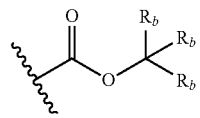

(d-1)

In General Formula (d-1), $R_b$'s each independently represent a hydrogen atom, an alkyl group (preferably having 1 to 10 carbon atoms), a cycloalkyl group (preferably having 3 to 30 carbon atoms), an aryl group (preferably having 3 to 30 carbon atoms), an aralkyl group (preferably having 1 to 10 carbon atoms), or an alkoxyalkyl group (preferably having 1 to 10 carbon atoms). $R_b$'s may be linked to each other to form a ring.

The alkyl group, the cycloalkyl group, the aryl group, or the aralkyl group represented by $R_b$ may be substituted with a functional group such as a hydroxyl group, a cyano group, an amino group, a pyrrolidino group, a piperidino group, a morpholino group, and an oxo group, an alkoxy group, or a halogen atom. This is the same as for the alkoxyalkyl group represented by $R_b$.

$R_b$ is preferably a linear or branched alkyl group, a cycloalkyl group, or an aryl group, and more preferably a linear or branched alkyl group, or a cycloalkyl group.

Examples of the ring formed by the mutual linking of two $R_b$'s include an alicyclic hydrocarbon group, an aromatic hydrocarbon group, a heterocyclic hydrocarbon group, and derivatives thereof.

Examples of the specific structure of the group represented by General Formula (d-1) include, but are not limited to, the structures disclosed in <0466> of US2012/0135348A1.

It is particularly preferable that the compound (D-1) has a structure of General Formula (6).

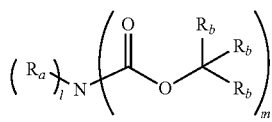
(6)

In General Formula (6), $R_a$ represents a hydrogen atom, an alkyl group, a cycloalkyl group, an aryl group, or an aralkyl group. In a case where 1 is 2, two $R_a$'s may be the same as or different from each other. Two $R_a$'s may be linked to each other to form a heterocycle may be bonded to each other to form, together with a carbon atom to which they are bonded with the nitrogen atom in the formula. The heterocycle may include a heteroatom other than the nitrogen atom in the formula.

$R_b$ has the same definition as $R_b$ in General Formula (d-1), and preferred examples are also the same.

l represents an integer of 0 to 2, and m represents an integer of 1 to 3, satisfying l+m=3.

In General Formula (6), the alkyl group, the cycloalkyl group, the aryl group, and the aralkyl group as $R_a$ may be substituted with the same groups as the group mentioned above as a group which may be substituted in the alkyl group, the cycloalkyl group, the aryl group, and the aralkyl group as $R_b$.

Specific examples of the alkyl group, the cycloalkyl group, the aryl group, and the aralkyl group (such the alkyl group, a cycloalkyl group, an aryl group, and aralkyl group may be substituted with the groups as described above) of $R_a$ include the same groups as the specific of examples as described above with respect to $R_b$.

Specific examples of the particularly preferred compound (D-1) in the present invention include, but are not limited to, the compounds disclosed in paragraph <0475> of US2012/0135348A1.

The compounds represented by General Formula (6) can be synthesized in accordance with JP2007-298569A, JP2009-199021A, and the like.

In the present invention, the compound (D-1) may be used singly or as a mixture of two or more kinds thereof.

The content of the compound (D-1) in the composition of the present invention is preferably 0.001% to 20% by mass, more preferably 0.001% to 10% by mass, and still more preferably 0.01% to 5% by mass, with respect to the total solid content of the composition.

The basic compound whose basicity is reduced or lost upon irradiation with actinic rays or radiation (hereinafter also referred to as a "compound (PA)") is a compound which has a functional group with proton-accepting properties, and decomposes under irradiation with actinic rays or radiation to exhibit deterioration in proton-accepting properties, no proton-accepting properties, or a change from the proton-accepting properties to acidic properties.

The functional group with proton-accepting properties refers to a functional group having a group or an electron which is capable of electrostatically interacting with a proton, and for example, means a functional group with a macrocyclic structure, such as a cyclic polyether, or a functional group having a nitrogen atom having an unshared electron pair not contributing to π-conjugation. The nitrogen atom having an unshared electron pair not contributing to π-conjugation is, for example, a nitrogen atom having a partial structure represented by the following formula.

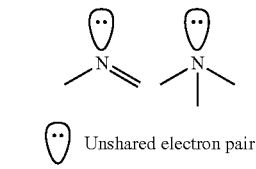

$\overset{..}{\bigcirc}$ Unshared electron pair

Preferred examples of the partial structure of the functional group with proton-accepting properties include crown ether, azacrown ether, primary to tertiary amines, pyridine, imidazole, and pyrazine structures.

The compound (PA) decomposes upon irradiation with actinic rays or radiation to generate a compound exhibiting deterioration in proton-accepting properties, no proton-accepting properties, or a change from the proton-accepting properties to acidic properties. Here, exhibiting deterioration in proton-accepting properties, no proton-accepting properties, or a change from the proton-accepting properties to acidic properties means a change of proton-accepting properties due to the proton being added to the functional group with proton-accepting properties, and specifically a decrease in the equilibrium constant at chemical equilibrium in a case where a proton adduct is generated from the compound (PA) having the functional group with proton-accepting properties and the proton.

The proton-accepting properties can be confirmed by carrying out pH measurement.

In the present invention, the acid dissociation constant pKa of the compound generated by the decomposition of the compound (PA) upon irradiation with actinic rays or radiation preferably satisfies pKa<−1, more preferably −13<pKa<−1, and still more preferably −13<pKa<−3.

In the present invention, the acid dissociation constant pKa indicates an acid dissociation constant pKa in an aqueous solution, and is described, for example, in Chemical Handbook (II) (Revised 4$^{th}$ Edition, 1993, compiled by the Chemical Society of Japan, Maruzen Company, Ltd.), and a lower value thereof indicates higher acid strength. Specifically, the pKa in an aqueous solution may be measured by using an infinite-dilution aqueous solution and measuring the acid dissociation constant at 25° C., or a value based on the Hammett substituent constants and the database of publicly known literature data can also be obtained by computation using the following software package 1. All the values of pKa described in the present specification indicate values determined by computation using this software package.

Software package 1: Advanced Chemistry Development (ACD/Labs) Software V 8.14 for Solaris (1994-2007 ACD/Labs).

The compound (PA) generates a compound represented by General Formula (PA-1), for example, as the proton adduct generated by decomposition upon irradiation with actinic rays or radiation. The compound represented by General Formula (PA-1) is a compound exhibiting deterioration in proton-accepting properties, no proton-accepting properties, or a change from the proton-accepting properties to acidic properties since the compound has a functional group with proton-accepting properties as well as an acidic group, as compared with the compound (PA).

$$Q\text{-}A\text{-}(X)_n\text{—}B\text{—}R \quad (PA\text{-}1)$$

In General Formula (PA-1),

Q represents —$SO_3H$, —$CO_2H$, or —$W_1NHW_2R_f$, in which $R_f$ represents an alkyl group (preferably having 1 to 20 carbon atoms), a cycloalkyl group (preferably having 3 to 20 carbon atoms), or an aryl group (preferably having 6 to 30 carbon atoms), and $W_1$ and $W_2$ each independently represent —$SO_2$— or —CO—.

A represents a single bond or a divalent linking group.

X represents —$SO_2$— or —CO—.

n is 0 or 1.

B represents a single bond, an oxygen atom, or —$N(R_x)R_y$—, in which $R_x$ represents a hydrogen atom or a monovalent organic group, and $R_y$ represents a single bond or a divalent organic group, a provided that $R_x$ may be bonded to $R_y$ to form a ring or may be bonded to R to form a ring.

R represents a monovalent organic group having a functional group with proton-accepting properties.

General Formula (PA-1) will be described in more detail.

The divalent linking group in A is preferably a divalent linking group having 2 to 12 carbon atoms, and examples thereof include an alkylene group and a phenylene group. The divalent linking group is more preferably an alkylene group having at least one fluorine atom, and preferably has 2 to 6 carbon atoms, and more preferably has 2 to 4 carbon atoms. The divalent linking group may have a linking group such as an oxygen atom and a sulfur atom in the alkylene chain. The alkylene group preferably an alkylene group, in particular, in which 30% to 100% by number of the hydrogen atoms are substituted with fluorine atoms, more preferably in which a carbon atom bonded to the Q site has a fluorine atom, still more preferably a perfluoroalkylene group, and particularly preferably a perfluoroethylene group, a perfluoropropylene group, or a perfluorobutylene group.

The monovalent organic group in $R_x$ is preferably an organic group having 1 to 30 carbon atoms, and examples thereof include an alkyl group, a cycloalkyl group, an aryl group, an aralkyl group, and an alkenyl group. These groups may further have a substituent.

The alkyl group in $R_x$ may have a substituent, is preferably a linear or branched alkyl group having 1 to 20 carbon atoms, and may have an oxygen atom, a sulfur atom, or a nitrogen atom in the alkyl chain.

The cycloalkyl group in $R_x$ may have a substituent, is preferably a monocyclic or polycyclic cycloalkyl group having 3 to 20 carbon atoms, and may have an oxygen atom, a sulfur atom, or a nitrogen atom in the ring.

The aryl group in $R_x$ may have a substituent and is preferably an aryl group having 6 to 14 carbon atoms, and examples thereof include a phenyl group and a naphthyl group.

The aralkyl group in $R_x$ may have a substituent and is preferably an aralkyl group having 7 to 20 carbon atoms, and examples thereof include a benzyl group and a phenethyl group.

The alkenyl group in $R_x$ may have a substituent, may be linear or branched, and is preferably an alkenyl group having 3 to 20 carbon atoms, and examples of such the alkenyl group include a vinyl group, an allyl group, and a styryl group.

In a case where $R_x$ further has a substituent, examples of the substituent include a halogen atom, a linear, branched, or cyclic alkyl group, an alkenyl group, an alkynyl group, an aryl group, an acyl group, an alkoxycarbonyl group, an aryloxycarbonyl group, a carbamoyl group, a cyano group, a carboxyl group, a hydroxyl group, an alkoxy group, an aryloxy group, an alkylthio group, an arylthio group, a heterocyclic oxy group, an acyloxy group, an amino group, a nitro group, a hydrazino group, and a heterocyclic group.

Preferred examples of the divalent organic group in $R_y$ include an alkylene group.

Examples of the ring structure which may be formed by the mutual bonding of $R_x$ and $R_y$ include a 5- to 10-membered ring, and particularly preferably a 6-membered ring, including a nitrogen atom.

The functional group with proton-accepting properties in R is as described above, and examples thereof include nitrogen-including heterocyclic aromatic structures such as azacrown ether, primary to tertiary amines, pyridine, and imidazole.

The organic group having such a structure is preferably an organic group having 4 to 30 carbon atoms, and examples thereof include an alkyl group, a cycloalkyl group, an aryl group, an aralkyl group, and an alkenyl group.

The alkyl group, the cycloalkyl group, the aryl group, the aralkyl group, or the alkenyl group in the alkyl group, the cycloalkyl group, the aryl group, the aralkyl group, or the alkenyl group, each including a functional group with proton-accepting properties or an ammonium group in R, are the same as the alkyl group, the cycloalkyl group, the aryl group, the aralkyl group, or the alkenyl group, mentioned as $R_x$, respectively.

In a case where B is —$N(R_x)R_y$—, it is preferable that R and $R_x$ are bonded to each other to form a ring. By forming a ring structure, the stability is improved and the storage stability of a composition using the ring is improved. The number of carbon atoms which form a ring is preferably 4 to 20, the ring may be monocyclic or polycyclic, and an oxygen atom, and a sulfur atom, or a nitrogen atom may be included in the ring.

Examples of the monocyclic structure include 4-, 5-, 6-, 7-, and 8-membered rings, each including a nitrogen atom. Examples of the polycyclic structure include structures formed by a combination of two, or three or more monocyclic structures.

$R_f$ in —$W_1NHW_2R_f$ represented by Q is preferably an alkyl group having 1 to 6 carbon atoms, which may have a fluorine atom, and more preferably a perfluoroalkyl group having 1 to 6 carbon atoms. Further, it is preferable that at least one of $W_1$ or $W_2$ is —$SO_2$—, and it is more preferable that both of $W_1$ and $W_2$ are —$SO_2$—.

Q is particularly preferably —$SO_3H$ or —$CO_2H$ from the viewpoint of hydrophilicity of acid group.

Among the compounds represented by General Formula (PA-1), the compound in which the Q moiety is sulfonic acid, can be synthesized by a common sulfonamidation reaction. For example, the compound can be obtained by a method of selectively reacting one sulfonyl halide moiety of a bissulfonyl halide compound with an amine compound to form a sulfonamide bond, followed by hydrolysis of another sulfonyl halide moiety thereof, or a method of reacting a cyclic sulfonic acid anhydride with an amine compound to cause ring-opening.

The compound (PA) is preferably an ionic compound. The functional group with proton-accepting properties may be included in an anion moiety or a cation moiety, and it is preferable that the functional group is included in an anion moiety.

Preferred examples of the compound (PA) include compounds represented by General Formulae (4) to (6).

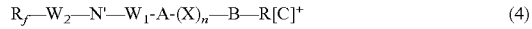  (4)

  (5)

  (6)

In General Formulae (4) to (6), A, X, n, B, R, $R_f$, $W_1$, and $W_2$ each have the same definitions as those, respectively, in General Formula (PA-1).

$C^+$ represents a counter cation.

The counter cation is preferably an onium cation. More specifically, preferred examples thereof include the sulfonium cations described as $S^+(R_{201})(R_{202})(R_{203})$ in General Formula (ZI) and the iodonium cations described as $I^+(R_{204})(R_{205})$ in General Formula (ZII) with regard to the acid generator.

Specific examples of the compound (PA) include the compounds exemplified in <0280> of US2011/0269072A1.

Furthermore, in the present invention, compounds (PA) other than a compound which generates the compound represented by General Formula (PA-1) can also be appropriately selected. For example, a compound containing a proton acceptor moiety at its cation moiety may be used as an ionic compound. More specific examples thereof include a compound represented by General Formula (7).

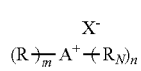    (7)

In the formula, A represents a sulfur atom or an iodine atom.

m represents 1 or 2 and n represents 1 or 2, provided that m+n=3 in a case where A is a sulfur atom and that m+n=2 in a case where A is an iodine atom.

R represents an aryl group.

$R_N$ represents an aryl group substituted with the functional group with proton-accepting properties, and $X^-$ represents a counter anion.

Specific examples of $X^-$ include the same anions as those of the acid generators as described above.

Specific preferred examples of the aryl group of each of R and $R_N$ include a phenyl group.

Specific examples of the functional group with proton-accepting properties contained in $R_N$ are the same as those of the functional group with proton-accepting properties as described above in Formula (PA-1).

Specific examples of the ionic compounds having a proton acceptor site at a cationic moiety include the compounds exemplified in <0291> of US2011/0269072A1.

Furthermore, such compounds can be synthesized, for example, with reference to the methods described in JP2007-230913A, JP2009-122623A, and the like.

The compound (PA) may be used singly or in combination of two or more kinds thereof.

The content of the compound (PA) is preferably 0.1% to 10% by mass, and more preferably 1% to 8% by mass, with respect to the total solid content of the composition.

In the composition of the present invention, an onium salt which becomes a relatively weak acid with respect to the acid generator can be used as an acid diffusion control agent (D).

In a case of mixing the acid generator and the onium salt that generates an acid which is a relatively weak acid (preferably a weak acid having a pKa of more than −1) with respect to an acid generated from the acid generator, and then using the mixture, in a case where the acid generated from the acid generator upon irradiation with actinic rays or radiation collides with an onium salt having an unreacted weak acid anion, a weak acid is discharged by salt exchange, thereby generating an onium salt having a strong acid anion.

In this process, the strong acid is exchanged with a weak acid having a lower catalytic ability, and therefore, the acid is deactivated in appearance, and thus, it is possible to carry out the control of acid diffusion.

As the onium salt which becomes a relatively weak acid with respect to the acid generator, compounds represented by General Formulae (d1-1) to (d1-3) are preferable.

    (d1-1)

    (d1-2)

    (d1-3)

In the formulae, $R^{51}$ is a hydrocarbon group which may have a substituent, $Z^{2c}$ is a hydrocarbon group (provided that carbon adjacent to S is not substituted with a fluorine atom) having 1 to 30 carbon atoms, which may have a substituent, $R^{52}$ is an organic group, $Y^3$ is a linear, branched, or cyclic alkylene group or arylene group, Rf is a hydrocarbon group including a fluorine atom, and $M^+$'s are each independently a sulfonium or iodonium cation.

Preferred examples of the sulfonium cation or the iodonium cation represented by $M^+$ include the sulfonium cations exemplified for the acid generator (ZI) and the iodonium cations exemplified for the acid generator (ZII).

Preferred examples of the anionic moiety of the compound represented by General Formula (d1-1) include the structures exemplified in paragraph [0198] of JP2012-242799A.

Preferred examples of the anionic moiety of the compound represented by General Formula (d1-2) include the structures exemplified in paragraph [0201] of JP2012-242799A.

Preferred examples of the anionic moiety of the compound represented by General Formula (d1-3) include the structures exemplified in paragraphs [0209] and [0210] of JP2012-242799A.

The onium salt which becomes a relatively weak acid with respect to the acid generator may be a compound (hereinafter also referred to as a "compound (D-2)") having a cationic moiety and an anionic moiety in the same molecule, in which the cationic moiety and the anionic moiety are linked to each other through a covalent bond.

As the compound (D-2), a compound represented by any one of General Formulae (C-1) to (C-3) is preferable.

    (C-1)

    (C-2)

    (C-3)

In General Formulae (C-1) to (C-3), $R_1$, $R_2$, and $R_3$ represent a substituent having 1 or more carbon atoms.

$L_1$ represents a divalent linking group that links a cationic moiety with an anionic moiety, or a single bond.

—$X^-$ represents an anionic moiety selected from —COO$^-$, —SO$_3^-$, —SO$_2^-$, and —N$^-$—R$_4$. $R_4$ represents a monovalent substituent having a carbonyl group: —C(=O)—, a sulfonyl group: —S(=O)$_2$—, or a sulfinyl group: —S(=O)— at a site for linking to an adjacent N atom.

$R_1$, $R_2$, $R_3$, $R^4$, and $L_1$ may be bonded to one another to form a ring structure. Further, in (C-3), two of $R_1$ to $R_3$ may be bonded to each other to form a double bond with an N atom.

Examples of the substituent having 1 or more carbon atoms in $R_1$ to $R_3$ include an alkyl group, a cycloalkyl group, an aryl group, an alkyloxycarbonyl group, a cycloalkyloxycarbonyl group, an aryloxycarbonyl group, an alkylaminocarbonyl group, a cycloalkylaminocarbonyl group, and an arylaminocarbonyl group, and preferably an alkyl group, a cycloalkyl group, and an aryl group.

Examples of $L_1$ as a divalent linking group include a linear or branched alkylene group, a cycloalkylene group, an arylene group, a carbonyl group, an ether bond, ester bond, amide bond, a urethane bond, a urea bond, and a group formed by a combination of two or more kinds of these groups. $L_1$ is more preferably an alkylene group, an arylene group, an ether bond, ester bond, and a group formed by a combination of two or more kinds of these groups.

Preferred examples of the compound represented by General Formula (C-1) include the compounds exemplified in paragraphs [0037] to [0039] of JP2013-6827A and paragraphs [0027] to [0029] of JP2013-8020A.

Preferred examples of the compound represented by General Formula (C-2) include the compounds exemplified in paragraphs [0012] and [0013] of JP2012-189977A.

Preferred examples of the compound represented by General Formula (C-3) include the compounds exemplified in paragraphs [0029] to [0031] of JP2012-252124A.

The content of the onium salt which becomes a relatively weak acid with respect to the acid generator is preferably 0.5% to 10.0% by mass, more preferably 0.5% to 8.0% by mass, and still more preferably 1.0% to 8.0% by mass, with respect to the solid content of the composition.

<Solvent>

The composition of the present invention usually contains a solvent.

Examples of the solvent which can be used in the preparation of the composition include organic solvents such as alkylene glycol monoalkyl ether carboxylate, alkylene glycol monoalkyl ether, alkyl lactate ester, alkyl alkoxypropionate, a cyclic lactone (preferably having 4 to 10 carbon atoms), a monoketone compound (preferably having 4 to 10 carbon atoms) which may have a ring, alkylene carbonate, alkyl alkoxyacetate, and alkyl pyruvate.

Specific examples of these solvents include those described in <0441> to <0455> of US2008/0187860A, isoamyl acetate, butyl butanoate, and methyl 2-hydroxyisobutyrate.

In the present invention, a mixed solvent obtained by mixing a solvent containing a hydroxyl group and a solvent containing no hydroxyl group in the structure may be used as the organic solvent.

As the solvent containing a hydroxyl group and the solvent containing no hydroxyl group, the above-mentioned exemplary compounds can be appropriately selected and used, but as the solvent containing a hydroxyl group, an alkylene glycol monoalkyl ether, alkyl lactate, and the like are preferable, and propylene glycol monomethyl ether (PGME, alternative name: 1-methoxy-2-propanol) and ethyl lactate are more preferable. Further, as the solvent containing no hydroxyl group, alkylene glycol monoalkyl ether acetate, alkyl alkoxy propionate, a monoketone compound which may contain a ring, cyclic lactone, alkyl acetate, and the like are preferable. Among these, propylene glycol monomethyl ether acetate (PGMEA, alternative name: 1-methoxy-2-acetoxypropane), ethyl ethoxypropionate, 2-heptanone, γ-butyrolactone, cyclohexanone, and butyl acetate are more preferable, and propylene glycol monomethyl ether acetate, ethyl ethoxypropionate, and 2-heptanone are still more preferable.

The mixing ratio (mass) of the solvent containing a hydroxyl group and the solvent containing no hydroxyl group is 1/99 to 99/1, preferably 10/90 to 90/10, and more preferably 20/80 to 60/40. A mixed solvent whose proportion of the solvent containing no hydroxyl group is 50% by mass or more is particularly preferable from the viewpoint of coating evenness.

The solvent preferably includes propylene glycol monomethyl ether acetate, and is preferably a solvent formed of propylene glycol monomethyl ether acetate singly or a mixed solvent of two or more kinds of solvents including propylene glycol monomethyl ether acetate.

<Other Additives>

The composition of the present invention may or may not contain an onium carboxylate salt. Examples of such an onium carboxylate salt include those described in <0605> and <0606> in the specification of US2008/0187860A.

The onium carboxylate salt can be synthesized by reacting sulfonium hydroxide, iodonium hydroxide, ammonium hydroxide and carboxylic acid with silver oxide in a suitable solvent.

In a case where the composition of the present invention contains the onium carboxylate salt, the content of the salt is generally 0.1% to 20% by mass, preferably 0.5% to 10% by mass, and more preferably 1% to 7% by mass, with respect to the total solid content of the composition.

The composition of the present invention may further contain a surfactant, an acid proliferation agent, a cross-linking agent, a dye, a plasticizer, a light sensitizer, a light absorbent, an alkali-soluble resin, a dissolution inhibitor, a compound promoting solubility in a developer (for example, a phenol compound with a molecular weight of 1,000 or less, an alicyclic or aliphatic compound having a carboxyl group), and the like, if desired.

Such a phenol compound having a molecular weight of 1,000 or less may be easily synthesized by those skilled in the art with reference to the method disclosed in, for example, JP1992-122938A (JP-H04-122938A), JP1990-28531A (JP-H02-28531A), U.S. Pat. No. 4,916,210A, EP219294B, and the like.

Specific examples of the alicyclic compound or aliphatic compound having a carboxyl group include, but not limited to, a carboxylic acid derivative having a steroid structure such as a cholic acid, deoxycholic acid or lithocholic acid, an adamantane carboxylic acid derivative, adamantane dicarboxylic acid, cyclohexane carboxylic acid, and cyclohexane dicarboxylic acid.

The actinic ray-sensitive or radiation-sensitive resin composition of the present invention is preferably a composition for forming an actinic ray-sensitive or radiation-sensitive film having a film thickness of 1 μm or more, and the film thickness of the actinic ray-sensitive or radiation-sensitive film is more preferably 2 µm or more, and still more preferably 3 µm or more.

In addition, the film thickness of the actinic ray-sensitive or radiation-sensitive film is usually 12 µm or less.

In addition, the present invention also relates to an actinic ray-sensitive or radiation-sensitive film formed using the actinic ray-sensitive or radiation-sensitive resin composition of the present invention.

As described above, the actinic ray-sensitive or radiation-sensitive resin composition of the present invention is mainly applied in the formation of a thick resist film (for example, a resist film having a thickness of 1 µm or more).

From the viewpoint of coatability in formation of a thick resist film, and the like, the viscosity of the actinic ray-sensitive or radiation-sensitive resin composition is preferably 100 to 500 mPa·s, more preferably 120 to 480 mPa·s, and still more preferably 150 to 450 mPa·s.

The concentration of the solid content of the composition of the present invention is preferably 20% to 60% by mass, more preferably 20% to 55% by mass, and still more preferably 20% to 50% by mass. Thus, a composition having a viscosity in the range can be suitably prepared.

The concentration of the solid content is the mass percentage of the mass of other resist components excluding the solvent with respect to the total mass of the composition.

The composition of the present invention is used by dissolving the components in a predetermined organic solvent, and preferably in the mixed solvent, filtering the solution through a filter, and then applying the filtered solution on a predetermined substrate. The filter for use in filtration is preferably a polytetrafluoroethylene-, polyethylene-, or nylon-made filter having a pore size of 0.1 µm or less, more preferably 0.05 µm or less, and still more preferably 0.03 µm or less. In the filtration through a filter, as described in, for example, JP2002-62667A, circulating filtration may be carried out, or the filtration may be carried out by connecting plural kinds of filters in series or in parallel. In addition, the composition may be filtered in plural times. Furthermore, the composition may be subjected to a deaeration treatment or the like before or after filtration through a filter.

[Pattern Forming Method]

Next, the pattern forming method of the present invention will be described.

The pattern forming method of the present invention is a pattern forming method including:

(i) a step of forming an actinic ray-sensitive or radiation-sensitive film having a film thickness of 1 µm or more (hereinafter also simply referred to as a film) on a substrate, using an actinic ray-sensitive or radiation-sensitive resin composition (film forming step), (ii) a step of irradiating the actinic ray-sensitive or radiation-sensitive film with actinic rays or radiation (exposing step), and (iii) a step of developing the actinic ray-sensitive or radiation-sensitive film irradiated with the actinic rays or radiation, using a developer (developing step).

It is preferable that the pattern forming method of the present invention includes (iv) a heating step after (ii) the exposing step.

The pattern forming method of the present invention may include (ii) the exposing step in plural times.

The pattern forming method of the present invention may include (iv) the heating step in plural times.

In the pattern forming method of the present invention, the step of forming a film from the composition of the present invention on a substrate, the step of exposing the film, and the developing step can be carried out by generally known methods.

Particularly, examples of the step of forming a film on a substrate include a method in which the composition is applied onto a substrate, and as the application method, application procedures in the related art (for example, a resist composition is added dropwise, and then the rotation speed of the substrate is increased, and a rotation speed such that the film thickness is determined is maintained) can be used. Further, in a case of applying a composition having high viscosity onto a substrate in order to form a thick resist film, unevenness thickness of the resist film may occur by ordinary methods in some cases, which can be solved by the following method. The method is as follows: first, a resist composition is added dropwise onto a substrate, then the rotation speed of the substrate is maintained at a first intermediate speed and then at a second low speed to apply the resist composition stepwise, and thereafter, the film thickness is determined. Preferably, in the step of applying the resist composition wide, it is preferable that the step of maintaining the first intermediate speed and the step of maintaining the second low speed are alternately repeated in plural times. In addition, the rotation speed in the first intermediate speed is preferably 300 rpm to 1,000 rpm, and the rotation speed in the second low speed is preferably 50 rpm to 200 rpm.

The substrate on which the film is formed in the present invention is not particularly limited, and a substrate such as an inorganic substrate such as silicon, SiN, $SiO_2$, and SiN, and a coating type inorganic substrate such as SOG, which are generally used in a process for manufacturing a semiconductor such as an IC, and a process for manufacture of a circuit board for a liquid crystal, a thermal head, or the like; and in other lithographic processes of photofabrication, can be used. In addition, an antireflection film may further be formed between the resist film and the substrate, as desired. As the antireflection film, a known organic or inorganic antireflection film can be appropriately used.

As described above, the film thickness of a film formed using the actinic ray-sensitive or radiation-sensitive resin composition in the pattern forming method of the present invention is 1 µm or more, more preferably 2 µm or more, and still more preferably 3 µm or more. In addition, the film thickness of the film is usually 12 µm or less.

It is also preferable that the method includes a preheating step (PB; prebake) before an exposing step which will be described later, after forming a film.

Furthermore, it is also preferable that the method includes a step of post-exposure heating (PEB: post-exposure bake) after the exposing step and before the developing step.

For both of PB and PEB, heating is carried out at a heating temperature of preferably 70° C. to 130° C., and more preferably 80° C. to 120° C.

The heating time is preferably 30 to 300 seconds, more preferably 30 to 180 seconds, and still more preferably 30 to 90 seconds.

Heating may be carried out using a means equipped in ordinary exposure and development machines, or may also be carried out using a hot plate or the like.

Baking accelerates the reaction in the exposed areas, and thus, the sensitivity and the pattern profile are enhanced.

The light source wavelength used in the exposure device used in the present step is not particularly limited, and examples thereof include infrared rays, visible light, ultraviolet rays, far ultraviolet rays, extreme ultraviolet rays, X-rays, and electron beams, for example, far ultraviolet rays at a wavelength of preferably 250 nm or less, more preferably 220 nm or less, and still more preferably 1 to 200 nm, specifically a KrF excimer laser (248 nm), an ArF excimer laser (193 nm), an $F_2$ excimer laser (157 nm), X-rays, extreme ultraviolet (EUV) (13 nm), electron beams, and the like, with the KrF excimer laser, the ArF excimer laser, EUV, or the electron beams being preferable, and the KrF excimer laser or the ArF excimer laser being more preferable. That is, as the exposure light, KrF light is preferably used.

As the exposure, grayscale exposure is preferably carried out.

Grayscale exposure is to subject a resist film to an exposure treatment through a mask having a predetermined dot formed such that a desired shape may be obtained and predetermined light transmittance is obtained. That is, it is an exposure treatment which can provide gradation in the height of the obtained pattern (resist pattern) by irradiating the mask having fine apertures with light.

Moreover, a liquid immersion exposure method can be applied to the step of carrying out the exposure of the present invention. It is possible to combine the liquid immersion exposure method with super-resolution technology such as a phase shift method and a modified illumination method.

In a case of carrying out the liquid immersion exposure, a step of washing the surface of the film with a water-based chemical may be carried out (1) before the step of forming the film on the substrate and then exposing the film and/or (2) before the step of heating the film after the step of subjecting the film to exposure through an immersion liquid.

The immersion liquid is preferably a liquid which is transparent to exposure wavelength and possibly has a minimum temperature coefficient of a refractive index so as to minimize the distortion of an optical image projected on the film. In particular, in a case where the exposure light source is ArF excimer laser (wavelength; 193 nm), water is preferable in terms of easy availability and easy handling, in addition to the above-mentioned viewpoints.

In a case of using water, an additive (liquid) that decreases the surface tension of water while increasing the interfacial activity may be added at a slight proportion. It is preferable that this additive does not dissolve the resist film on a wafer, and has a negligible effect on the optical coat at the undersurface of a lens element.

Such an additive is preferably an aliphatic alcohol having a refractive index almost equal to that of water, and specific examples thereof may include methyl alcohol, ethyl alcohol, and isopropyl alcohol. By adding an alcohol having a refractive index almost equal to that of water, even in a case where the alcohol component in water is evaporated and the content concentration thereof is changed, it is possible to obtain an advantage in that the change in the refractive index of the liquid as a whole can be made very small.

Meanwhile, in a case where a substance opaque in 193 nm rays or an impurity having a refractive index greatly different from that of water is incorporated therein, the incorporation would cause a distortion of an optical image projected on the resist film, and thus, it is preferable to use distilled water as the water. In addition, pure water having been filtered through an ion exchange filter or the like may also be used.

The electrical resistance of water to be used as an immersion liquid is desirably 18.3 MΩcm or more, and an organic matter concentration (TOC) thereof is desirably 20 ppb or less, and the water is desirably subjected to a deaeration treatment.

Furthermore, it is possible to enhance the lithography performance by increasing the refractive index of the immersion liquid. From such a viewpoint, an additive for increasing the refractive index may be added to the water, or heavy water ($D_2O$) may be used instead of water.

A receding contact angle of the resist film is preferably 70° or more at a temperature of 23±3° C. and a humidity of 45±5%, and this is suitable to a case of performing exposure through a liquid immersion medium. Further, the receding contact angle is more preferably 75° or more, and still more preferably 75° to 85°.

In a case where the receding contact angle is extremely small, it cannot be suitably used in a case of performing exposure through a liquid immersion medium, and further, an effect of reducing watermark defect cannot be sufficiently exhibited. In order to realize a preferable receding contact angle, it is preferable to incorporate a hydrophobic resin which will be described later into the composition. Alternatively, a film (hereinafter also referred to as a "topcoat") sparingly soluble in an immersion liquid, which is formed with the hydrophobic resin, may be provided on the upper layer of the resist film. The topcoat may be provided on the upper layer of a resist film including the hydrophobic resin. The functions required for the topcoat are coating suitability on the upper layer part of the resist film, and sparing solubility in an immersion liquid. It is preferable that the topcoat is not mixed with the resist film and can be uniformly applied onto the upper layer of the resist film.

Specific examples of materials constituting the topcoat include a hydrocarbon polymer, an acrylic acid ester polymer, a polymethacrylic acid, a polyacrylic acid, a polyvinyl ether, a silicon-containing polymer, and a fluorine-containing polymer. From the viewpoint that an optical lens is contaminated in a case where impurities are eluted from the topcoat to the immersion liquid, it is preferable that the amounts of residual monomer components of the polymer included in the topcoat are small. The topcoat may include a basic compound.

For the release of the topcoat, a developer may be used, or a release agent may separately be used. As the release agent, a solvent that is rarely permeated into the film is preferable. In a view that the releasing step can be performed simultaneously with the developing step of the film, it is preferable that the topcoat is released by a developer including an organic solvent.

In a case where there is no difference in the refractive index between the topcoat and the immersion liquid. In this case, the resolving power is improved. In a case where water is used as the immersion liquid, the topcoat preferably has a refractive index close to that of the immersion liquid. From the viewpoint that the refractive index is close to that of the immersion liquid, the topcoat preferably has a fluorine atom. Further, a thin film is preferable from the viewpoints of transparency and the refractive index.

It is preferable that the topcoat is not mixed with the film and the immersion liquid. From this viewpoint, in a case where the immersion liquid is water, it is preferable that a solvent used for the topcoat is sparingly soluble in a solvent used for the composition of the present invention and is a water-insoluble medium. Further, in a case where the immersion liquid is an organic solvent, the topcoat may be water-soluble or water-insoluble.

Formation of the topcoat is not limited to a case of the liquid immersion exposure, and may also be carried out in a case of dry exposure (exposure not through an immersion liquid). By forming the topcoat, for example, generation of out-gases can be suppressed.

Hereinafter, the topcoat composition used for formation of the topcoat will be described.

The topcoat composition in the present invention preferably contains an organic solvent as the solvent, and the organic solvent is more preferably an alcohol-based solvent.

In a case where the solvent is the organic solvent, a solvent that does not dissolve the resist film is preferable. As the available solvent, an alcohol-based solvent, a fluorine-based solvent, or a hydrocarbon-based solvent are preferable, and a non-fluorine alcohol-based solvent is more preferable. As the alcohol-based solvent, a primary alcohol is preferable, and a primary alcohol having 4 to 8 carbon atoms is more preferable, from the viewpoint of coatability. As the primary alcohol having 4 to 8 carbon atoms, linear, branched, and cyclic alcohols can be used, but preferred examples thereof include 1-butanol, 1-hexanol, 1-pentanol, 3-methyl-1-butanol, 2-ethylbutanol, and perfluorobutyl tetrahydrofuran.

In addition, as the resin for the topcoat composition, the resin having an acidic group described in JP2009-134177A and JP2009-91798A can be preferably used.

The weight-average molecular weight of the resin is not particularly limited, but is preferably 2,000 to 1,000,000, more preferably 5,000 to 500,000, and still more preferably 10,000 to 100,000. Here, the weight-average molecular weight of the resin represents a molecular weight in terms of polystyrene, measured by gel permeation chromatography (GPC) (carrier: tetrahydrofuran (THF) or N-methyl-2-pyrrolidone (NMP)).

The pH of the topcoat composition is not particularly limited, but is preferably 0 to 10, more preferably 0 to 8, and still more preferably 1 to 7.

The topcoat composition may contain additives such as a photoacid generator and a nitrogen-containing basic compound. Examples of the topcoat composition containing the nitrogen-containing basic compound include those in US2013/0244438A.

The concentration of the resin in the topcoat composition is preferably 0.1% to 10% by mass, more preferably 0.2% to 5% by mass, and still more preferably 0.3% to 3% by mass. The topcoat composition includes components other than the resin, and the proportion of the resin occupied in the solid content of the topcoat composition is preferably 80% to 100% by mass, more preferably 90% to 100% by mass, and still more preferably 95% to 100% by mass.

The concentration of the solid content of the topcoat composition in the present invention is preferably 0.1% to 10% by mass, more preferably 0.2% to 6% by mass, and still more preferably 0.3% to 5% by mass. By setting the concentration of the solid content within the range, the topcoat composition can be uniformly applied onto the resist film.

In the pattern forming method of the present invention, the resist film can be formed on a substrate, using the composition, and a topcoat can also be formed on the resist film, using the topcoat composition. The film thickness of the resist film is preferably 10 to 100 nm, and the film thickness of the topcoat is preferably 10 to 200 nm, more preferably 20 to 100 nm, and still more preferably 40 to 80 nm.

A method for forming the topcoat is not particularly limited, but the topcoat can be formed by applying and drying the topcoat composition by the same means as the method for forming the resist film.

The resist film having the topcoat thereon is irradiated with actinic rays or radiation, usually through a mask, preferably baked (heated), and developed, whereby a good pattern can be obtained.

In the liquid immersion exposure step, it is necessary for the immersion liquid to move on a wafer following the movement of an exposure head which scans the wafer at a high speed to form an exposed pattern. Therefore, the contact angle of the immersion liquid for the resist film in a dynamic state is important, and the resist is required to have a performance of allowing the immersion liquid to follow the high-speed scanning of an exposure head with no remaining of a liquid droplet.

The developer used in the step of developing the film using the composition of the present invention is not particularly limited, but examples thereof include an alkali developer or a developer containing an organic solvent (the developer is hereinafter also referred to an organic developer), with the alkali developer being preferable.

As the alkali developer, for example, aqueous alkali solutions of inorganic alkalis such as sodium hydroxide, potassium hydroxide, sodium carbonate, sodium silicate, sodium metasilicate, and aqueous ammonia, primary amines such as ethylamine and n-propylamine, secondary amines such as diethylamine and di-n-butylamine, tertiary amines such as triethylamine and methyldiethylamine, alcohol amines such as dimethylethanolamine and triethanolamine, quaternary ammonium salts such as tetraalkylammonium hydroxides such as tetramethylammonium hydroxide, tetraethylammonium hydroxide, tetrapropylammonium hydroxide, tetrabutylammonium hydroxide, tetrapentylammonium hydroxide, tetrahexylammonium hydroxide, tetraoctylammonium hydroxide, ethyltrimethylammonium hydroxide, butyltrimethylammonium hydroxide, methyltriamylammonium hydroxide, and dibutyldipentylammonium hydroxide, trimethylphenylammonium hydroxide, trimethylbenzylammonium hydroxide, and triethylbenzylammonium hydroxide, cyclic amines such as pyrrole and piperidine, or the like can be used. Further, alcohols and a surfactant can also be added to the aqueous alkali solution in an appropriate amount before use. The alkali concentration of the alkali developer is usually 0.1% to 20% by mass. The pH of the alkali developer is usually 10.0 to 15.0. It is possible to appropriately adjust and use the alkali concentration and the pH of the alkali developer. The alkali developer may also be used after adding a surfactant or an organic solvent thereto.

As the rinsing liquid in the rinsing treatment carried out after the alkali development, pure water is used, and the rinsing liquid can also be used after adding an appropriate amount of a surfactant thereto.

In addition, after the developing treatment or the rinsing treatment, a treatment of removing the developer or rinsing liquid adhering to the pattern by a supercritical fluid can be carried out.

As the organic developer, a polar solvent such as a ketone-based solvent, an ester-based solvent, an alcohol-based solvent, an amide-based solvent, or an ether-based solvent, and a hydrocarbon-based solvent can be used, and specific examples thereof include the solvents described in paragraph <0507> of JP2013-218223A, and isoamyl acetate, butyl butanoate, butyl butyrate, and methyl 2-hydroxyisobutyrate.

The above-mentioned solvents can be used by mixing a plurality of the solvents or by mixing the solvents with solvents other than the solvents or water. However, in order to sufficiently exhibit the effects of the present invention, the moisture content in the entire developer is preferably less than 10% by mass, but a developer having substantially no water is more preferable.

That is, the amount of the organic solvent to be used with respect to the organic developer is preferably from 90% by mass to 100% by mass, and preferably from 95% by mass to 100% by mass, with respect to the total amount of the developer.

In particular, the organic developer is preferably a developer containing at least one organic solvent selected from the group consisting of a ketone-based solvent, an ester-based solvent, an alcohol-based solvent, an amide-based solvent, and an ether-based solvent.

The vapor pressure of the organic developer is preferably 5 kPa or less, more preferably 3 kPa or less, and particularly preferably 2 kPa or less, at 20° C. By setting the vapor pressure of the organic developer to 5 kPa or less, the evaporation of the developer on the substrate or in a developing cup is suppressed, the temperature uniformity in the wafer surface is improved, and as a result, the dimensional uniformity within a wafer surface is improved.

It is possible to add an appropriate amount of a surfactant to the organic developer, as desired.

The surfactant is not particularly limited, but it is possible to use, for example, ionic or non-ionic fluorine-based and/or silicon-based surfactants, or the like. Examples of the fluorine-based and/or silicon-based surfactant include the surfactants described in JP1987-36663A (JP-S62-36663A), JP1986-226746A (JP-S61-226746A), JP1986-226745A (JP-S61-226745A), JP1987-170950A (JP-S62-170950A), JP1988-34540A (JP-S63-34540A), JP1995-230165A (JP-H7-230165A), JP1996-62834A (JP-H8-62834A), JP1997-54432A (JP-H9-54432A), JP1997-5988A (JP-H9-5988A), U.S. Pat. Nos. 5,405,720A, 5,360,692A, 5,529,881A, 5,296,330A, 5,436,098A, 5,576,143A, 5,294,511 A, and 5,824,451A, and non-ionic surfactants are preferable. The non-ionic surfactant is not particularly limited, but it is more preferable to use a fluorine-based surfactant or a silicon-based surfactant.

The amount of the surfactant to be used is usually 0.001% to 5% by mass, preferably 0.005% to 2% by mass, and more preferably 0.01% to 0.5% by mass, with respect to the total amount of the developer.

The organic developer may include a basic compound. Specific and preferred examples of the basic compound which can be included in the organic developer used in the present invention are the same ones as for the basic compound which can be included in the composition, as an acid diffusion control agent (D) which will be described later.

Examples of the developing method include a method in which a substrate is immersed in a tank filled with a developer for a certain period of time (a dip method), a method in which development is performed by heaping a developer up onto the surface of a substrate by surface tension, and then stopping it for a certain period of time (a puddle method), a method in which a developer is sprayed on the surface of a substrate (a spray method), and a method in which a developer is continuously discharged onto a substrate spun at a constant rate while scanning a developer discharging nozzle at a constant rate (a dynamic dispense method).

In a case where the various developing methods include a step of discharging a developer toward a resist film from a development nozzle of a developing device, the discharge pressure of the developer discharged (the flow rate per unit area of the developer discharged) is preferably 2 mL/sec/mm$^2$ or less, more preferably 1.5 L/sec/mm$^2$ or less, and still more preferably 1 mL/sec/mm$^2$ or less. The flow rate has no particular lower limit, but is preferably 0.2 mL/sec/mm$^2$ or more in consideration of throughput.

By setting the discharge pressure of the discharged developer to the above-mentioned range, pattern defects resulting from the resist scum after development can be significantly reduced.

Details on the mechanism are not clear, but it is thought that it is due to the pressure imposed on the resist film by the developer being decreased by setting the discharge pressure to the above-described range so that the resist film and/or the resist pattern is suppressed from being inadvertently cut or collapsing.

In addition, the discharge pressure (mL/sec/mm$^2$) of the developer is the value at the outlet of the development nozzle in the developing device.

Examples of the method for adjusting the discharge pressure of the developer include a method of adjusting the discharge pressure by a pump, and a method of supplying a developer from a pressurized tank and adjusting the pressure to change the discharge pressure.

In addition, after the step of performing development, using a developer including an organic solvent, a step of stopping the development while replacing the solvent with another solvent may be carried out.

In the pattern forming method of the present invention, a step of performing development by using a developer including an organic solvent (organic solvent developing step) and a step of carrying out development by using an aqueous alkali solution (alkali developing step) may be used in combination. Thus, a finer pattern can be formed.

In the present invention, an area with a low exposure intensity is removed in the organic solvent developing step, and by further carrying out the alkali developing step, an area with a high exposure intensity is also removed. By virtue of multiple development processes in which development is carried out in a plurality of times in such a manner, a pattern can be formed by keeping only a region with an intermediate exposure intensity from not being dissolved, so that a finer pattern than usual can be formed (the same mechanism as in <0077> of JP2008-292975A).

In the pattern forming method of the present invention, the order of the alkali developing step and the organic solvent developing step is not particularly limited, but it is more preferable that the alkali development is carried out before the organic solvent developing step.

It is preferable that a step of performing washing using a rinsing liquid is carried out after the step of performing development using a developer including an organic solvent.

The rinsing liquid used in the rinsing step after the step of performing development using a developer including an organic solvent is not particularly limited as long as the rinsing liquid does not dissolve the resist pattern, and a solution including a common organic solvent can be used. As the rinsing liquid, a rinsing liquid containing at least one organic solvent selected from the group consisting of a hydrocarbon-based solvent, a ketone-based solvent, an ester-based solvent, an alcohol-based solvent, an amide-based solvent, and an ether-based solvent is preferably used.

Specific examples of the hydrocarbon-based solvent, the ketone-based solvent, the ester-based solvent, the alcohol-based solvent, the amide-based solvent, and the ether-based solvent include the same solvents as those described for the developer including an organic solvent.

After the developing step using a developer including an organic solvent, it is more preferable to carry out a step of performing washing using a rinsing liquid containing at least one organic solvent selected from the group consisting of a ketone-based solvent, an ester-based solvent, an alcohol-based solvent, an amide-based solvent, and a hydrocarbon-based solvent, it is still more preferable to carry out a step of performing washing using a rinsing liquid containing an alcohol-based solvent or an ester-based solvent, it is particularly preferable to carry out a step of performing washing using a rinsing liquid containing a monohydric alcohol, and it is the most preferable to carry out a step of performing washing using a rinsing liquid containing a monohydric alcohol having 5 or more carbon atoms.

Here, examples of the monohydric alcohol used in the rinsing step include linear, branched, or cyclic monohydric alcohols, and specifically, 1-butanol, 2-butanol, 3-methyl-1-butanol, tert-butyl alcohol, 1-pentanol, 2-pentanol, 1-hexanol, 4-methyl-2-pentanol, 1-heptanol, 1-octanol, 2-hexanol, cyclopentanol, 2-heptanol, 2-octanol, 3-hexanol, 3-heptanol, 3-octanol, and 4-octanol, with a monohydric alcohol having 5 or more carbon atoms, such as 1-hexanol, 2-hexanol, 4-methyl-2-pentanol, 1-pentanol, 3-methyl-1-butanol, being preferable.

The rinsing liquid containing the hydrocarbon-based solvent is preferably a hydrocarbon compound having 6 to 30 carbon atoms, more preferably a hydrocarbon compound having 8 to 30 carbon atoms, still more preferably a hydrocarbon compound having 7 to 30 carbon atoms, and particularly preferably a hydrocarbon compound having 10 to 30 carbon atoms. By using a rinsing liquid including decane and/or undecane among these, pattern collapse is suppressed.

The respective components in plural numbers may be mixed, or the components may be mixed with an organic solvent other than the above solvents, and used.

The moisture content of the rinsing liquid is preferably 10% by mass or less, more preferably 5% by mass or less, and still more preferably 3% by mass or less. By setting the moisture content to 10% by mass or less, good development characteristics can be obtained.

The vapor pressure at 20° C. of the rinsing liquid which is used after the step of carrying out development using a developer including an organic solvent is preferably 0.05 kPa to 5 kPa, more preferably 0.1 kPa to 5 kPa, and still more preferably 0.12 kPa to 3 kPa. By setting the vapor pressure of the rinsing liquid to 0.05 kPa to 5 kPa, the temperature uniformity within a wafer surface is improved, and further, the dimensional uniformity within a wafer surface is enhanced by suppression of swelling due to the permeation of the rinsing liquid.

An appropriate amount of a surfactant may be added to the rinsing liquid.

In the rinsing step, a washing treatment is performed using a rinsing liquid. A method for the washing treatment is not particularly limited, and examples thereof include a method in which a rinsing liquid is continuously discharged on a substrate spun at a constant rate (a rotation application method), a method in which a substrate is immersed in a tank filled with a rinsing liquid for a certain period of time (a dip method), and a method in which a rinsing liquid is sprayed on a substrate surface (a spray method). Among these, a method in which a washing treatment is carried out using a rotation application method, and a substrate is rotated at a rotation speed of 2,000 rpm to 4,000 rpm after washing, thereby removing the rinsing liquid from the substrate, is preferable. Further, it is preferable that a heating step (post-bake) is carried out after the rinsing step. The residual developer and the rinsing liquid between and inside the patterns are removed by the baking. The heating step after the rinsing step is carried out at usually 40° C. to 160° C., and preferably at 70° C. to 95° C., and usually for 10 seconds to 3 minutes, and preferably for 30 seconds to 90 seconds.

It is preferable that various materials (for example, a resist solution, a developer, a rinsing liquid, a composition for forming an antireflection film, and a composition for forming a topcoat) used in the actinic ray-sensitive or radiation-sensitive resin composition of the present invention and the pattern forming method of the present invention do not include impurities such as metals. The content of the impurities included in these materials is preferably 1 ppm or less, more preferably 10 ppb or less, still more preferably 100 ppt or less, particularly preferably 10 ppt or less, and most preferably 1 ppt or less.

Examples of a method for removing impurities such as metals from the various materials include filtration using a filter. As for the filter pore diameter, the pore size is preferably 10 nm or less, more preferably 5 nm or less, and still more preferably 3 nm or less. As for the materials of a filter, a polytetrafluoroethylene-made filter, a polyethylene-made filter, and a nylon-made filter are preferable. The filter may be formed of a composite material formed by combining these materials with an ion exchange medium. As the filter, a filter which had been washed with an organic solvent in advance may be used. In the step of filtration using a filter, plural kinds of filters may be connected in series or in parallel, and used. In a case of using plural kinds of filters, a combination of filters having different pore diameters and/or materials may be used. In addition, various materials may be filtered plural times, and a step of filtering plural times may be a circulatory filtration step.

Moreover, examples of the method for reducing the impurities such as metals included in the various materials include a method involving selecting raw materials having a small content of metals as raw materials constituting various materials, a method involving subjecting raw materials constituting various materials to filtration using a filter, and a method involving performing distillation under the condition with contamination being suppressed to the largest degree by, for example, lining the inside of a device with TEFLON (registered trademark). The preferred conditions for filtration using a filter, which is carried out for raw materials constituting various materials, are the same as described above.

In addition to the filtration using a filter, removal of impurities by an adsorbing material may be carried out, or a combination of filtration using a filter and an adsorbing material may be used. As the adsorbing material, known adsorbing materials can be used, and for example, inorganic adsorbing materials such as silica gel and zeolite, and organic adsorbing materials such as activated carbon can be used.

It is necessary to prevent the incorporation of metal impurities in the production process in order to reduce the impurities such as metals included in the various materials. Sufficient removal of metal impurities from a production device can be checked by measuring the content of metal components included in a washing liquid used to wash the production device. The content of the metal components included in the washing liquid after the use is preferably 100 parts per trillion (ppt) or less, more preferably 10 ppt or less, and particularly preferably 1 ppt or less.

A method for improving the surface roughness of a pattern may be applied to the pattern formed by the pattern forming method of the present invention. Examples of the method for improving the surface roughness of a pattern include the method of treating a resist pattern by a plasma of a hydrogen-containing gas disclosed in WO2014/002808. In addition, known methods as described in JP2004-235468A, US2010/0020297A, JP2009-19969A, and Proc. of SPIE Vol.

8328 83280N-1 "EUV Resist Curing Technique for LWR Reduction and Etch Selectivity Enhancement" may be applied.

The pattern forming method of the present invention can be used for a guide pattern formation in a directed self-assembly (DSA) (see, for example, ACS Nano Vol. 4. No. 8. Pages 4815 to 4823).

In addition, a resist pattern formed by the method can be used as a core material (core) of the spacer process disclosed in JP1991-270227A (JP-H03-270227A) and JP2013-164509A.

In addition, the present invention further relates to a method for manufacturing an electronic device, including the pattern forming method of the present invention as described above, and an electronic device manufactured by the method for manufacturing an electronic device.

The electronic device of the present invention is suitably mounted on electric or electronic equipment (home electronics, OA/media-related equipment, optical equipment, telecommunication equipment, and the like).

EXAMPLES

Hereinafter, the present invention will be described with reference to Examples, but the present invention is not limited thereto.

<Preparation of Actinic Ray-Sensitive or Radiation-Sensitive Resin Composition>

The components shown in Table 1 were dissolved in a solvent to prepare a resist solution, respectively, which was filtered through a polyethylene filter having a pore size of 3 μm. Thus, an actinic ray-sensitive or radiation-sensitive resin composition (resist composition) having a concentration of the solid content described in Table 1 was prepared.

The resist compositions used for the evaluation in Table 1 are set forth below. Here, with respect to the respective components (provided that with respect to the resin (A) and the compound (B), the total of the both) other than the solvents, the addition amounts (% by mass) mean % by mass with respect to the solid contents other than the solvents. The ratios of the respective components in the sections of the resin (A) and the compound (B) are ratios based on weight in the case where the total of the resin (A) and the compound (B) were taken as 100. The numerical values in the parentheses in the examples in which two kinds of the acid generators and the acid diffusion control agents were used represent the contents (% by mass) of the compounds with respect to the total solid content of the composition. The numerical values in the section of the solvent represent the mass ratios of the main solvents to the auxiliary solvents.

TABLE 1

| | Resin (A) | | Compound (B) | | | | Resin (A) + compound (B) | Acid generator | | Acid diffusion control agent | |
| | Resin | Ratio | Resin to be added | Ratio | Additive | Ratio | % by mass | Compound | % by mass | Compound | % by mass |
|---|---|---|---|---|---|---|---|---|---|---|---|
| Example 1 | A-1 | 75 | B-1 | 25 | — | — | 97.35 | E-1 | 2.5 | F-1 | 0.1 |
| Example 2 | A-1 | 70 | B-2 | 30 | — | — | 97.35 | E-3 | 2.5 | F-1 | 0.1 |
| Example 3 | A-1 | 75 | B-3 | 25 | — | — | 97.35 | E-2 | 2.5 | F-1 | 0.1 |
| Example 4 | A-2 | 60 | B-1 | 40 | — | — | 97.35 | E-1 | 2.5 | F-1 | 0.1 |
| Example 5 | A-2 | 75 | B-2 | 25 | — | — | 97.35 | E-2 | 2.5 | F-1 | 0.1 |
| Example 6 | A-2 | 70 | B-3 | 30 | — | — | 97.35 | E-2 | 2.5 | F-1 | 0.1 |
| Example 7 | A-3 | 70 | B-1 | 30 | — | — | 97.35 | E-1 | 2.5 | F-1 | 0.1 |
| Example 8 | A-3 | 70 | B-2 | 30 | — | — | 97.35 | E-3 | 2.5 | F-1 | 0.1 |
| Example 9 | A-3 | 70 | B-3 | 30 | — | — | 97.35 | E-4 | 2.5 | F-2 | 0.1 |
| Example 10 | A-1 | 90 | — | — | C | 10 | 97.35 | E-1 | 2.5 | F-3 | 0.1 |
| Example 11 | A-2 | 80 | — | — | C | 20 | 97.35 | E-3 | 2.5 | F-4 | 0.1 |
| Example 12 | A-3 | 80 | — | — | C | 20 | 97.35 | E-1 | 2.5 | F-5 | 0.1 |
| Example 13 | A-3 | 70 | B-2 | 30 | — | — | 97.35 | E-1 (1.0)/ E-3 (1.5) | 2.5 | F-1 | 0.1 |
| Example 14 | A-3 | 70 | B-3 | 30 | — | — | 97.35 | E-4 | 2.5 | F-1(0.08)/ F-2(0.02) | 0.1 |
| Example 15 | A-3 | 70 | B-3 | 30 | — | — | 97.35 | E-1 (1.0)/ E-3 (1.5) | 2.5 | F-1(0.08)/ F-2(0.02) | 0.1 |
| Example 16 | A-3 | 70 | B-2 | 30 | — | — | 97.4 | E-1 (1.0)/ E-3 (1.5) | 2.5 | F-1 | 0.1 |
| Example 17 | A-1 | 90 | B-1/B-2 | 5/5 | — | — | 97.35 | E-1 | 2.5 | F-1 | 0.1 |
| Example 18 | A-1/A-2 | 25/25 | B-1 | 50 | — | — | 97.35 | E-1 | 2.5 | F-1 | 0.1 |
| Example 19 | A-1 | 90 | — | — | C-1 | 10 | 97.35 | E-1 | 2.5 | F-1 | 0.1 |
| Example 20 | A-2 | 90 | — | — | C-2 | 10 | 97.35 | E-4 | 2.5 | F-1(0.08)/ F-2(0.02) | 0.1 |
| Example 21 | A-3 | 90 | — | — | C-3 | 10 | 97.35 | E-3 | 2.5 | F-1 | 0.1 |
| Example 22 | A-1 | 90 | — | — | C-4 | 10 | 97.35 | E-4 | 2.5 | F-3 | 0.1 |
| Example 23 | A-2 | 90 | — | — | C-5 | 10 | 97.35 | E-2 | 2.5 | F-5 | 0.1 |
| Example 24 | A-3 | 90 | — | — | C-6 | 10 | 97.35 | E-2 | 2.5 | F-2 | 0.1 |
| Comparative Example 1 | A-1 | 100 | — | — | — | — | 97.35 | E-1 | 2.5 | F-2 | 0.1 |
| Comparative Example 2 | B-1 | 100 | — | — | — | — | 97.35 | E-2 | 2.5 | F-2 | 0.1 |
| Comparative Example 3 | B-2 | 100 | — | — | — | — | 97.35 | E-2 | 2.5 | F-3 | 0.1 |
| Comparative Example 4 | B-3 | 100 | — | — | — | — | 97.35 | E-3 | 2.5 | F-4 | 0.1 |
| Comparative Example 5 | D-1 | 100 | — | — | — | — | 97.35 | E-5 | 2.5 | F-1 | 0.1 |
| Comparative Example 6 | D-1 | 80 | D-2 | 20 | — | — | 97.35 | E-5 | 2.5 | F-2 | 0.1 |

TABLE 1-continued

| | | | | | | | | | | |
|---|---|---|---|---|---|---|---|---|---|---|
| Comparative Example 7 | D-3 | 100 | — | — | — | — | 97.35 | E-4 | 2.5 | F-1 | 0.1 |

| | Surfactant | | Solvent | | solid content | Viscosity |
|---|---|---|---|---|---|---|
| | Compound | % by mass | Main solvent | Auxiliary solvent | (content %) | (mPa · s) |
| Example 1 | W-1 | 0.05 | PGMEA 80 | PGME 20 | 30 | 260 |
| Example 2 | W-1 | 0.05 | PGMEA 80 | PGME 20 | 32 | 271 |
| Example 3 | W-1 | 0.05 | PGMEA 80 | PGME 20 | 34 | 281 |
| Example 4 | W-1 | 0.05 | PGMEA 80 | PGME 20 | 35 | 287 |
| Example 5 | W-1 | 0.05 | PGMEA 80 | PGME 20 | 35 | 287 |
| Example 6 | W-1 | 0.05 | PGMEA 80 | PGME 20 | 35 | 287 |
| Example 7 | W-1 | 0.05 | PGMEA 80 | PGME 20 | 34 | 281 |
| Example 8 | W-1 | 0.05 | PGMEA 80 | PGME 20 | 35 | 287 |
| Example 9 | W-1 | 0.05 | PGMEA 80 | PGME 20 | 29 | 255 |
| Example 10 | W-1 | 0.05 | PGMEA 80 | PGME 20 | 32 | 290 |
| Example 11 | W-1 | 0.05 | PGMEA 80 | EEP 20 | 40 | 320 |
| Example 12 | W-1 | 0.05 | PGMEA 80 | PGME 20 | 32 | 305 |
| Example 13 | W-1 | 0.05 | PGMEA 80 | EL 20 | 42 | 324 |
| Example 14 | W-1 | 0.05 | PGMEA 80 | PGME 20 | 34 | 281 |
| Example 15 | W-1 | 0.05 | PGMEA 80 | PGME 20 | 32 | 271 |
| Example 16 | — | 0 | PGMEA 80 | MAK 20 | 45 | 340 |
| Example 17 | W-1 | 0.05 | PGMEA 80 | PGME 20 | 37 | 295 |
| Example 18 | W-1 | 0.05 | PGMEA 80 | PGME 20 | 35 | 270 |
| Example 19 | W-1 | 0.05 | PGMEA 80 | PGME 20 | 33 | 295 |
| Example 20 | W-1 | 0.05 | PGMEA 80 | PGME 20 | 35 | 300 |
| Example 21 | W-1 | 0.05 | PGMEA 80 | PGME 20 | 33 | 285 |
| Example 22 | W-1 | 0.05 | PGMEA 80 | PGME 20 | 39 | 290 |
| Example 23 | W-1 | 0.05 | PGMEA 80 | PGME 20 | 34 | 294 |
| Example 24 | W-1 | 0.05 | PGMEA 80 | PGME 20 | 36 | 286 |
| Comparative Example 1 | W-1 | 0.05 | PGMEA 80 | PGME 20 | 32 | 300 |
| Comparative Example 2 | W-1 | 0.05 | PGMEA 80 | PGME 20 | 32 | 180 |
| Comparative Example 3 | W-1 | 0.05 | PGMEA 80 | PGME 20 | 33 | 190 |
| Comparative Example 4 | W-1 | 0.05 | PGMEA 80 | PGME 20 | 34 | 185 |
| Comparative Example 5 | W-1 | 0.05 | PGMEA 80 | PGME 20 | 35 | 100 |
| Comparative Example 6 | W-1 | 0.05 | PGMEA 80 | PGME 20 | 33 | 140 |
| Comparative Example 7 | W-1 | 0.05 | PGMEA 80 | PGME 20 | 33 | 110 |

The components and abbreviations in Table 1 are as follows.

The structures of the resins are as follows.

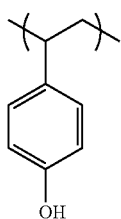

(I)

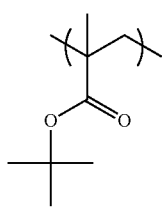

(II)

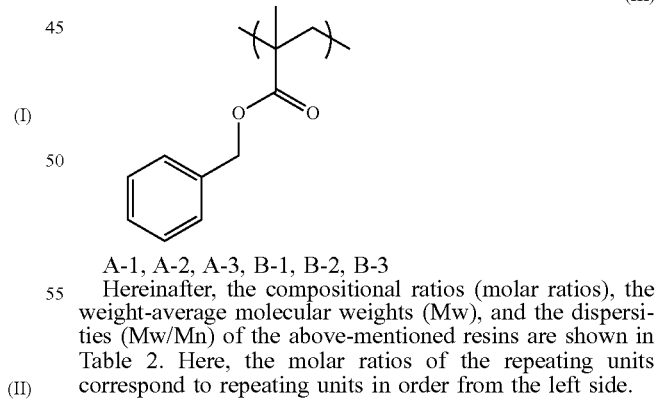

(III)

A-1, A-2, A-3, B-1, B-2, B-3

Hereinafter, the compositional ratios (molar ratios), the weight-average molecular weights (Mw), and the dispersities (Mw/Mn) of the above-mentioned resins are shown in Table 2. Here, the molar ratios of the repeating units correspond to repeating units in order from the left side.

TABLE 2

| Resin | (I) | (II) | (III) | Mw | Mw/Mn | Glass transition temperature (° C.) |
|---|---|---|---|---|---|---|
| A-1 | 65 | 25 | 10 | 21,000 | 1.50 | 170 |
| A-2 | 60 | 30 | 10 | 23,000 | 1.52 | 175 |

TABLE 2-continued

| Resin | (I) | (II) | (III) | Mw | Mw/Mn | Glass transition temperature (° C.) |
|---|---|---|---|---|---|---|
| A-3 | 65 | 23 | 12 | 20,000 | 1.54 | 168 |
| B-1 | 50 | 25 | 25 | 16,000 | 1.52 | 140 |
| B-2 | 45 | 25 | 30 | 14,000 | 1.51 | 130 |
| B-3 | 50 | 15 | 35 | 15,000 | 1.50 | 135 |

The compositional ratios of the respective repeating units of the following resins are shown in molar ratios.

(D-1)

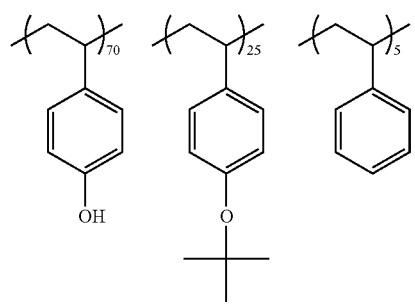

Mw: 4500
Mw/Mn: 1.9
Glass transition temperature: 120° C.

(D-2)

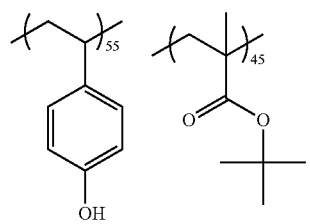

Mw: 13500
Mw/Mn: 2.6
Glass transition temperature: 140° C.

(D-3)

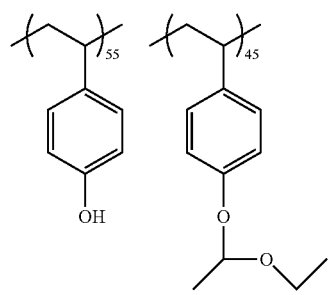

Mw: 4000
Mw/Mn: 1.6
Glass transition temperature: 115° C.

(C)

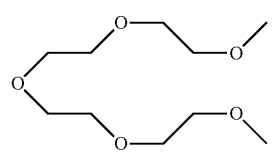

Molecular weight: 1,000, glass transition temperature: −10° C., C log P: −0.5, boiling point: 268° C.

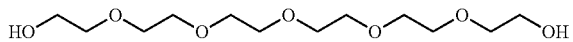 [SMILES: OCCOCCOCCOCCOCCOCCO]

(C-1) Molecular weight: 282, glass transition temperature: −5° C., C log P: −1.9, boiling point: 498° C.

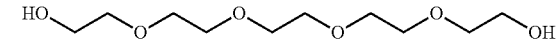 [SMILES: OCCOCCOCCOCCOCCO]

(C-2) Molecular weight: 238, glass transition temperature: −1° C., C log P: −1.7, boiling point: 430° C.

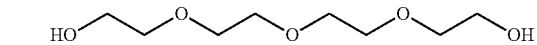 [SMILES: OCCOCCOCCOCCO]

(C-3) Molecular weight: 194, glass transition temperature: −2° C. C log P: −1.3, boiling point: 361° C.

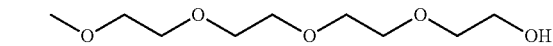

(C-4) Molecular weight: 208, glass transition temperature −10° C. C log P: −0.9, boiling point: 314° C.

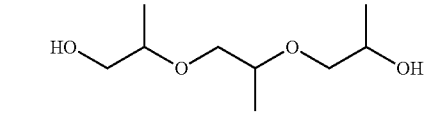

(C-5) Molecular weight: 193, glass transition temperature, −10° C. C log P: −0.5, boiling point: 360° C.

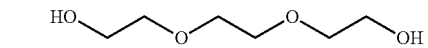

(C-6) Molecular weight: 164, glass transition temperature: −10° C. C log P: −0.7, boiling point: 246° C.

The glass transition temperatures of the resins A-1 to A-3, B-1 to B-3, and D-1 to D-3, the compound C, and the compounds C-1 to C-6 were measured by a calorimeter DSC Q1000 manufactured by TA Instruments Japan Inc.

The structures of the acid generators are as follows.

(E-1)

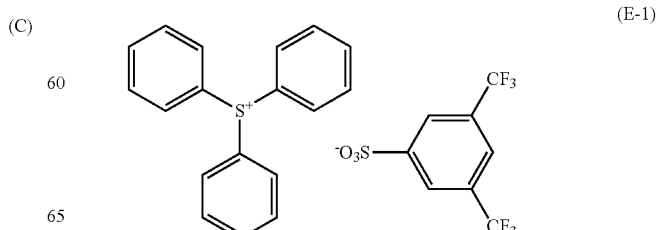

(E-2)
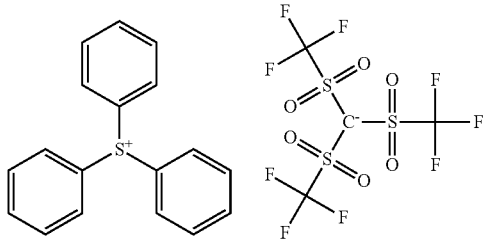
(E-4)
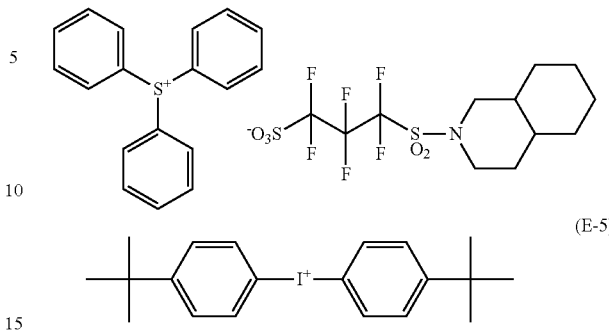
(E-3)
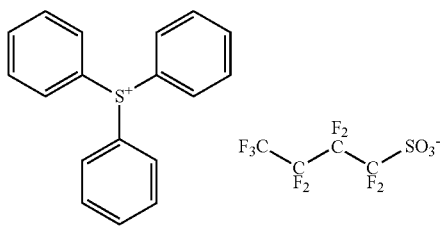
(E-5)
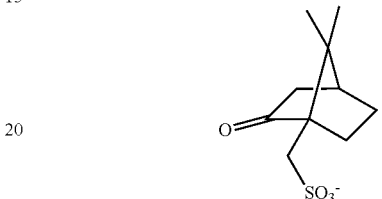
The structures of the acid diffusion control agents are as follows.
(F-1)
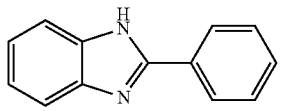
(F-2)
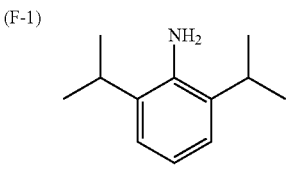
(F-3)
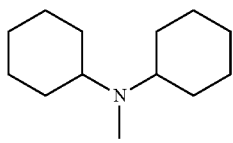
(F-4)
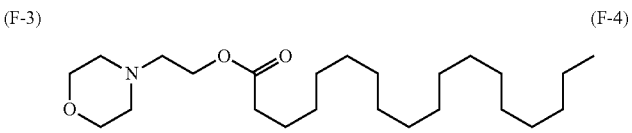
(F-5)
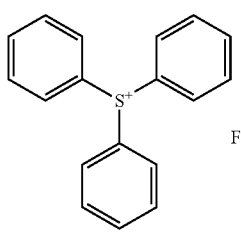
The structures of the additives are as follows.
(W-1)
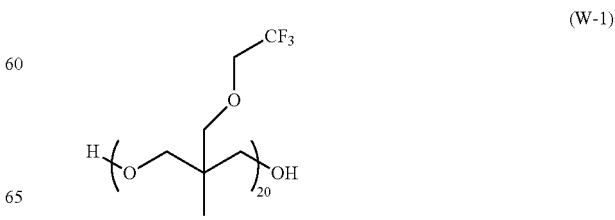

The solvents are as shown below.
PGMEA: Propylene glycol monomethyl ether acetate
PGME: Propylene glycol monomethyl ether
EL: Ethyl lactate
EEP: Ethyl 3-ethoxypropionate
MAK: 2-Heptanone <Measurement of Viscosity of Actinic Ray-Sensitive or Radiation-Sensitive Resin Composition>

The viscosity of the resist composition prepared above was measured at 25.0° C. by RE-85L manufactured by Toki Sangyo Co. Ltd. The results are shown in Table 1.

<Method for Evaluation of Softening Point of Pattern>

The resist composition prepared above was added dropwise to an Si substrate (manufactured by Advanced Materials Technology) in the static state, which had been subjected to a hexamethyldisilazane treatment using a spin coater ACT-8 manufactured by Tokyo Electron Limited and not provided with an antireflection layer. After the dropwise addition, the substrate was rotated while maintaining the rotation speed at 500 rpm for 3 seconds, at 100 rpm for 2 seconds, at 500 rpm for 3 seconds, and then at 100 rpm for 2 seconds, and thereafter, raising the speed to a film thickness-setting rotation speed (1,200 rpm), which was maintained for 60 seconds. Thereafter, drying under heating was carried out on a hot plate at 130° C. for 60 seconds to form a positive tone resist film having a film thickness of 7.5 μm. This resist film was subjected to pattern exposure through a mask having a line-and-space pattern under exposure conditions of NA=0.68 and σ=0.60, using a KrF excimer laser scanner (manufactured by ASML, PAS5500/850C, wavelength of 248 nm) such that the space width and the pitch width of a pattern formed after the reduction projection exposure and the development became 10 μm and 100 μm, respectively. After the irradiation, the resist film was baked at 130° C. for 60 seconds, dipped in an aqueous 2.38%-by-mass tetramethylammonium hydroxide (TMAH) solution for 60 seconds, then rinsed with pure water for 30 seconds, and dried to form an unshared space pattern with a space width of 10 μm, a pitch width of 100 μm, and a thickness of a resist film portion of 7.5 μm.

A plurality of chips having the unshared space patterns formed above were prepared, and each of the chips was subjected to a heating treatment at an interval of 5° C. in the range of 100° C. to 200° C. for 60 seconds, and then cleaved. The interface between the resist film portion and the space portion was observed using a scanning electron microscope (SEM) (9380II, manufactured by Hitachi, Ltd.), and in a case where a thickness of a resist film portion (corresponding to the depth of the space portion) was taken as 100%, the minimum value of temperatures at which the shape of the resist film portion changed such that the space width of the space portion at a height corresponding to 20% of the depth from the surface (that is, the top surface) of the resist film portion reached 1.2 times or more the space width of the space portion at a height corresponding to 50% of the depth from the surface of the resist film portion was taken as a softening point (° C.).

The results are shown in Table 3.

<Pattern Formation and Evaluation>

The resist composition prepared above was added dropwise to an Si substrate (manufactured by Advanced Materials Technology) in the static state, which had been subjected to a hexamethyldisilazane treatment using a spin coater ACT-8 manufactured by Tokyo Electron Limited and not provided with an antireflection layer. After the dropwise addition, the substrate was rotated while maintaining the rotation speed at 500 rpm for 3 seconds, at 100 rpm for 2 seconds, at 500 rpm for 3 seconds, and then at 100 rpm for 2 seconds, and thereafter, raising the speed to a film thickness-setting rotation speed (1,200 rpm), which was maintained for 60 seconds. Thereafter, drying under heating was carried out on a hot plate at 130° C. for 60 seconds to form a positive tone resist film having a film thickness of 7.5 μm. This resist film was subjected to pattern exposure through a mask having a line-and-space pattern under exposure conditions of NA=0.68 and σ=0.60, using a KrF excimer laser scanner (manufactured by ASML, PAS5500/850C, wavelength of 248 nm) such that the space width and the pitch width of a pattern formed after the reduction projection exposure and the development became 3 μm and 33 μm, respectively. After the irradiation, the resist film was baked at 130° C. for 60 seconds, dipped in an aqueous 2.38%-by-mass tetramethylammonium hydroxide (TMAH) solution for 60 seconds, then rinsed with pure water for 30 seconds, and dried to form an unshared space pattern with a space width of 3 μm and a pitch width of 33 μm.

The pattern exposure was an exposure through a mask having a line-and-space pattern such that the space width and the pitch width of a pattern formed after the reduction projection exposure and the development become 3 μm and 33 μm, respectively, and the exposure dose was an optimal exposure dose (sensitivity) (mJ/cm$^2$) for forming an unshared space pattern having a space width of 3 μm and a pitch width of 33 μm. In the determination of the sensitivity, the space width of the pattern was measured using a scanning electron microscope (SEM) manufactured by Hitachi, Ltd.).

[Method for Evaluating Resolution]

Exposure was carried out through a mask used for the formation of the pattern, a minimum line width of the space width in the unshared space pattern formed while the exposure dose was changed was taken as a resolution, and a smaller value of the minimum line width was evaluated as high resolution. The space width was measured using a scanning electron microscope (SEM) (9380II manufactured by Hitachi, Ltd.).

[Method for Evaluating Exposure Latitude]

In a wafer having the unshared space pattern formed in the sensitivity, a value (percentage) obtained by dividing an exposure dose at which the space width changes by 10% by an optimal exposure dose was taken as an exposure latitude. A larger value thereof indicates that there is a smaller change in the performance due to a change in the exposure dose and the exposure latitude is better.

[Method for Evaluating Resist Sidewall Roughness]

An Si substrate (8-inch silicon wafer) was subjected to a dry etching treatment using the unshared space pattern formed in the sensitivity as a processing mask. First, the Si substrate was processed by carrying out etching using a fluorine-based gas. Here, 1 inch corresponds to 25.4 mm. As the etching conditions, a gas having a mixture of $Ar:C_4F_6:O_2$ at a flow rate ratio of 25:1:2 was used, and conditions of a treatment pressure of 4 Pa, a source power of 500 W, a wafer bias of 700 W, an antenna bias of 600 W, and a processing time of 60 seconds were applied thereto. Subsequently, a resist mask pattern was processed by carrying out etching using an oxygen gas. As the etching conditions, a gas having a mixture of $CF_4:O_2$ at a flow rate ratio of 1:24 was used, and conditions of a treatment pressure of 0.5 Pa, a source power of 700 W, an antenna bias of 100 W, and a processing time of 60 seconds were applied thereto.

After carrying out the dry etching treatment, the wafer was cleaved and the sidewall roughness of the resist was observed using a scanning electron microscope (SEM). A case where roughness was almost not seen was denoted as A, a case where roughness was slightly seen was denoted as B, and a case where roughness was high was denoted as C. In addition, U-621 manufactured by Hitachi. Ltd. was used as the dry etching device.

[Method for Evaluating Crack Performance]

A wafer having the unshared space pattern was subjected to a vacuum treatment at pressure of 0.002 Pa for 60 seconds in a chamber in SEM (eCD2 manufactured by KLA-Tencor). The wafer after evacuation with vacuum was observed using an optical microscope (MX61L manufactured by Olympus Corporation), and the cracks on the wafer surface were observed. A case where there were as many as 50 or more cracks was evaluated as D, a case where there were 5 to 49 cracks was evaluated as C, a case where there were 1 to 4 cracks was evaluated as B, and a case where there was no crack was evaluated as A.

The results of each of the evaluations are shown in Table 3.

In addition, it was found that in Examples 19 to 24 in which the polyether-based compound having a group represented by General Formula (a) was used as the compound (B), crack performance was superior.

According to the present invention, it is possible to provide an actinic ray-sensitive or radiation-sensitive resin composition which is capable of suppressing the roughness on the sidewall of a resist pattern, which can be generated during etching, while satisfying both of excellent resolution and excellent exposure latitude to high extents in a case of forming a pattern from a thick resist film (for example, a resist film having a thickness of 1 µm or more), an actinic ray-sensitive or radiation-sensitive film, a pattern forming method, and a method for manufacturing an electronic device, using the same.

Although the present invention has been described in detail and with reference to specific embodiments, it is obvious to those skilled in the art that various changes or

TABLE 3

|  | Evaluation item 1 Softening point (° C.) of isolated space pattern | Evaluation item 2 Resolution (nm) | Evaluation item 3 Exposure latitude (%) | Evaluation item 4 Sidewall roughness | Evaluation item 5 Crack performance |
| --- | --- | --- | --- | --- | --- |
| Example 1 | 150 | 2,600 | 19.0 | B | C |
| Example 2 | 145 | 2,550 | 18.5 | A | C |
| Example 3 | 150 | 2,500 | 18.8 | B | C |
| Example 4 | 140 | 2,600 | 18.0 | A | C |
| Example 5 | 155 | 2,500 | 18.9 | B | C |
| Example 6 | 150 | 2,550 | 18.5 | A | C |
| Example 7 | 145 | 2,500 | 18.3 | A | C |
| Example 8 | 150 | 2,500 | 18.2 | A | C |
| Example 9 | 155 | 2,550 | 18.6 | A | C |
| Example 10 | 150 | 2,500 | 18.5 | B | B |
| Example 11 | 145 | 2,450 | 18.0 | A | B |
| Example 12 | 145 | 2,500 | 18.2 | A | B |
| Example 13 | 150 | 2.450 | 17.9 | B | C |
| Example 14 | 145 | 2,500 | 18.0 | A | C |
| Example 15 | 140 | 2,500 | 18.5 | B | C |
| Example 16 | 155 | 2,400 | 18.3 | A | C |
| Example 17 | 168 | 2,650 | 19.5 | B | B |
| Example 18 | 132 | 2,400 | 17.5 | A | B |
| Example 19 | 150 | 2.500 | 18.5 | B | A |
| Example 20 | 150 | 2,450 | 18.0 | B | A |
| Example 21 | 145 | 2,500 | 17.5 | B | A |
| Example 22 | 155 | 2,550 | 18.2 | B | A |
| Example 23 | 140 | 2,600 | 17.6 | B | A |
| Example 24 | 150 | 2,550 | 16.5 | B | A |
| Comparative Example 1 | 180 | 2,150 | 22.5 | C | D |
| Comparative Example 2 | 125 | 2,750 | 14.2 | B | D |
| Comparative Example 3 | 120 | 2,800 | 13.8 | B | D |
| Comparative Example 4 | 120 | 2,850 | 13.5 | B | D |
| Comparative Example 5 | 120 | 2,800 | 13.0 | B | D |
| Comparative Example 6 | 115 | 2,850 | 12.5 | B | D |
| Comparative Example 7 | 115 | 2,900 | 14.5 | B | D |

From the above results, in Comparative Example 1 in which the softening point of the unshared space pattern was higher than 170° C., the roughness on the sidewall of the pattern was not suppressed, and in Comparative Examples 2 to 7 in which the softening point of the unshared space pattern was lower than 130° C., both of resolution and exposure latitude were deteriorated.

On the other hand, it was found that in any of Examples 1 to 18 which satisfied the requirements of the present invention, the roughness on the sidewall of the resist pattern, which could be generated during etching, could be suppressed while both of excellent resolution and excellent exposure latitude were satisfied to high extents.

modifications can be made without departing from the spirit and scope of the present invention.

What is claimed is:

1. An actinic ray-sensitive or radiation-sensitive resin composition comprising:
    a resin (A) having a glass transition temperature of 155° C. or higher;
    a compound (B) having a glass transition temperature of 150° C. or lower; and
    a solvent (C),
    wherein a solid content in the actinic ray-sensitive or radiation-sensitive resin composition is 20% by mass or more, and a softening point of a resist pattern formed using the actinic ray-sensitive or radiation-sensitive resin composition is from 130° C. to 170° C.

2. The actinic ray-sensitive or radiation-sensitive resin composition according to claim 1,
wherein the compound (B) is a resin.

3. The actinic ray-sensitive or radiation-sensitive resin composition according to claim 2,
wherein a weight-average molecular weight of the resin as the compound (B) is 1,000 to 18,000.

4. The actinic ray-sensitive or radiation-sensitive resin composition according to claim 2,
wherein the resin (B) has a repeating unit derived from hydroxystyrene.

5. The actinic ray-sensitive or radiation-sensitive resin composition according to claim 1,
wherein the compound (B) is a polyether-based compound.

6. The actinic ray-sensitive or radiation-sensitive resin composition according to claim 5,
wherein a molecular weight of the polyether-based compound is 100 to 5,000.

7. The actinic ray-sensitive or radiation-sensitive resin composition according to claim 1,
wherein a viscosity of the actinic ray-sensitive or radiation-sensitive resin composition is 100 to 500 mPa·s.

8. The actinic ray-sensitive or radiation-sensitive resin composition according to claim 1,
wherein a glass transition temperature of the resin (A) is 170° C. or higher.

9. The actinic ray-sensitive or radiation-sensitive resin composition according to claim 1,
wherein a weight-average molecular weight of the resin (A) is 18,000 or more.

10. The actinic ray-sensitive or radiation-sensitive resin composition according to claim 1,
wherein the resin (A) has a repeating unit derived from hydroxystyrene.

11. An actinic ray-sensitive or radiation-sensitive film formed using the actinic ray-sensitive or radiation-sensitive resin composition according to claim 1.

12. A pattern forming method comprising:
(i) a step of forming an actinic ray-sensitive or radiation-sensitive film having a film thickness of 1 μm or more on a substrate, using the actinic ray-sensitive or radiation-sensitive resin composition according to claim 1;
(ii) a step of irradiating the actinic ray-sensitive or radiation-sensitive film with actinic rays or radiation; and
(iii) a step of developing the actinic ray-sensitive or radiation-sensitive film irradiated with the actinic rays or radiation, using a developer.

13. A method for manufacturing an electronic device, comprising the pattern forming method according to claim 12.

* * * * *